US011227953B2

United States Patent
Kato et al.

(10) Patent No.: US 11,227,953 B2
(45) Date of Patent: Jan. 18, 2022

(54) TUNNELING FIELD EFFECT TRANSISTOR

(71) Applicant: JAPAN SCIENCE AND TECHNOLOGY AGENCY, Saitama (JP)

(72) Inventors: Kimihiko Kato, Tokyo (JP); Shinichi Takagi, Tokyo (JP); Mitsuru Takenaka, Tokyo (JP); Hitoshi Tabata, Tokyo (JP); Hiroaki Matsui, Tokyo (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 0 days.

(21) Appl. No.: 16/767,479

(22) PCT Filed: Nov. 28, 2018

(86) PCT No.: PCT/JP2018/043787
§ 371 (c)(1),
(2) Date: May 27, 2020

(87) PCT Pub. No.: WO2019/107411
PCT Pub. Date: Jun. 6, 2019

(65) Prior Publication Data
US 2021/0005758 A1 Jan. 7, 2021

Related U.S. Application Data

(60) Provisional application No. 62/591,798, filed on Nov. 29, 2017.

(51) Int. Cl.
*H01L 29/786* (2006.01)
*H01L 29/08* (2006.01)
(Continued)

(52) U.S. Cl.
CPC .... *H01L 29/78648* (2013.01); *H01L 29/0895* (2013.01); *H01L 29/122* (2013.01);
(Continued)

(58) Field of Classification Search
CPC .............. H01L 29/78; H01L 29/78648; H01L 29/0895; H01L 29/122; H01L 29/165;
(Continued)

(56) References Cited

U.S. PATENT DOCUMENTS

| 2012/0032227 A1 | 2/2012 | Seabaugh |
| 2013/0048951 A1 | 2/2013 | Heo |

(Continued)

FOREIGN PATENT DOCUMENTS

| JP | H0195554 A | 4/1989 |
| JP | 2013046073 A | 3/2013 |

(Continued)

OTHER PUBLICATIONS

International Search Report issued in Intl. Appln. No. PCT/JP2018/043787 dated Feb. 12, 2019. English translation provided.
(Continued)

*Primary Examiner* — Wasiul Haider
(74) *Attorney, Agent, or Firm* — Rossi, Kimms & McDowell LLP

(57) ABSTRACT

A tunneling field effect transistor according to an embodiment of the present invention includes: a first semiconductor layer having a first conductive type; a second semiconductor layer having a second conductive type and realizing a heterojunction with respect to the first semiconductor layer in a first region; a gate insulating layer over the second semiconductor layer in the first region; a gate electrode layer over the gate insulating layer; a first electrode layer electrically connected to the first semiconductor layer; a second electrode layer electrically connected to the second semi-
(Continued)

conductor layer; and a first insulating layer interposed between the first semiconductor layer and the second semiconductor layer in a second region adjacent to the first region toward the second electrode layer.

20 Claims, 48 Drawing Sheets

(51) Int. Cl.
  *H01L 29/12* (2006.01)
  *H01L 29/165* (2006.01)
  *H01L 29/66* (2006.01)
  *H01L 29/775* (2006.01)
(52) U.S. Cl.
  CPC ...... *H01L 29/165* (2013.01); *H01L 29/66439* (2013.01); *H01L 29/775* (2013.01)
(58) Field of Classification Search
  CPC ............. H01L 29/66439; H01L 29/775; H01L 27/092; H01L 21/823814; H01L 29/0692; H01L 29/423; H01L 29/66356; H01L 29/7391; H01L 29/66; H01L 29/778–7789
  See application file for complete search history.

(56) References Cited

U.S. PATENT DOCUMENTS

| | | | |
|---|---|---|---|
| 2016/0043234 | A1 | 2/2016 | Alper |
| 2016/0204224 | A1 | 7/2016 | Fukui |
| 2016/0322460 | A1* | 11/2016 | Chung .............. H01L 29/66977 |
| 2018/0204953 | A1 | 7/2018 | Zhu |

FOREIGN PATENT DOCUMENTS

| | | |
|---|---|---|
| JP | 2013187291 A | 9/2013 |
| JP | 2014229713 A | 12/2014 |
| JP | 2018014359 A | 1/2018 |
| JP | 2018511936 A | 4/2018 |
| WO | 2016137668 A1 | 9/2016 |
| WO | 2017086921 A1 | 5/2017 |

OTHER PUBLICATIONS

Written Opinion issued in Intl. Appln. No. PCT/JP2018/043787 dated Feb. 12, 2019. English translation provided.
Kato. "Proposal and demonstration of oxide-semiconductor/(Si, SiGe, Ge) bilayer tunneling field effect transistor with type-II energy band alignment." IEEE International Electron Devices Meeting. Dec. 2, 2017: 377-380. vol. 17. Cited in NPL 1.
Kato. "Proposal of oxide-semiconductor/(Si, SiGe, Ge) bilayer tunneling field effect transistor with type-II energy band alignment" The 65th JSAP Spring Meeting, 2018 [Extended Abstracts], The Japan Society of Applied Physics. Includes translation of "Proposal and demonstration of oxide-semiconductor/(Si, SiGe, Ge) bilayer tunneling field effect transistor with type-II energy band alignment." Cited in NPL 1. English machine translation provided.
Kato. "Demonstration of n-ZnO/p-(Si, Ge) bilayer tunneling field effect transistor." The 65th JSAP Spring Meeting, 2018 [Extended Abstracts], The Japan Society of Applied Physics. Cited in NPL 1 and NPL 2. English machine translation provided.
Kato. "TiN/Al2O3/ZnO gate stack engineering for top-gate thin film transistors by combination of post oxidation and annealing." Applied Physics Letters. 2018:162105-1-162105-4. vol. 112. Cited in NPL 1.
Takagi. "Ultra-low power III-V-based MOSFETs and Tunneling FETs." ECS Transactions. 2018: 27-37. vol. 85, No. 8. Cited in NPL 1.
Takagi. "MOS Device Technology using Alternative Channel Materials for Low Power Logic LSI." 48th European Solid-State Device Research Conference. Sep. 3, 2018: 6-11. Cited in NPL 1.
Takagi. "Development of a New Structure Transistor that Enables Ultra-Low Power Consumption LSI—Making Use of Quantum Tunneling Effect to Significantly Extend the Battery Life of IoT-" School of Engineering, University of Tokyo. Dec. 4, 2017. URL: https://www.t.u-tokyo.ac.jp/foe/press/setnws_201712041358034352130602.html. Includes English translation of "Newly Designed Tunneling Field Effect Transistors for Ultra-Energy Efficient Computing, Drastic Extension of Battery Life of IoT Devices by Utilizing Quantum Tunneling Effect". Cited in NPL 1.
Takagi. "Developed a new structure transistor that enables ultra-low power consumption LSIs—Making full use of the quantum tunneling effect to greatly extend IoT's battery life-" Science and Technology Promotion Organization (JST), The University of Tokyo. URL: https://www.jst.go.jp/pr/announce/20171204/index.html. Dec. 4, 2017. Includes English translation of "Newly Designed Tunneling Field Effect Transistors for Ultra-Energy Efficient Computing, Drastic Extension of Battery Life of IoT Devices by Utilizing Quantum Tunneling Effect". Cited in NPL 1.
TAKAGI. "New structure quantum tunneling field effect transistor.", Physical Sciences Magazine. Parity. Aug. 1, 2018: 44-47. vol. 33, No. 8. English machine translation provided.
Kato. "Impact of post plasma/thermal treatments on TiN/Al2O3/ZnO gate stacks for TFT with thin ZnO channel." Electron Device Interface technology Workshop Physics of Materials, Processes, and Device Properties (23rd Workshop) Proceedings. Jan. 2018: 5-8. vol. 18. English machine translation provided.
Kato. "Proposal and demonstration of oxide-semiconductor/(Si, SiGe, Ge) bilayer tunneling field effect transistor with type-II energy band alignment." IEICE Technical Report. Jan. 2018: 5-8. vol. 117, No. 427. SDM2017-92, 23. English machine translation provided.
Takagi. "Tunneling MOSFET technology for ultra-low power integrated system." Asia-Pacific Workshop on Fundamentals and Applications of Advanced Semiconductor Devices. Jun. 2018: 21-26. vol. 2.
Kato. "Impact of channel thickness fluctuation on performance of bilayer tunneling field effect transistors." Extended Abstracts of the 2018 International Conference on Solid State Devices and Materials 2018: 187-188.
Kato. "Ultra-low power tunnel transistors with oxide semiconductor and group-IV semiconductor." The 79th JSAP Fall Meeting, 2018 [Extended Abstracts]. The Japan Society of Applied Physics. Sep. 5, 2018: 100000001-119. English machine translation provided.
Kato. "Influences of channel thickness fluctuation on electrical properties." The 79th JSAP Fall Meeting, 2018 [Extended Abstracts]. The Japan Society of Applied Physics. Sep. 5, 2018: 12-304. English machine translation provided.
Takagi. "Ultrathin-body Ge-On-Insulator MOSFET and TFET technologies." ECS Transactions. 2018: 75-86. vol. 86, No. 7.
Kato. "Proposal and device design of tunneling field effect transistor with oxide semiconductor and group-IV semiconductor." The Institute of Electronics, Information and Communication Engineers. IEICE Technical Report. SDM2018-66. Nov. 2018: 11-16. English machine translation provided.

* cited by examiner

FIG.83
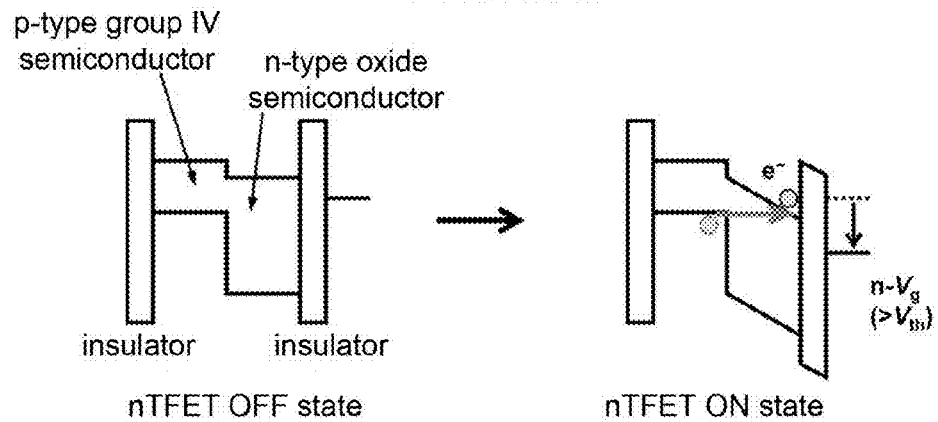
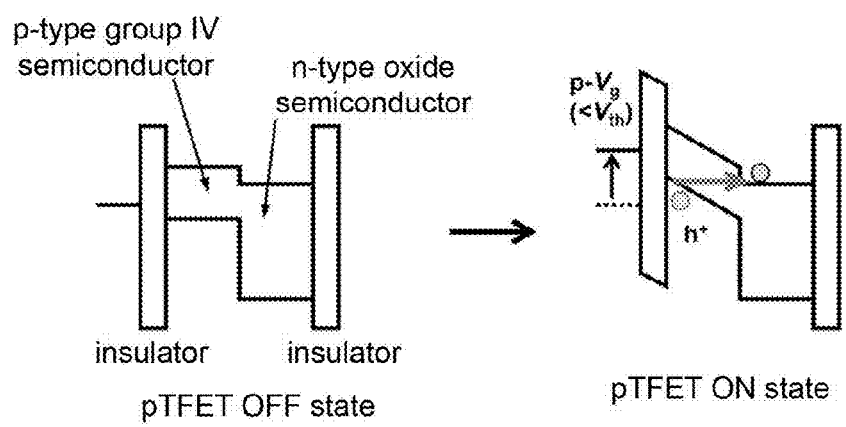
FIG. 84A
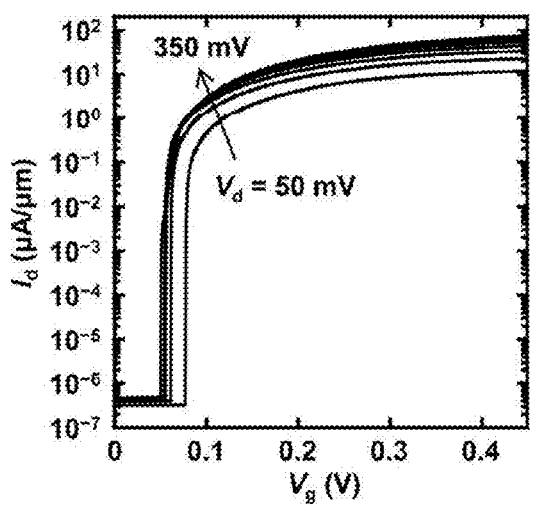
FIG. 84B
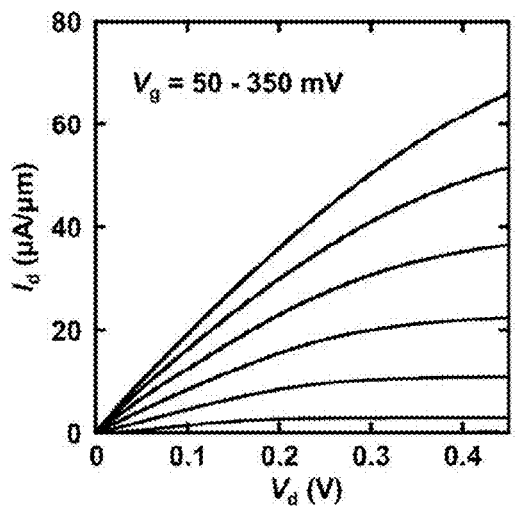

TUNNELING FIELD EFFECT TRANSISTOR

TECHNICAL FIELD

The present invention relates to tunneling field effect transistors.

BACKGROUND ART

Toward low power consumption of electronic devices, low-voltage operation of MOS field effect transistors (MOSFETs) configuring large-scale integrated circuits has been strongly desired. In recent years, a tunneling field effect transistor (which may be hereinafter referred to as "TFET") using the quantum tunneling phenomenon as a new operation principle has attracted attention. By using the quantum tunneling phenomenon, operation not following temperature and electron statistical distributions, that is, steep ON/OFF operation with a small sweep voltage width, is enabled. Various structures of the tunneling field effect transistor have been studied, for example, as disclosed in patent literatures 1 to 9.

CITATION LIST

Patent Literature

Patent Literature 1: Japanese Patent Application Laid-Open No. 2014-229713
Patent Literature 2: International Publication No. 2017-086921
Patent Literature 3: Japanese Patent Application Laid-Open (Translation of PCT Application) No. 2018-511936
Patent Literature 4: Japanese Patent Application Laid-Open No. 2018-14359
Patent Literature 5: Japanese Patent Application Laid-Open No. 2013-187291
Patent Literature 6: U.S. Patent Application Publication No. 20160043234
Patent Literature 7: U.S. Patent Application Publication No. 20120032227
Patent Literature 8: U.S. Patent Application Publication No. 20160204224
Patent Literature 9: U.S. Patent Application Publication No. 20180204953

SUMMARY OF INVENTION

Technical Problem

Since the current value in an ON state is subjected to the quantum tunneling phenomenon, a sufficiently large value has not been acquired. Thus, for practical use of TFETs, both of high ON current and steep ON/OFF operation have been desired.

One object of the present invention is to realize a TFET with both of high ON current and steep ON/OFF operation.

Solution to Problem

According to one embodiment of the present invention, provided is a tunneling field effect transistor including a first semiconductor layer having a first conductive type, a second semiconductor layer having a second conductive type and realizing a heterojunction with respect to the first semiconductor layer in a first region, a gate insulating layer over the second semiconductor layer in the first region, a gate electrode layer over the gate insulating layer, a first electrode layer electrically connected to the first semiconductor layer, a second electrode layer electrically connected to the second semiconductor layer, and a first insulating layer interposed between the first semiconductor layer and the second semiconductor layer in a second region adjacent to the first region toward the second electrode layer.

The first semiconductor layer and the second semiconductor layer may be a material having an energy band structure forming a type-II band structure by the heterojunction.

The second semiconductor layer may be a material in which energy of a conduction band minimum is present in a band gap of the first semiconductor layer.

A band gap of the second semiconductor layer may be larger than that of the first semiconductor layer.

The first semiconductor layer may be a p-type semiconductor, and the second semiconductor layer may be an n-type semiconductor.

The first semiconductor layer may be a group IV semiconductor, and the second semiconductor layer may be a group II-VI semiconductor.

The first semiconductor layer may be a group IV semiconductor, and the second semiconductor layer may include a metal oxide.

The first semiconductor layer may include Si.

The first semiconductor layer may include Si and Ge.

The first semiconductor layer may be an n-type semiconductor, and the second semiconductor layer may be a p-type semiconductor.

The second semiconductor layer may have permittivity smaller than permittivity of the first semiconductor layer.

The gate insulating layer and the gate electrode layer may be arranged so as to be expanded from the first region to the second region.

The second region may be adjacent to the first region also toward the first electrode layer.

The second region may surround the first region.

A junction insulating layer including the first semiconductor layer as a component may be arranged between the first semiconductor layer and the second semiconductor layer in a portion where the heterojunction is realized.

The first semiconductor layer may be a p-type semiconductor, the second semiconductor layer may be an n-type semiconductor, and the junction insulating layer may include an oxide of the first semiconductor layer.

The first semiconductor layer may be an n-type semiconductor, the second semiconductor layer may be a p-type semiconductor, and the junction insulating layer may include an oxide of the second semiconductor layer.

Also, according to one embodiment of the present invention, provided is a tunneling field effect transistor including a first semiconductor layer having a first conductive type, a second semiconductor layer having a second conductive type and realizing a heterojunction with respect to the first semiconductor layer in a first region, a gate insulating layer over the second semiconductor layer in the first region, a gate electrode layer over the gate insulating layer, a first electrode layer electrically connected to the first semiconductor layer, and a second electrode layer electrically connected to the second semiconductor layer, wherein when viewed perpendicularly to a plane of the heterojunction, a region where the first semiconductor layer and the second semiconductor layer overlap is wider than the first region.

An electronic device including a plurality of the tunneling field effect transistors according to any of the above and a conductor for supplying a signal to the tunneling field effect transistors may be provided.

The plurality of the tunneling field effect transistors may include at least an N-ch tunneling field effect transistor and a P-ch tunneling field effect transistor, and the electronic device may further include a conductor which connects the N-ch tunneling field effect transistor and the P-ch tunneling field effect transistor.

Advantageous Effects of Invention

According to one embodiment of the present invention, a TFET with both of high ON current and steep ON/OFF operation can be realized.

BRIEF DESCRIPTION OF DRAWINGS

FIGS. 59A and 59B depict $I_d$-$V_d$ characteristics of the n-ZnO/p-Ge TFET acquired by a simulation, in which FIG. 59A is in linear notation and FIG. 59B is in logarithmic notation.

FIG. 79A depicts a sample that has not processed any postprocess, FIG. 79B depicts a sample that has processed only post O$_2$ annealing (POA), FIG. 79C depicts a sample that has processed only post plasma oxidation (PPO), and FIG. 79D depicts a sample that has processed both PPO and POA. The $I_d$-$V_g$ characteristics in top-gate operation is poor, and importance of $Al_2O_3$/ZnO interface control is suggested.

FIG. 83 is a schematic diagram of operation in an Nch TFET and a Pch TFET.

FIGS. 84A and 84B are diagrams depicting $I_d$-$V_g$ characteristics and $I_d$-$V_d$ characteristics of the Nch TFET.

DESCRIPTION OF EMBODIMENTS

Figure 1:
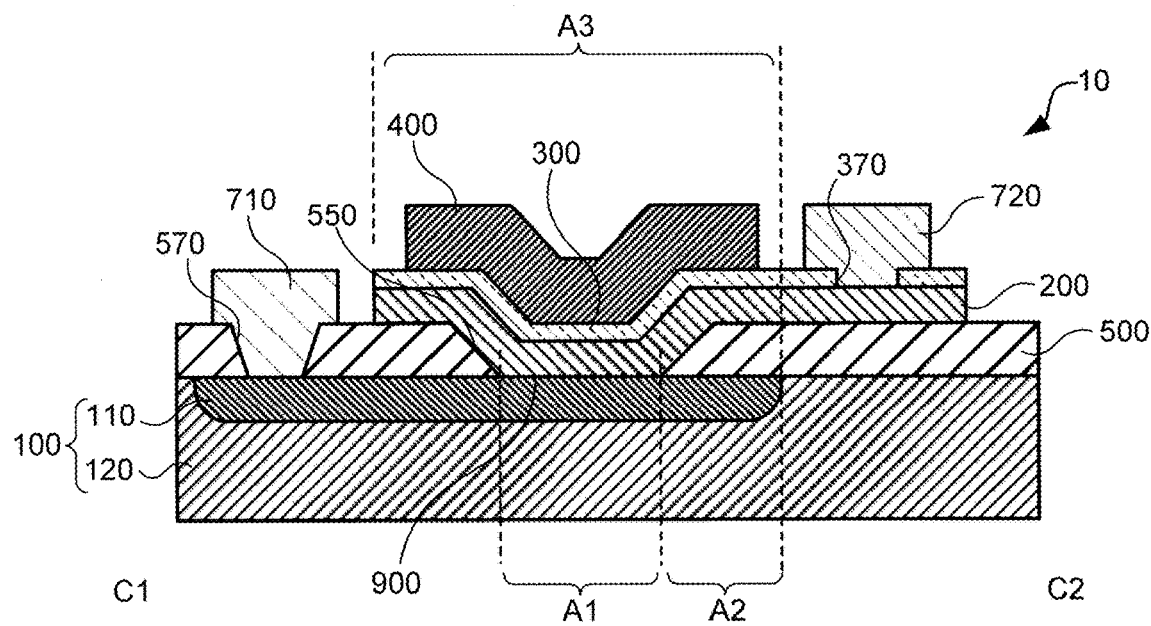
FIG. 1 is a sectional view depicting the structure of a TFET in a first embodiment of the present invention.

In the following, embodiments of the present invention are described with reference to the drawings. Note that each embodiment described below is one example and the present invention should not be construed as being limited to these embodiments. That is, by mutually combining a plurality of embodiments described below or applying known technology to each embodiment for modification, the embodiments can be implemented in various modes.

In the drawings which will be referred to in the present embodiments, portions having the same portion or a similar function are provided with the same reference character or a similar reference character (reference character merely added with A, B, or the like after a numeral), and description of these may be omitted. Also, the dimensional ratio of the drawings may be different from the actual ratio for convenience of description, or the structure may be partially omitted from the drawings. In the drawings attached to Specification, for convenience of ease of depiction and understanding, scaling, vertical and horizontal dimensional ratios, and so forth may be changed as appropriate for exaggeration, or the structure may be partially omitted from the drawings. Furthermore, in the following description, when a position relation between structures is defined, "above" or "below" is not limited to indicate that one structure is arranged directly above or directly below the other structure but may also include the case in which still another structure is involved between the structures.

First, various embodiments of a tunneling field effect transistor (TFET) are described. Simulation results and demonstration results regarding the operation of the TFETs are collectively described after description of each embodiment.

First Embodiment

[1. Structure of Tunneling Field Effect Transistor]

Figure 2:
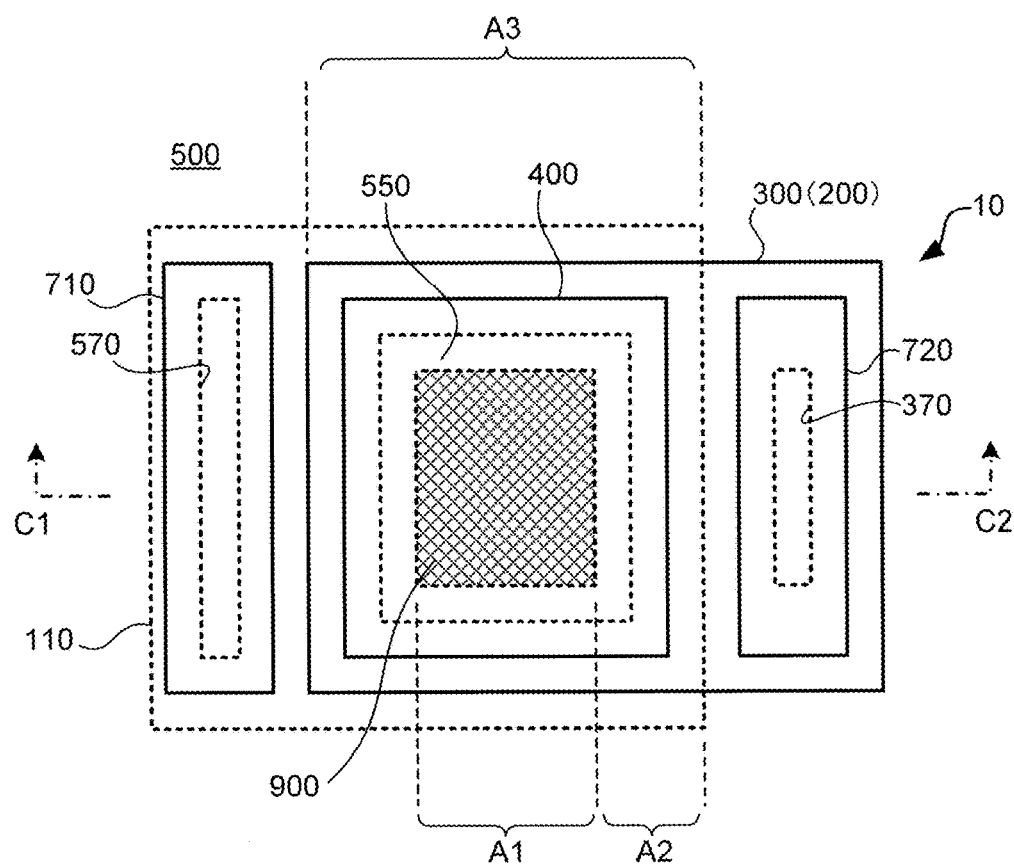
FIG. 2 is a top view depicting the structure of the TFET in the first embodiment of the present invention.

The structure of a TFET according to a first embodiment of the present invention is described by using FIGS. 1 and 2. In the first embodiment, an Nch TFET is described. That is, an ON state (conduction between the source and the drain) is set in a direction in which the voltage of the gate is high with respect to the source, and an OFF state (non-conduction between the source and the drain) is set in a direction in which it is low.

FIG. 1 is a sectional view depicting the structure of the TFET in the first embodiment of the present invention. FIG. 2 is a top view depicting the structure of the TFET in the first embodiment of the present invention. FIG. 1 corresponds to a sectional view along a cutting line C1-C2 in FIG. 2. A TFET 10 is a field effect transistor using a tunnel junction, and includes a p-type group IV semiconductor layer 110, an n-type oxide semiconductor layer 200, a gate insulating layer 300, a gate electrode layer 400, an isolation insulating layer 500, a source electrode layer 710, and a drain electrode layer 720. A tunnel junction is formed by a portion where the p-type group IV semiconductor layer 110 and the n-type oxide semiconductor layer 200 make a heterojunction (heterojunction part 900). The heterojunction part 900 is realized in a region A1 (first region). Note that in the heterojunction part 900, it is not limited to the case in which the p-type group IV semiconductor layer 110 and the n-type oxide semiconductor layer 200 make contact with each other and an exceptionally thin insulting layer may be present to the extent that the tunnel junction is kept. For example, even if an oxide or nitride of the p-type group IV semiconductor layer 110 having a thickness on the order of $_1$ nm is present, the p-type group IV semiconductor layer 110 and the n-type oxide semiconductor layer 200 are regarded as forming the heterojunction part 900 in effect.

The p-type group IV semiconductor layer 110 is a semiconductor layer formed in a part of a semiconductor substrate 100 and isolated for each transistor by being surrounded by an n-type group IV semiconductor layer 120. In this example, the p-type group IV semiconductor layer 110 contains Si (silicon) as a main component, and has a p-type conductive type by addition of impurities. The semiconductor substrate 100 is a Si substrate. The n-type group IV semiconductor layer 120 contains Si as a main component, and has an n-type conductive type by addition of impurities. Note that the p-type group IV semiconductor layer 110 may have another group IV semiconductor as a main component, such as p-type Ge (germanium) or p-type SiGe (silicon germanium).

In this example, the n-type oxide semiconductor layer 200 contains ZnO (zinc oxide) as a main component, and has an n-type conductive type by at least one of addition of impurities and defect introduction. The thickness of the n-type oxide semiconductor layer 200 is preferably equal to or larger than 5 nm and equal to or smaller than 15 nm, and is 10 nm in this example. The n-type oxide semiconductor layer 200 may be an oxide of at least one of Zn (zinc), In (indium), Sn (tin), Ga (gallium), and Ti (titanium) or a metal oxide semiconductor formed of a material acquired by combining any of these, and may have another oxide semiconductor as a main component, for example, such as $In_2O_3$ (indium oxide) or InGaZnO (indium gallium zinc oxide). Note in the following description that an oxide semiconductor may be described as "OS" or "n-OS" indicating that it is of an n-type.

As described above, the p-type group IV semiconductor layer 110 and the n-type oxide semiconductor layer 200 form the heterojunction part 900 in the region A1 and are isolated by the isolation insulating layer 500 in the other portions. That is, as depicted in FIG. 2, when viewed perpendicularly with respect to the plane of the heterojunction part 900, a region A3 where the p-type group IV semiconductor layer 110 and the n-type oxide semiconductor layer 200 overlap is wider than the region A1. In this example, an entire edge part of the region A3 is arranged outside the edge part of the region A1.

The isolation insulating layer 500 (first insulating layer) contains, in this example, $SiO_2$ (silicon oxide) as a main component. The isolation insulating layer 500 is not limited to $SiO_2$ as long as the material has insulation, and may be, for example, $Si_3N_4$ (silicon nitride) or another metal oxide. The thickness of the isolation insulating layer 500 is preferably equal to or larger than 10 nm and equal to or smaller than 20 nm, and is 15 nm in this example. In a region A2 (second region) other than the region A1 of the heterojunction part 900, the isolation insulating layer 500 isolates the p-type group IV semiconductor layer 110 and the n-type oxide semiconductor layer 200. In a portion corresponding to the region A1 of the isolation insulating layer 500, a junction opening 550 is formed. This forms the heterojunction part 900 surrounded by the isolation insulating layer 500. A side surface of the junction opening 550 is tilted in this example.

Here, the region A3 corresponds to a region with the region A1 and the region A2 added together. The region A2 includes at least a region adjacent to the region A1 toward the drain electrode layer 720. In the example depicted in FIGS. 1 and 2, the region A2 surrounds the region A1. That is, in this example, the region A2 also includes a region adjacent to the region A1 toward the source electrode layer 710.

Of the region A2, with the presence of the isolation insulating layer 500 in the region adjacent to the region A1 (heterojunction part 900) toward the drain electrode layer 720, it is possible to suppress depletion of the n-type oxide semiconductor layer 200 from the heterojunction part 900 to the drain electrode layer 720 by the influences of the p-type group IV semiconductor layer 110. With depletion suppressed, it is possible to suppress an increase in resistance of the n-type oxide semiconductor layer 200. Also, with this structure adopted, as will be described further below, it is possible to avoid electric field concentration on the outer edge of the p-type group IV semiconductor layer 110 or the n-type oxide semiconductor layer 200. Thus, steep ON/OFF operation (small SS value) can be realized.

The gate insulating layer 300 contains, in this example, $Al_2O_3$ (aluminum oxide) as a main component. The thickness of the gate insulating layer 300 is preferably equal to or larger than 1 nm and equal to or smaller than 15 nm, and is 10 nm in this example. The gate insulating layer 300 may be formed of another insulating material with high permittivity, for example, $HfO_2$ (hafnium oxide), $ZrO_2$ (zirconium oxide), $La_2O_3$ (lanthanum oxide), or $Y_2O_3$ (yttrium oxide), and a material made of a combination of these may be used. Also, the gate insulating layer 300 may be formed of a so-called insulating material not called having high permittivity, such as $SiO_2$.

The gate insulating layer 300 covers the n-type oxide semiconductor layer 200 at least in the region A1, and is interposed between the gate electrode layer 400 and the n-type oxide semiconductor layer 200. While the outer edge of the n-type oxide semiconductor layer 200 and the outer edge of the gate insulating layer 300 match each other in this example, they may not necessarily match each other.

The gate electrode layer 400 contains, in this example, TiN (titanium nitride) as a main component. The gate electrode layer 400 may be another conductor such as Al (aluminum), W (tungsten), Ta (tantalum), Ti (titanium), Co (cobalt), Mo (molybdenum), TaN (tantalum nitride), or WN (tungsten nitride). For adjustment of a threshold ($V_{th}$), in relation to the n-type oxide semiconductor layer 200, a conductor having an appropriate work function is desirably used. Note that the resistance of the electrode layer may be decreased as a whole by further stacking a conductor with low resistance such as Al on the gate electrode layer 400.

The gate electrode layer 400 covers the gate insulating layer 300. The gate electrode layer 400 is arranged in this example not only in the region A1 but also to be extended to the outside of the region A1. That is, in this example, the gate insulating layer 300 and the gate electrode layer 400 are arranged so as to close the junction opening 550. Note that the edge part of the gate electrode layer 400 and the edge part of the heterojunction part 900 may match each other.

The source electrode layer 710 (first electrode layer) contains, in this example, Ni (nickel) as a main component. The source electrode layer 710 may be another conductor such as Al, W, Ta, Ti, Co, Mo, TiN, TaN, or WN. The source electrode layer 710 is electrically connected via an opening 570 formed in the isolation insulating layer 500 to the p-type group IV semiconductor layer 110. Note that the resistance of the electrode layer may be decreased as a whole by further stacking a conductor with low resistance such as Al on the source electrode layer 710.

The drain electrode layer 720 (second electrode layer) contains, in this example, Al as a main component. The drain electrode layer 720 may be another conductor such as W, Ta, Ti, Co, Mo, TiN, TaN, or WN. The drain electrode layer 720 is electrically connected via an opening 370 formed in the gate insulating layer 300 to the n-type oxide semiconductor layer 200. In this example, the source electrode layer 710 and the drain electrode layer 720 are arranged oppositely via the heterojunction part 900.

[2. Heterojunction]

Figure 52A:
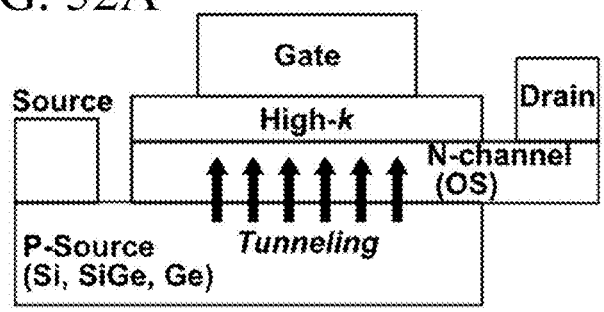
FIG. 52A depicts a device structure conceptional diagram, and energy band diagrams in FIG. 52B an OFF state and FIG. 52C an ON state of an oxide semiconductor group IV semiconductor stacked tunneling field effect transistor.
Figure 52B:
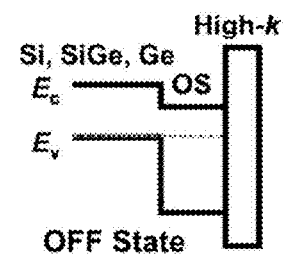
Figure 52C:
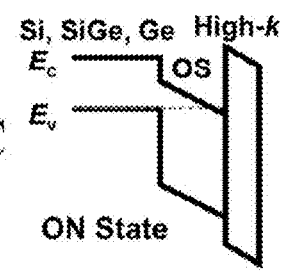

Next, the heterojunction part 900 is described. The quantum tunneling phenomenon, which is the TFET operation principle, is a process in which, as depicted in FIGS. 52A, 52B, and 52C described further below, electrons in the valence band of the p-type group IV semiconductor layer 110 make transition to a level in the conduction band of the n-type oxide semiconductor layer 200. On the tunneling probability, the height of the energy barrier sensed by electrons and the tunneling distance have an influence exponentially. Therefore, it is desired to select a material and a structure which decrease both of these. In addition, to realize an ideal energy band structure (energy band alignment), the composition of elements and the impurity concentration (distribution) near the junction interface are required to be controlled precisely.

By the heterojunction between the p-type group IV semiconductor layer 110 and the n-type oxide semiconductor layer 200, an energy band structure forming a type-II band structure is realized. This energy band structure is exemplarily depicted in FIGS. 52A, 52B, and 52C described further below. Also, energy bands of various materials are exemplarily depicted in FIG. 53 described further below.

To realize the type-II band structure, the n-type oxide semiconductor layer 200 is a material in which energy $E_{c\text{-}OS}$ of the conduction band minimum is present in the band gap of the p-type group IV semiconductor layer 110. That is, $E_{c\text{-}OS}$ is present between energy $E_{c\text{-}IV}$ of the conduction band minimum and energy $E_{v\text{-}IV}$ of the valence band maximum of the p-type group IV semiconductor layer 110. Also, $E_{v\text{-}IV}$ is present between $E_{c\text{-}OS}$ and energy $E_{v\text{-}OS}$ of the valence band maximum of the n-type oxide semiconductor layer 200. Materials satisfying these conditions are selected as the materials of the p-type group IV semiconductor layer 110 and the n-type oxide semiconductor layer 200. Here, materials with a difference between $E_{v\text{-}IV}$ and $E_{c\text{-}OS}$ being small are selected, thereby allowing the height of the energy barrier to be decreased. Here, SiGe may be used in the p-type group IV semiconductor layer 110 to change the composition ratio between Si and Ge. With this, as will be depicted in FIGS. 54A and 54B described further below, the energy band relation in accordance with the type of the n-type oxide semiconductor layer 200 can also be freely adjusted.

Each material may be selected so that the magnitude of the band gap of the n-type oxide semiconductor layer 200 is larger than the magnitude of the band gap of the p-type group IV semiconductor layer 110. With this relation, leakage current in an OFF state can be decreased.

Since the heterojunction part 900 forms a tunnel junction as a plane, the tunneling phenomenon can be induced on the entire junction plane. Thus, the current value can be increased. Also, with this structure, the tunneling distance can be controlled by the thickness of the n-type oxide semiconductor layer 200. When the n-type oxide semiconductor layer 200 is made thinner, the tunneling distance can be decreased, but the resistance of a route from the junction plane to the drain electrode layer 720 is increased. Thus, an appropriate thickness is set in relation to the film resistivity.

Furthermore, the outer edge of a portion of the heterojunction part 900 contributing as a tunnel junction (a portion of the heterojunction part 900 covered by the gate electrode layer 400 via the gate insulating layer 300) is arranged so as to match neither the outer edge of the p-type group IV semiconductor layer 110 nor the outer edge of the n-type oxide semiconductor layer 200, thereby allowing suppression of the tunneling phenomenon at the outer edge of the p-type group IV semiconductor layer 110 or the outer edge of the n-type oxide semiconductor layer 200. This allows the tunneling phenomenon to be induced more uniformly, and steeper ON/OFF operation can also be realized. Note that while the heterojunction part 900 and the portion contributing as a tunnel junction (the portion of the heterojunction part 900 covered by the gate electrode layer 400 via the gate insulating layer 300) form the same region in the first embodiment, they may not form the same region as in structures exemplarily depicted in FIG. 32 and FIG. 33 described further below.

Figure 53:
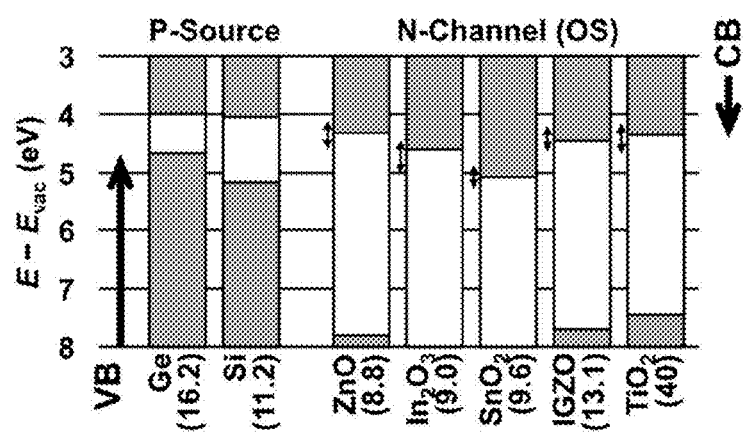
FIG. 53 depicts a summary of material candidates. A band-to-band tunnel occurs from the valence band of a p-type group IV semiconductor to the conduction band of an n-type oxide semiconductor. In parentheses, a relative permittivity of each material is indicated.

Each material may be selected so that the permittivity of the n-type oxide semiconductor layer 200 is smaller than the permittivity of the p-type group IV semiconductor layer 110. For example, as depicted in FIG. 53, while the permittivity of Si is 11.2 and the permittivity of Ge is 16.2, the permittivity of ZnO is 8.8. From the principle in which the electric flux density (permittivity×electric field) is constant, the energy band of a film with a smaller permittivity is modulated with higher priority. Thus, by using a material with a relatively low permittivity as the semiconductor layer on a gate electrode layer 400 side (n-type oxide semiconductor layer 200), the tunneling distance can be decreased to be made closer to the film thickness of the n-type oxide semiconductor layer 200 (refer to FIG. 52C and FIGS. 57A, 57B, and 57C described further below).

Generally, SiGe and Ge have a strong tendency to have a p-type conductive type due to a point defect. On the other hand, oxide semiconductors have a strong tendency of having an n-type conductive type due to a point defect. Thus, by forming a p-n tunnel junction by using the properties unique to the material even without addition of impurity elements, the material interface and the carrier conduction interface match each other in a self-alignment manner and, due to exceptional steepness, an ideal energy band structure can be realized. As indicated by demonstration results described further below (from FIG. 67 to FIG. 81), by combining p-type Si or p-type Ge as the p-type group IV semiconductor layer 110 and ZnO without impurity addition, operation characteristics suggesting the quantum tunneling effect can be acquired.

[3. Tunneling Field Effect Transistor Manufacturing Method]

A method of manufacturing the TFET 10 is described by using FIG. 3 to FIG. 9.

Figure 3:
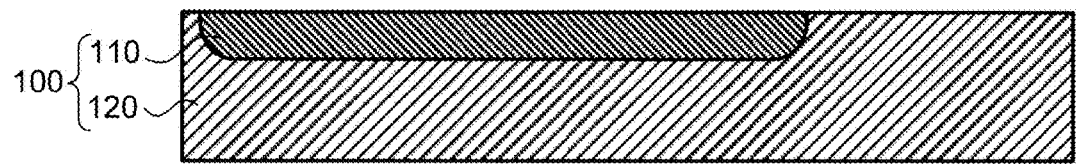
FIG. 3 is a diagram describing a method of manufacturing the TFET in the first embodiment of the present invention.

FIG. 3 to FIG. 9 are drawings describing a method of manufacturing the TFET in the first embodiment of the present invention. First, in the semiconductor substrate 100 including the n-type group IV semiconductor layer 120, impurity ions providing a p-type conductive type (for example, B ions) are injected to form the p-type group IV semiconductor layer 110 (FIG. 3). Here, the impurity concentration ($N_a$) is $10^{18}$ cm$^{-3}$ to $10^{20}$ cm$^{-3}$, and is set as appropriate in accordance with the impurity concentration ($N_d$) of the n-type oxide semiconductor layer 200.

Figure 4:
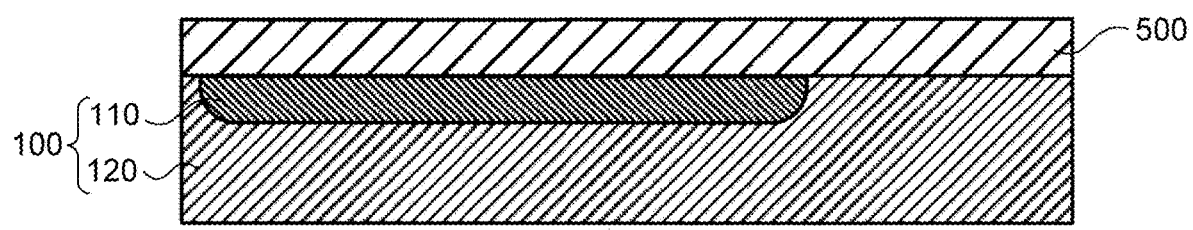
FIG. 4 is a diagram describing the method of manufacturing TFET in the first embodiment of the present invention.

Next, the isolation insulating layer 500 is formed so as to cover a surface of the semiconductor substrate 100 where the p-type group IV semiconductor layer 110 is formed (FIG. 4). In this example, SiO$_2$ of 15 nm is deposited as the isolation insulating layer 500.

Figure 5:
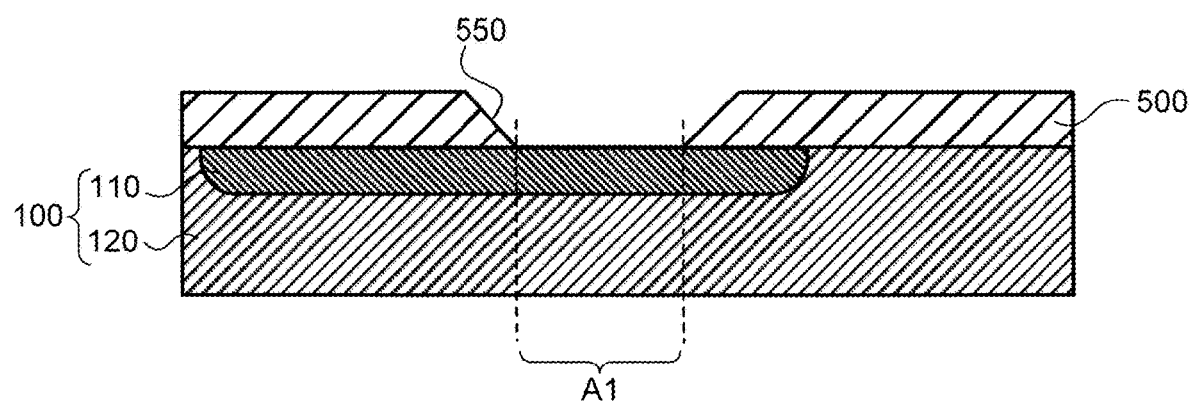
FIG. 5 is a diagram describing the method of manufacturing TFET in the first embodiment of the present invention.

Next, of the isolation insulating layer 500, a portion corresponding to the region A1 where the heterojunction part 900 is to be formed is removed to form the junction opening 550 (FIG. 5). In this example, the junction opening 550 is formed by using photolithography technology. With the junction opening 550 formed by chemical etching (wet etching), side surfaces having tilts are formed. By plasma etching, the junction opening 550 may have side surface nearly perpendicular to the substrate. The dimension of one side of the junction opening 550 is set on the order of 5 nm to 500 nm, preferably 10 nm to 200 nm.

Figure 6:
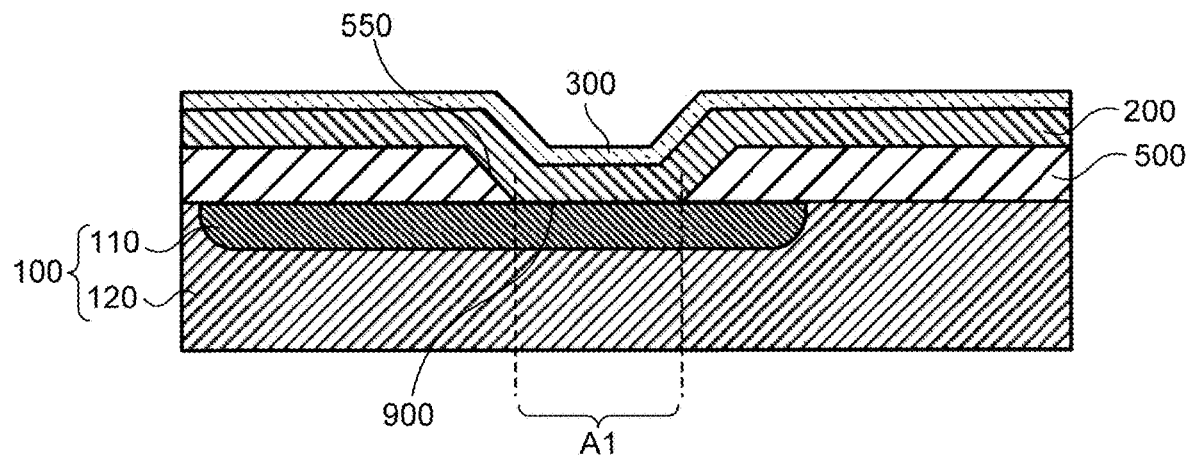
FIG. 6 is a diagram describing the method of manufacturing TFET in the first embodiment of the present invention.

Next, the n-type oxide semiconductor layer 200 and then the gate insulating layer 300 are sequentially deposited so as to cover the isolation insulating layer 500 and the p-type group IV semiconductor layer 110 exposed by the junction opening 550 (FIG. 6). In this example, as the n-type oxide semiconductor layer 200, ZnO of 10 nm is deposited by physical vapor deposition (PVD) such as sputtering. ZnO may be deposited by chemical vapor deposition (CVD) or atomic layer deposition (ALD). Here, the impurity concentration ($N_d$) of the n-type oxide semiconductor layer 200 is $10^{18}$ cm$^{-3}$ to $10^{20}$ cm$^{-3}$, and is set as appropriate in accordance with the impurity concentration ($N_a$) of the p-type group IV semiconductor layer 110. For this, there are a case of adding impurities and a case of using a point defect (oxygen hole and interstitial zinc) in ZnO directly as a defect levels for generating an electron. For defect amount control, heat treatment is used.

Also, in this example, Al$_2$O$_3$ of 1 nm is deposited by ALD as the gate insulating layer 300. After the gate insulating layer 300 is deposited, the defect density of an interface between the gate insulating layer 300 and the n-type oxide semiconductor layer 200 may be reduced by an oxygen plasma treatment. In this case, after the oxygen plasma process, an insulating film of 9 nm is further deposited to suppress leakage current. This insulating film is of Al$_2$O$_3$ formerly formed, but may be formed of another insulating material with high permittivity. After the gate insulating layer 300 is deposited, heat treatment may be performed to enhance film quality of the gate insulating layer 300 and the n-type oxide semiconductor layer 200. Note that this treatment may be performed after process into a predetermined pattern, which will be described below.

Figure 7:
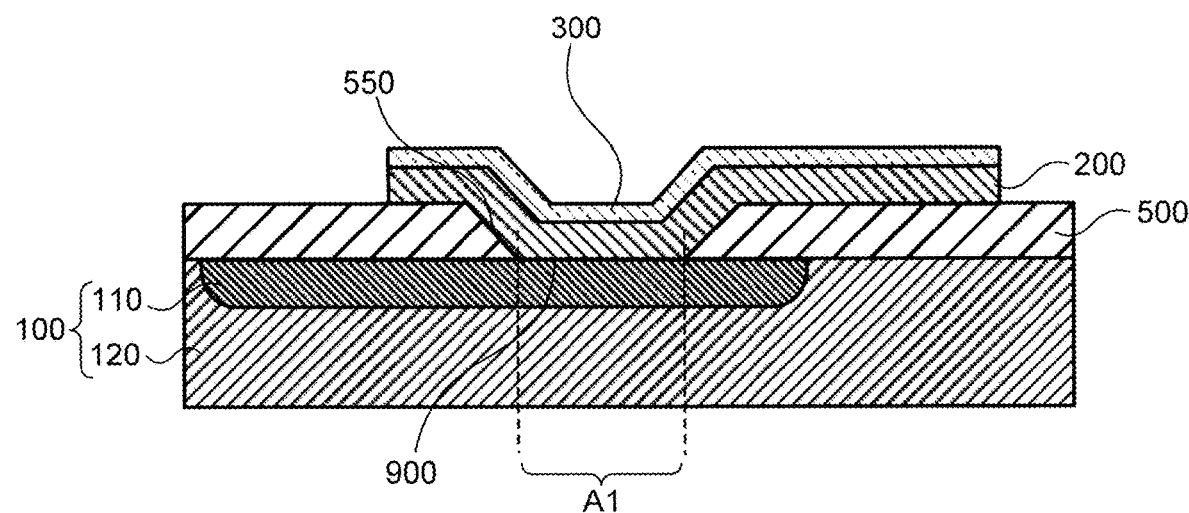
FIG. 7 is a diagram describing the method of manufacturing TFET in the first embodiment of the present invention.

Next, the n-type oxide semiconductor layer 200 and the gate insulating layer 300 are formed into a predetermined pattern (FIG. 7). In this example, by using photolithography technology, the n-type oxide semiconductor layer 200 and the gate insulating layer 300 are processed by chemical etching (wet etching) or plasma etching. In this example, the n-type oxide semiconductor layer 200 and the gate insulating layer 300 are processed to have the same pattern, but may be processed to have different patterns.

Figure 8:
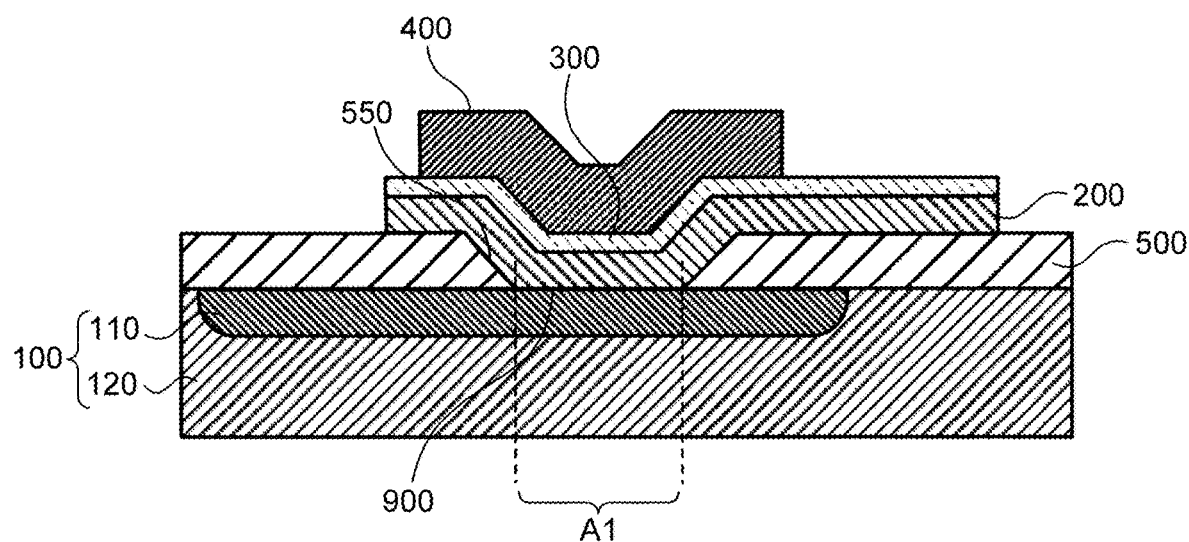
FIG. 8 is a diagram describing the method of manufacturing TFET in the first embodiment of the present invention.

Next, the gate electrode layer 400 is formed on the gate insulating layer 300 (FIG. 8). In this example, the gate electrode layer 400 is deposited so as to cover the gate insulating layer 300 and the isolation insulating layer 500 and by using photolithography technology, is processed into a predetermined pattern by plasma etching or the like. While TiN as the gate electrode layer 400 is deposited by sputtering in this example, it may be deposited by another method such as atomic layer deposition (ALD).

Figure 9:
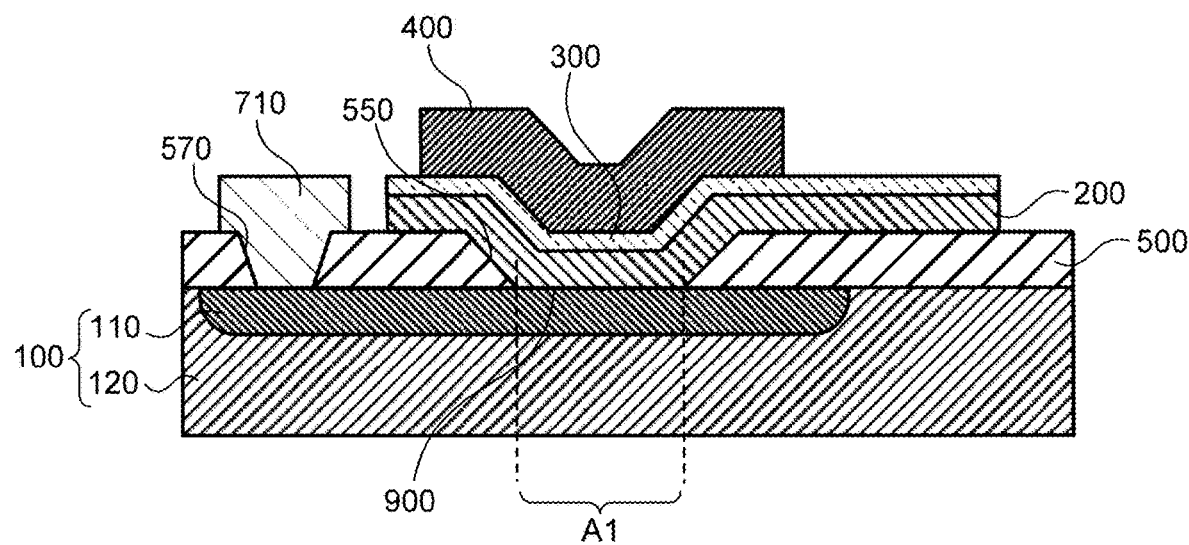
FIG. 9 is a diagram describing the method of manufacturing TFET in the first embodiment of the present invention.

Next, the opening 570 is formed in the isolation insulating layer 500 to expose a part of the p-type group IV semiconductor layer 110, and the source electrode layer 710 is formed so as to be electrically connected to this exposed portion (FIG. 9). First, by using photolithography technology, the opening 570 is formed by chemical etching or the like. Then, the source electrode layer 710 is deposited so as to cover at least the exposed portion of the p-type group IV semiconductor layer 110 and, by using photolithography technology, is processed into a predetermined pattern by plasma etching or the like. In this example, as the source electrode layer 710, Ni is deposited by sputtering.

Next, the opening 370 is formed in the gate insulating layer 300, a part of the n-type oxide semiconductor layer 200 is exposed, and the drain electrode layer 720 is formed so as to be electrically connected to this exposed portion (FIG. 1). This forms the TFET 10 depicted in FIG. 1. First, by using photolithography technology, the opening 370 is formed by chemical etching or the like.

Then, the drain electrode layer 720 is deposited so as to cover at least the exposed portion of the n-type oxide semiconductor layer 200 and, by using photolithography technology, is processed into a predetermined pattern by plasma etching or the like. In this example, as the drain electrode layer 720, Al is formed by sputtering. Note that when the drain electrode layer 720 is formed, Al, which is the material of the drain electrode layer 720, may be left as being in a form of being further deposited on at least one of the source electrode layer 710 and the gate electrode layer 400.

Note that this manufacturing method is one example and another method capable of manufacturing a desired structure may be applied. For example, the drain electrode layer 720 may be formed before the source electrode layer 710 is formed. The above is description of the method of manufacturing the TFET 10.

Second Embodiment

In the first embodiment, the Nch TFET 10 is described. In a second embodiment, a structure realizing a Pch TFET 10A is described. That is, an ON state (conduction between the source and the drain) is set in a direction in which the voltage of the gate is low with respect to the source, and an OFF state (non-conduction between the source and the drain) is set in a direction in which it is high.

Of the first semiconductor layer of the first conductive type and the second semiconductor layer of the second conductive type realizing the heterojunction part 900, a side closer to the gate electrode layer 400 is defined as the second semiconductor layer. When an ON state is set, the gate voltage is controlled so that, irrespective of whether it is of Nch or Pch, the n-type semiconductor layer has a potential higher than that of the p-type semiconductor layer (refer to FIG. 83 described further below). In this case, if the TFET is of Nch, the first conductive type is a p type and the second conductive type is an n type. On the other hand, if the TFET is of Pch, the first conductive type is an n type and the second conductive type is a p type. In this manner, if the TFET is of Pch, conversely to the Nch TFET, the semiconductor layer closer to the gate electrode layer 400 is set as a p-type semiconductor.

Figure 10:
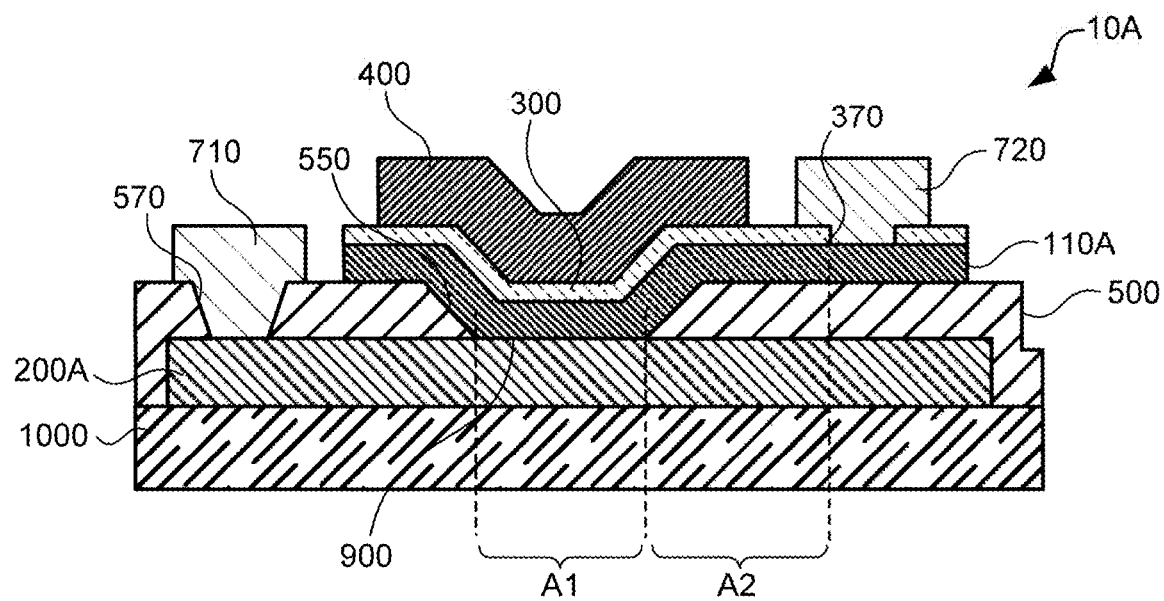
FIG. 10 is a sectional view depicting the structure of a TFET in a second embodiment of the present invention.

FIG. 10 is a sectional view depicting the structure of the TFET in the second embodiment of the present invention. In the example of the Pch TFET 10A depicted in FIG. 10, of a p-type group IV semiconductor layer 110A and an n-type oxide semiconductor layer 200A forming the heterojunction part 900, the p-type group IV semiconductor layer 110A is arranged on a side closer to the gate electrode layer 400. Thus, the n-type oxide semiconductor layer 200A arranged on a side away from the gate electrode layer 400 is formed on an insulating substrate 1000 and isolated for each TFET. Therefore, the Pch TFET (second embodiment) has a structure in which the position relation between the p-type group IV semiconductor layer 110 and the n-type oxide semiconductor layer 200 in the Nch TFET 10 (first embodiment) is interchanged.

Also, in this structure, an isolation insulating layer 500 is arranged for isolating the p-type group IV semiconductor layer 110A and the n-type oxide semiconductor layer 200A at least in the region A2. This allows suppression of an increase in resistance of the p-type group IV semiconductor layer 110A from the heterojunction part 900 to the drain electrode layer 720 due to depletion.

Note in this example that since the p-type group IV semiconductor layer 110A is arranged on the gate electrode layer 400 side, the permittivity of the p-type group IV semiconductor layer 110A is preferably set lower than the permittivity of the n-type oxide semiconductor layer 200A. For example, as the n-type oxide semiconductor layer 200A, $TiO_2$ having a permittivity higher than that of Si or Ge may be used.

Third Embodiment

In a third embodiment, an example is described in which the gate insulating layer 300 and the gate electrode layer 400 in the first embodiment are changed from an n-type oxide semiconductor layer 200 side to a p-type group IV semiconductor layer 110 side to realize a Pch TFET 10B.

Figure 11:
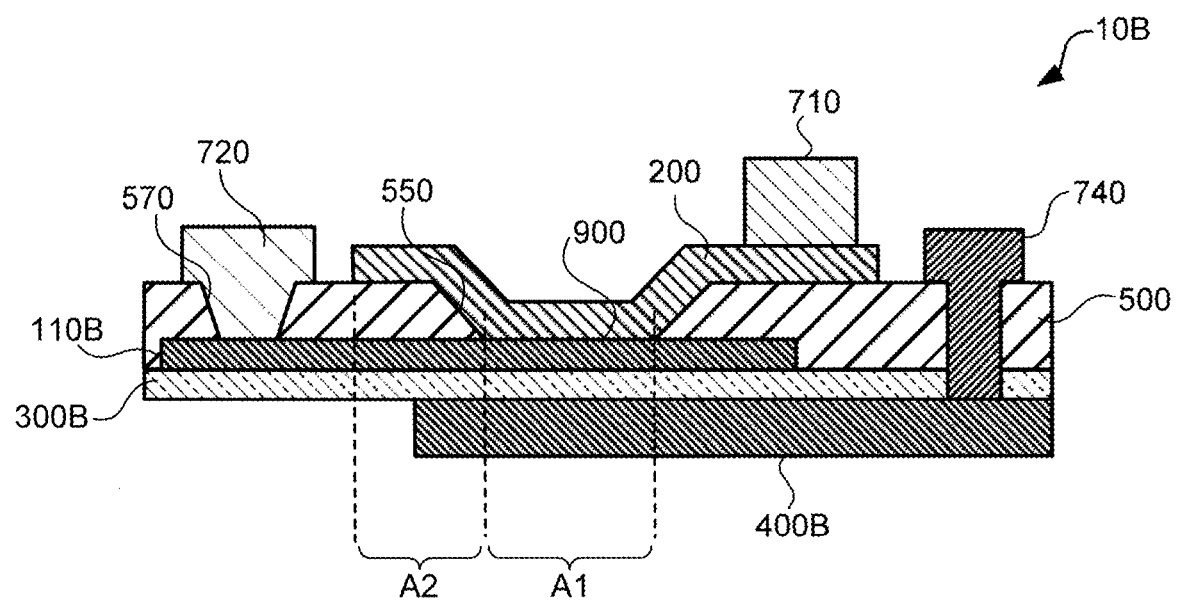
FIG. 11 is a sectional view depicting the structure of a TFET in a third embodiment of the present invention.

FIG. 11 is a sectional view depicting the structure of the TFET in the third embodiment of the present invention. In the example depicted in FIG. 11, a Pch TFET 10B is formed by using a Si substrate having conductivity (n type or p type), a buried oxide film ($SiO_2$) provided on the Si substrate, and a p-type Si thin film provided on the buried oxide film. Here, a gate electrode layer 400B is formed from the Si substrate, a gate insulating layer 300B is formed from the buried oxide film, and a p-type group IV semiconductor layer 110B is formed from the p-type Si thin film. Therefore, when another group IV semiconductor such as p-type Ge or p-type SiGe is used as the p-type group IV semiconductor layer 110B, it is only required to use a Ge thin film or a SiGe thin film for the thin film provided on the buried oxide film. The same goes for the other embodiments.

To operation with Pch, the p-type group IV semiconductor layer 110B arranged on a gate electrode layer 400B side is required to be made thin. In this example, the film thickness of the p-type group IV semiconductor layer 110B is 10 nm. As a result, the region A2 is provided at least between the drain electrode layer 720 connected to the p-type group IV semiconductor layer 110B and the heterojunction part 900. On the other hand, since the n-type oxide semiconductor layer 200 is a semiconductor positioned oppositely to the gate electrode layer 400B, and thus may be thicker than the n-type oxide semiconductor layer 200 in the first embodiment.

The drain electrode layer 720 is electrically connected via the opening 570 formed in the isolation insulating layer 500 to the p-type group IV semiconductor layer 110B. The source electrode layer 710 is electrically connected to the n-type oxide semiconductor layer 200. Note that an insulating layer may be formed on the surface of the n-type oxide semiconductor layer 200 and the source electrode layer 710 and the n-type oxide semiconductor layer 200 may be connected via an opening formed in that insulating layer. A gate extraction electrode layer 740 penetrates through the isolation insulating layer 500 and the gate insulating layer 300B to be electrically connected to the gate electrode layer 400B.

Figure 12:
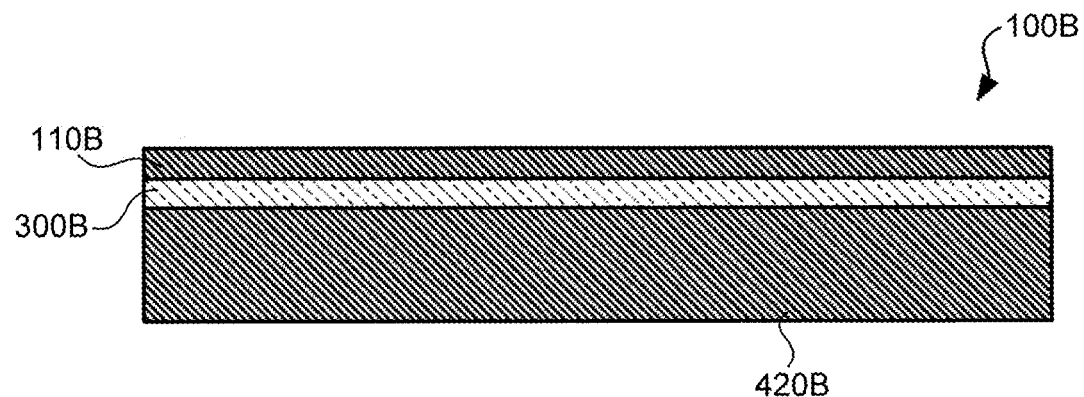
FIG. 12 is a diagram describing a method of manufacturing the TFET in the third embodiment of the present invention.

FIG. 12 to FIG. 16 are drawings describing a method of manufacturing the TFET in the third embodiment of the present invention. A semiconductor substrate 100B is prepared (FIG. 12). The semiconductor substrate 100B includes a Si substrate 420B to serve as the gate electrode layer 400B, a buried oxide film ($SiO_2$) provided on the Si substrate to serve as the gate insulating layer 300B, and a p-type Si thin film provided on the buried oxide film to serve as the p-type group IV semiconductor layer 110B.

Figure 13:
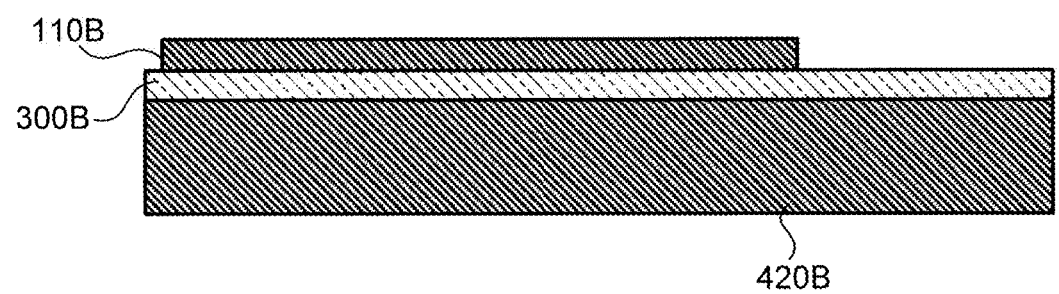
FIG. 13 is a diagram describing the method of manufacturing the TFET in the third embodiment of the present invention.
Figure 14:
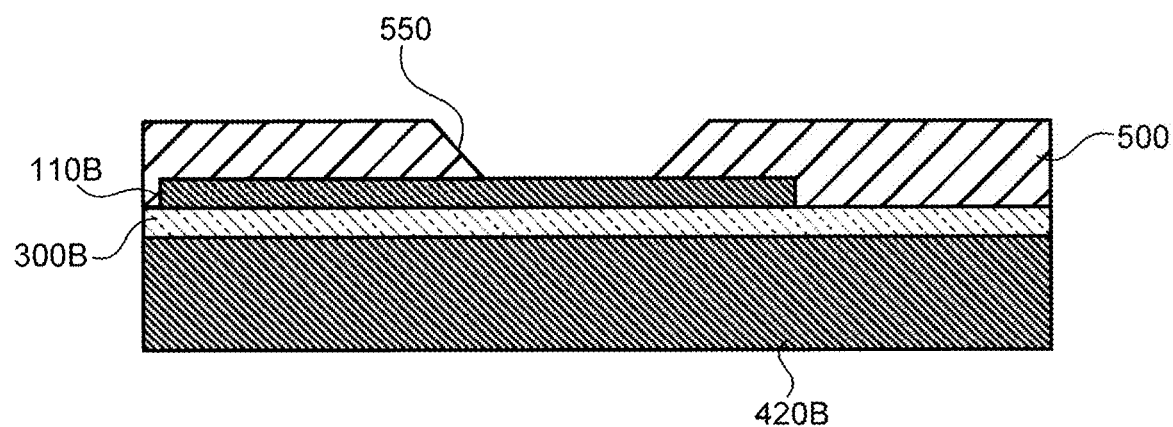
FIG. 14 is a diagram describing the method of manufacturing the TFET in the third embodiment of the present invention.
Figure 15:
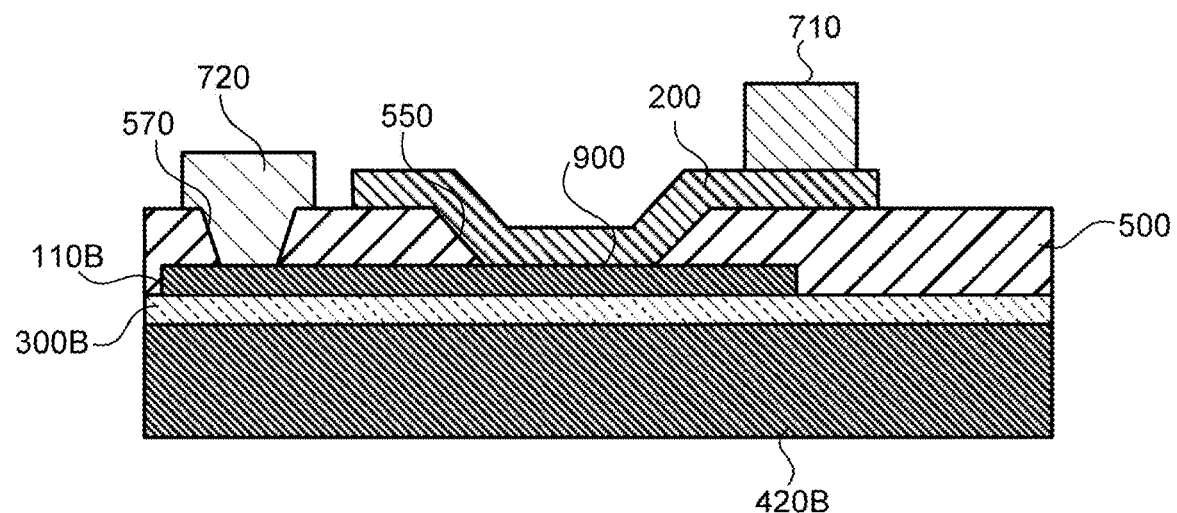
FIG. 15 is a diagram describing the method of manufacturing the TFET in the third embodiment of the present invention.

First, the p-type group IV semiconductor layer 110B is isolated for each TFET (FIG. 13). By using photolithography technology, the p-type group IV semiconductor layer 110B is processed into a predetermined pattern by plasma etching or the like. Next, the isolation insulating layer 500 is deposited and the junction opening 550 is formed (FIG. 14). Then, the n-type oxide semiconductor layer 200, the source electrode layer 710, and the drain electrode layer 720 are formed (FIG. 15).

Figure 16:
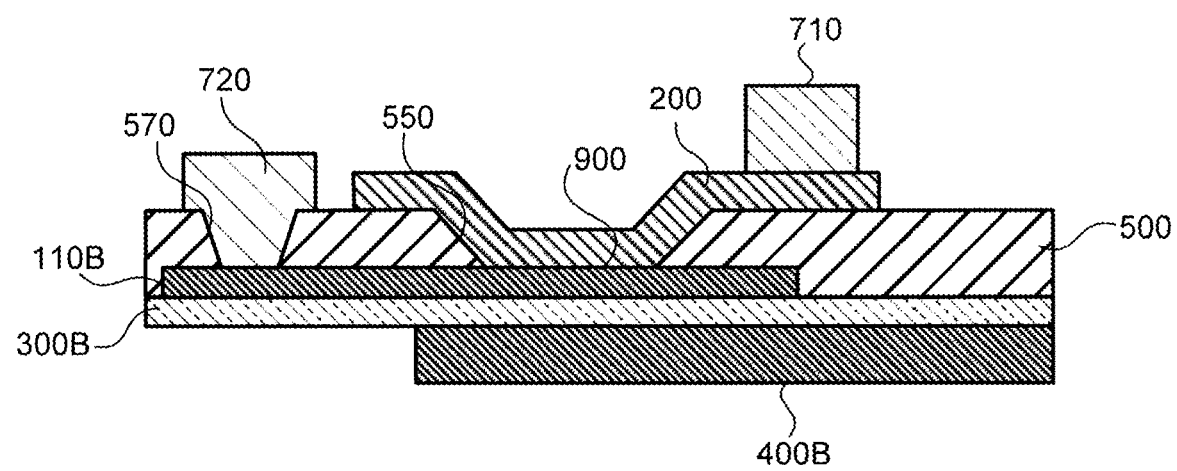
FIG. 16 is a diagram describing the method of manufacturing the TFET in the third embodiment of the present invention.

The Si substrate 420B is made thinner and is further processed into a predetermined pattern, thereby forming the gate electrode layer 400B (FIG. 16). Then, an opening is formed in the isolation insulating layer 500 and the gate insulating layer 300B and the gate extraction electrode layer 740 electrically connected to the gate electrode layer 400B is formed (FIG. 11). The gate extraction electrode layer 740 is only required to be made of any material having conductivity, which may be, for example, the same material as that of the source electrode layer 710 or the drain electrode layer 720.

Fourth Embodiment

In a fourth embodiment, described is an example of a Pch TFET 10C having a gate electrode layer 400C formed by a method different from that of the Pch TFET 10B in the third embodiment.

Figure 17:
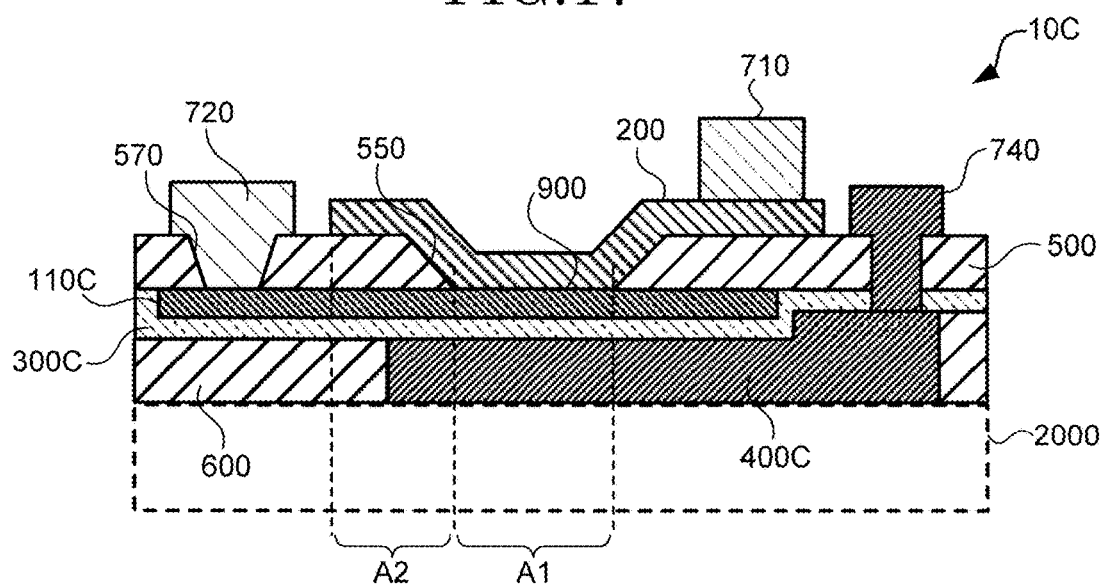
FIG. 17 is a sectional view depicting the structure of a TFET in a fourth embodiment of the present invention.

FIG. 17 is a sectional view depicting the structure of the TFET in the fourth embodiment of the present invention. The TFET 10C depicted in FIG. 17 is different in structure from the TFET 10B in the third embodiment depicted in FIG. 11 in that a p-type group IV semiconductor layer 110C, a gate insulating layer 300C, a gate electrode layer 400C, and a planarization insulating layer 600 are included. In this example, the gate insulating layer 300C and the gate electrode layer 400C can be formed of materials similar to those of the gate insulating layer 300 and the gate electrode layer 400 in the first embodiment. Also, in this example, the planarization insulating layer 600 is made of $SiO_2$ and is arranged so as to form the same plane as that of the gate electrode layer 400C. In this TFET 10C, normally, a surface on which the planarization insulating layer 600 and the gate electrode layer 400 are formed is laminated onto another structure 2000.

Figure 18:
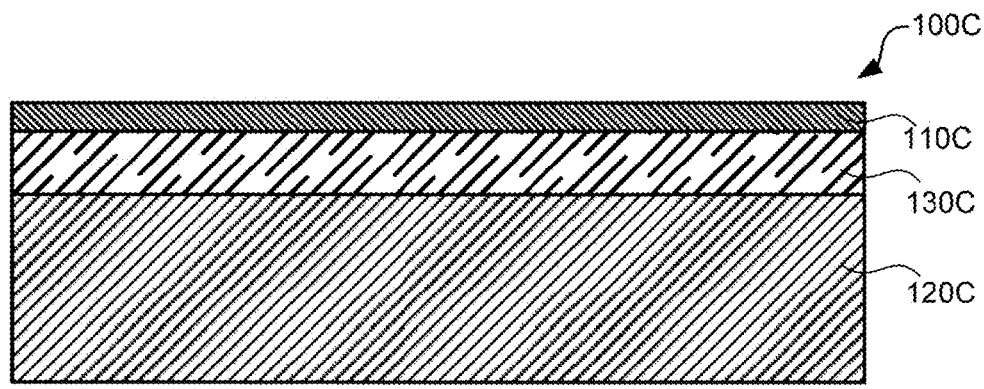
FIG. 18 is a diagram describing a method of manufacturing the TFET in the fourth embodiment of the present invention.

FIG. 18 to FIG. 24 are drawings describing a method of manufacturing the TFET in the fourth embodiment of the present invention. First, a semiconductor substrate 100C is prepared (FIG. 18). The semiconductor substrate 100C includes a Si substrate 120C, a buried oxide film 130C provided on the Si substrate 120C, and a p-type Si thin film provided on the buried oxide film 130C to serve as a p-type group IV semiconductor layer 110C.

Figure 19:
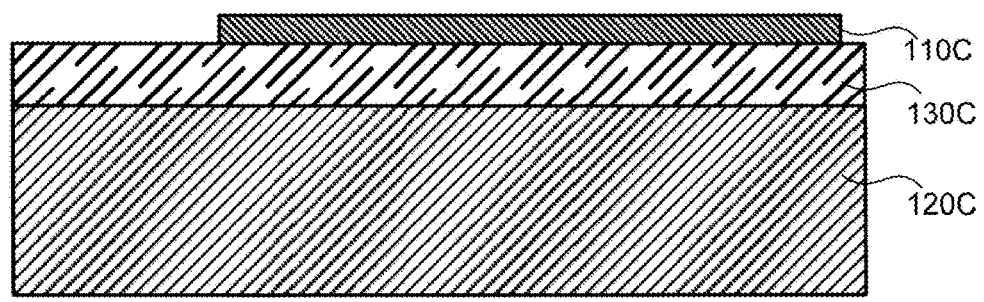
FIG. 19 is a diagram describing the method of manufacturing the TFET in the fourth embodiment of the present invention.
Figure 20:
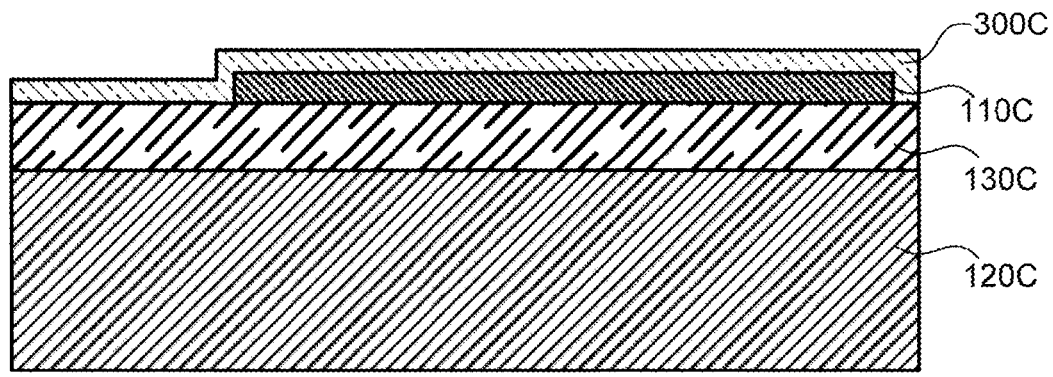
FIG. 20 is a diagram describing the method of manufacturing the TFET in the fourth embodiment of the present invention.
Figure 21:
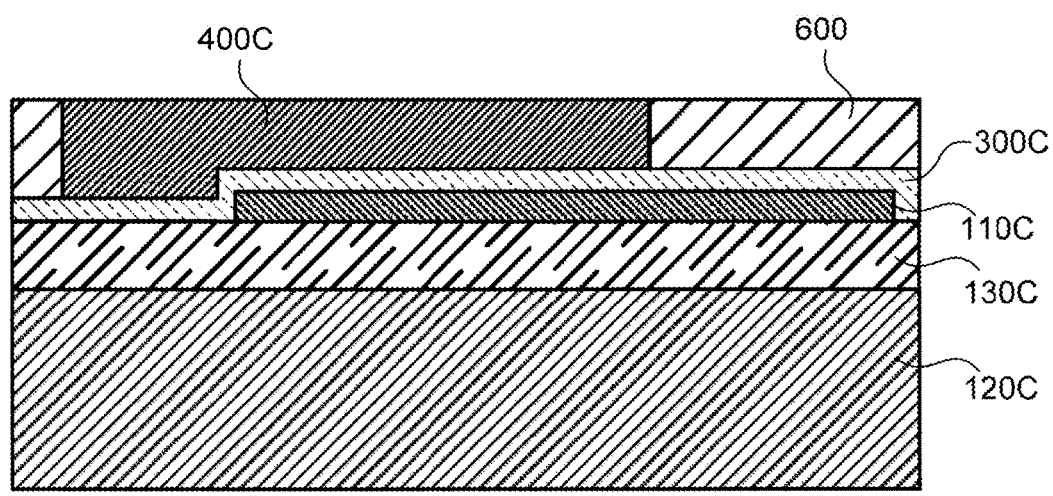
FIG. 21 is a diagram describing the method of manufacturing the TFET in the fourth embodiment of the present invention.

First, the p-type group IV semiconductor layer 110C is isolated for each TFET (FIG. 19). By using photolithography technology, the p-type group IV semiconductor layer 110C is processed into a predetermined pattern by plasma etching or the like. Next, the gate insulating layer 300C is deposited (FIG. 20). Next, the gate electrode layer 400C is formed, and the planarization insulating layer 600 is formed in a region where the gate electrode layer 400C is not arranged (FIG. 21). As for the planarization insulating layer 600, after the gate electrode layer 400C is formed, it is only required that an insulating material such as, for example, $SiO_2$, is deposited and planarized by CMP (chemical mechanical polishing) or the like.

In this manner, planarization is performed on the whole by using the planarization insulating layer 600 on a gate electrode layer 400C side, thereby making it easy to realize a structure with the TFET 10C laminated onto another structure, as will be described in FIG. 27 described further below.

Figure 22:
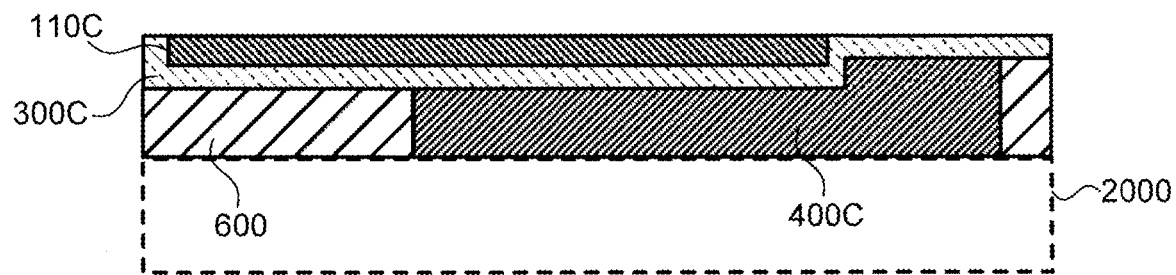
FIG. 22 is a diagram describing the method of manufacturing the TFET in the fourth embodiment of the present invention.
Figure 23:
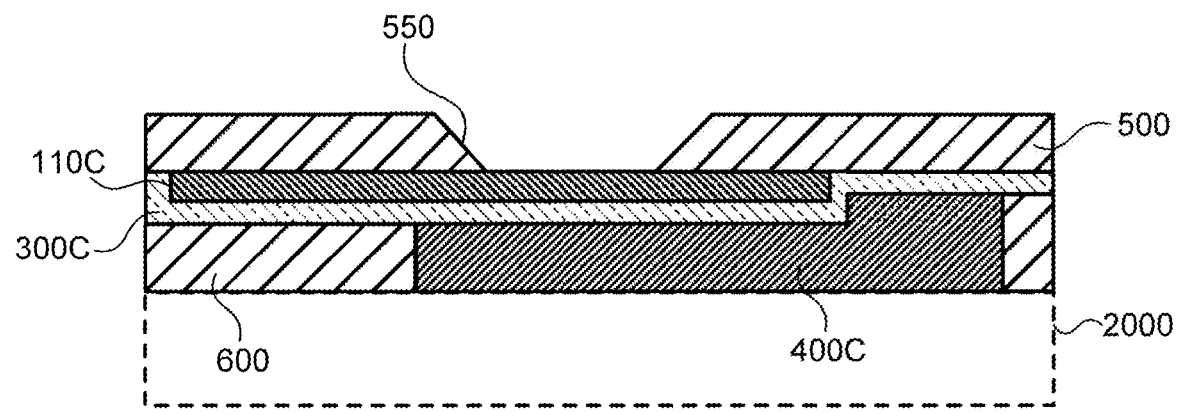
FIG. 23 is a diagram describing the method of manufacturing the TFET in the fourth embodiment of the present invention.
Figure 24:
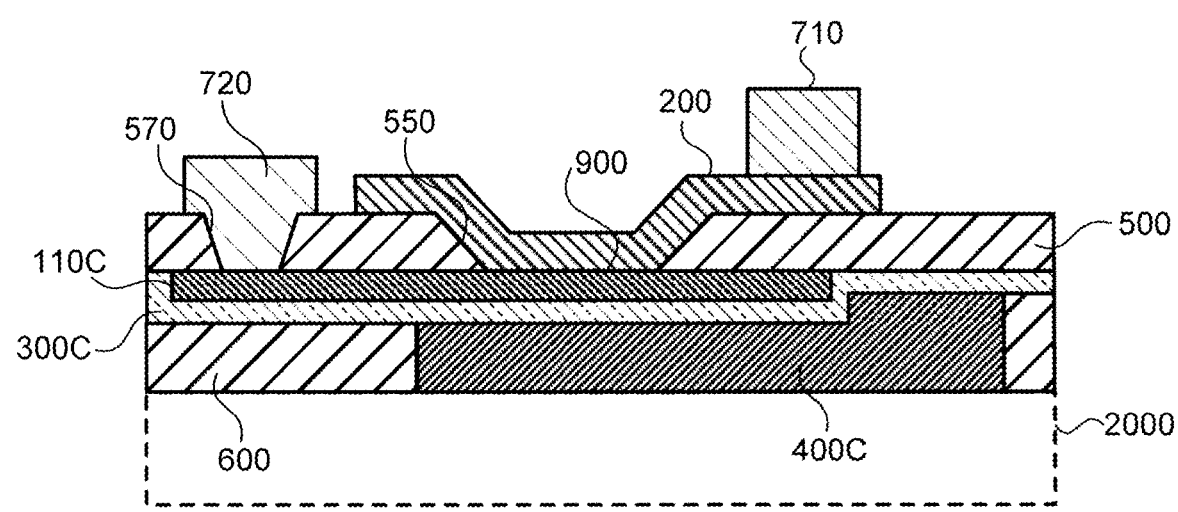
FIG. 24 is a diagram describing the method of manufacturing the TFET in the fourth embodiment of the present invention.

After lamination onto the other structure 2000, the buried oxide film 130C is removed, thereby isolating the Si substrate 120C from the p-type group IV semiconductor layer 110C (FIG. 22). Next, the isolation insulating layer 500 is deposited on a surface side of the p-type group IV semiconductor layer 110C facing the buried oxide film 130C and the junction opening 550 is formed (FIG. 23). Then, the n-type oxide semiconductor layer 200, the source electrode layer 710, and the drain electrode layer 720 are formed (FIG. 24). Then, an opening is formed in the isolation insulating layer 500 and the gate insulating layer 300C and the gate extraction electrode layer 740 electrically connected to the gate electrode layer 400C is formed (FIG. 17).

Fifth Embodiment

As a fifth embodiment, described is a TFET 10D implemented as a single structure by combining the Pch TFET 10B in the third embodiment or the Pch TFET 10C in the fourth embodiment with the Nch TFET 10 in the first embodiment.

Figure 25:
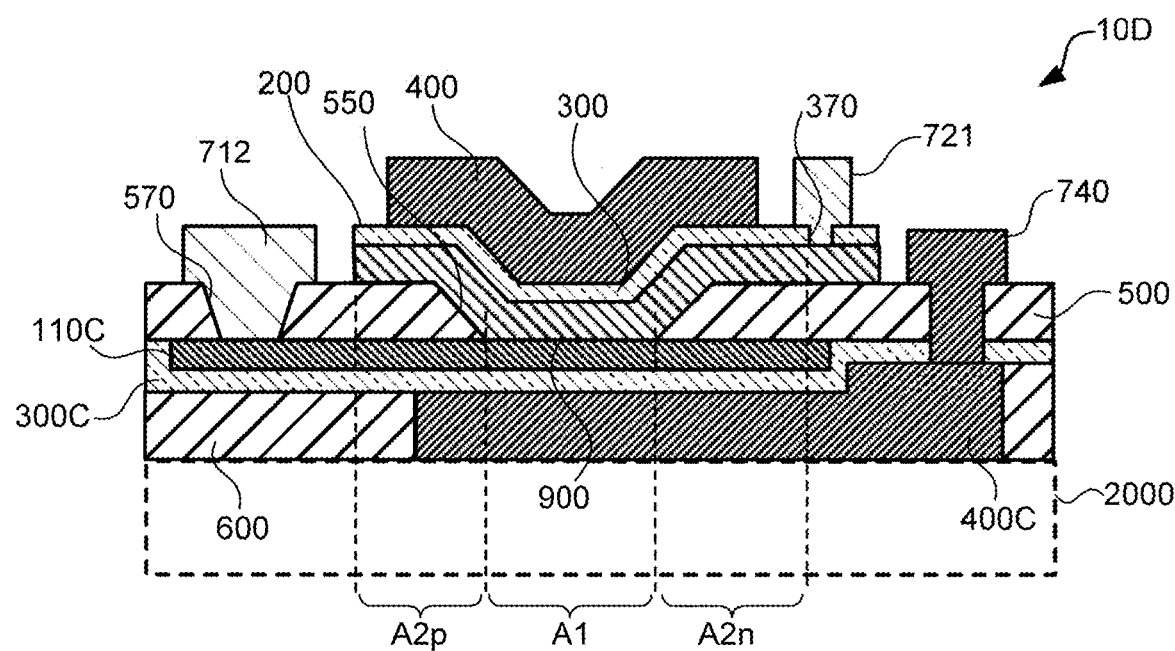
FIG. 25 is a sectional view depicting the structure of a TFET in a fifth embodiment of the present invention.

FIG. 25 is a sectional view depicting the structure of the TFET in the fifth embodiment of the present invention. According to the TFET 10D depicted in FIG. 25, on a p-type group IV semiconductor layer 110C side of the heterojunction part 900, a Pch TFET structure is realized by the structure depicted in FIG. 17. On the other hand, on an n-type oxide semiconductor layer 200 side of the heterojunction part 900, an Nch TFET structure is realized by the structure depicted in FIG. 1.

By this structure, the TFET 10D controls the potential of each of a p-side electrode layer 712 as a source, an n-side electrode layer 721 as a drain, and the gate electrode layer 400, and can thereby be used as an Nch transistor. On the other hand, the TFET 10D controls the potential of each of the p-side electrode layer 712 as a drain, the n-side electrode layer 721 as a source, and the gate electrode layer 400C, and can thereby be used as a Pch transistor.

In this structure, it is required to use a thin film on the order of 10 nm for both of the p-type group IV semiconductor layer 110C and the n-type oxide semiconductor layer 200C. Thus, the region A2 preferably includes both of a region A2$p$ toward a p-side electrode layer 712 with respect to the region A1 and a region A2$n$ toward an n-side electrode layer 721 with respect to the region A1.

Sixth Embodiment

In a sixth embodiment, a TFET 10E is described in which for the TFET 10 in the first embodiment, the p-type group IV semiconductor layer 110 is isolated for each TFET.

Figure 26:
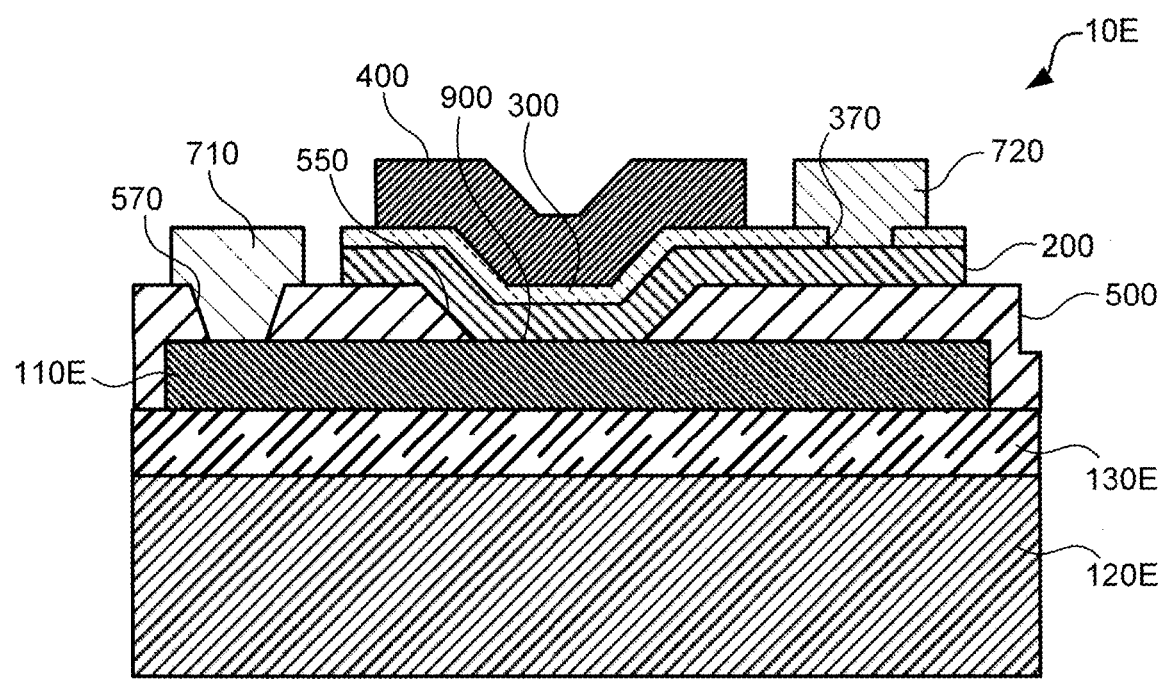
FIG. 26 is a sectional view depicting the structure of a TFET in a sixth embodiment of the present invention.

FIG. 26 is a sectional view depicting the structure of the TFET in the sixth embodiment of the present invention. The TFET 10E depicted in FIG. 26 is different in structure from the TFET 10 in the first embodiment depicted in FIG. 1 in that a p-type group IV semiconductor layer 110E is used. The p-type group IV semiconductor layer 110E is processed so as to isolate a p-type semiconductor layer arranged on a buried oxide film 130E for each TFET. The buried oxide film 130E is arranged on a Si substrate 120E. Note that the Si substrate 120E may be an insulating substrate such as glass. This TFET 10E can be manufactured by using a substrate such as SOI (Si on Insulator).

Note that as a method of isolating the p-type group IV semiconductor layer 110 for each TFET, it is possible to apply any of various methods generally adopted as a method of isolating a P+region in a P-type MOSFET. Here, STI (Shallow Trench Isolation) technology may be used.

Seventh Embodiment

In a seventh embodiment, an electronic device 1 including an inverter with the Pch TFET 10C in the fourth embodiment and the Nch TFT 10E in the sixth embodiment combined together is described. In this example, an example is described in which the TFET 10C and the TFET 10E are arranged on different layers.

Figure 27:
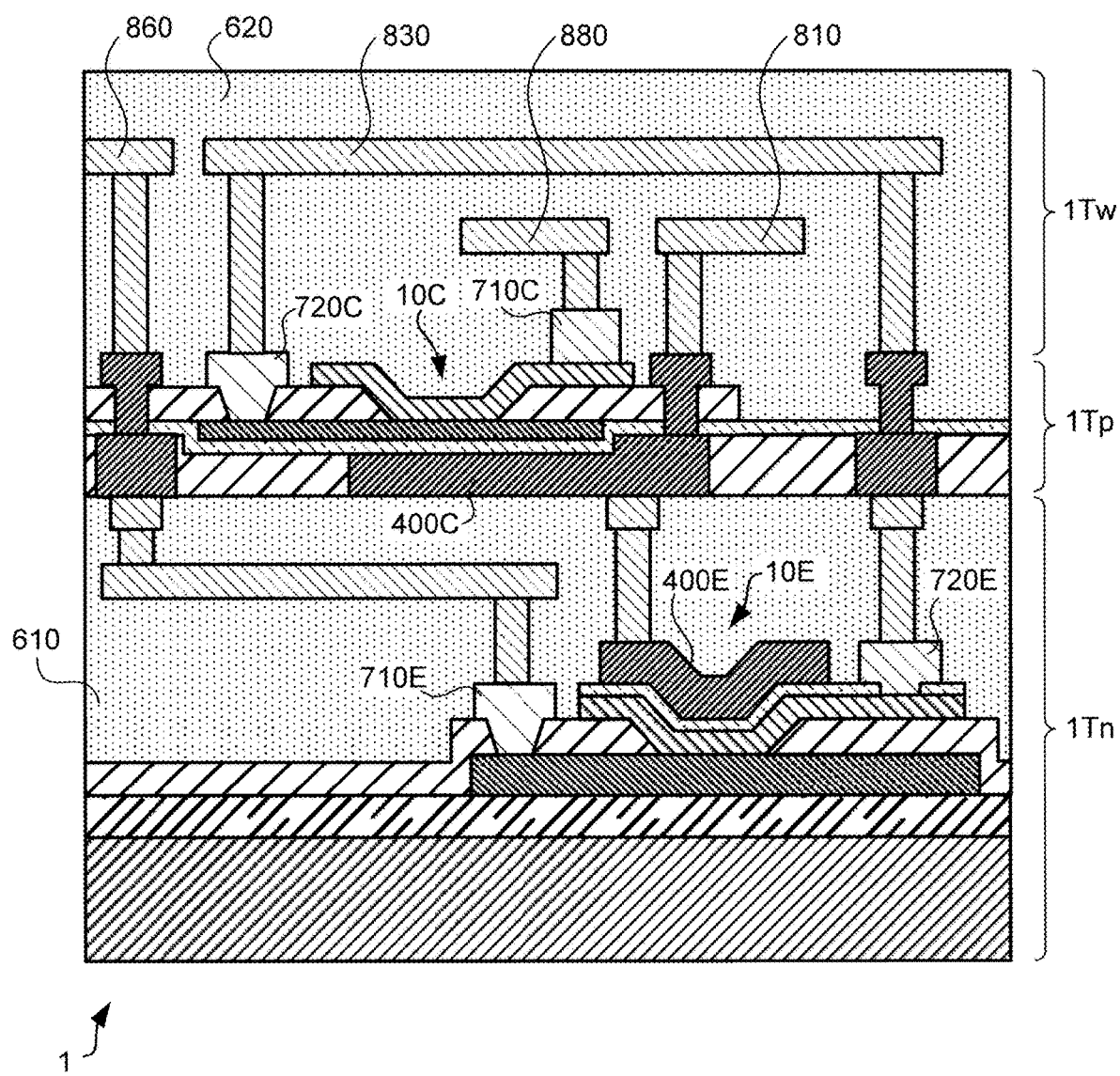
FIG. 27 is a sectional view depicting the structure of an electronic device in a seventh embodiment of the present invention.

FIG. 27 is a sectional view depicting the structure of the electronic device in the seventh embodiment of the present invention. In the example depicted in FIG. 27, in the electronic device 1, a structure in which one inverter is assumed is extracted, and an Nch transistor part 1Tn, a Pch transistor part 1Tp, and a wire part 1Tw are depicted.

In the Nch transistor part 1Tn, the Nch TFET 10E is arranged, which is covered by a lower interlayer insulating layer 610. In the lower interlayer insulating layer 610, wires connected to the TFET 10E are arranged. In this example, the Nch transistor part 1Tn has its upper surface formed as being planarized.

In the Pch transistor part 1Tp, the Pch TFET 10C is arranged, which is covered, together with the wire part 1Tw, by an upper interlayer insulating layer 620. As depicted in FIG. 25, the Pch transistor part 1Tp has its lower surface formed as being planarized and connected to the upper surface of the Nch transistor part 1Tn.

A gate electrode layer 400E of the TFET 10E and the gate electrode layer 400C of the TFET 10C are electrically connected together, and are further connected to a gate input wire 810. A drain electrode layer 720E of the TFET 10E and a drain electrode layer 720C of the TFET 10C are connected via a drain output wire 830. A source electrode layer 710E of the TFET 10E is connected to a low power supply line 860. A source electrode layer 710C of the TFET 10C is connected to a high power supply line 880. In this manner, conductors connecting the TFET 10E and the TFET 10C are arranged at least in the wire part 1Tw.

A low potential side of a power supply is connected to the low power supply line 860, and a high potential side of the power supply is connected to the high power supply line 880. Also, to the gate input wire 810, for example, an output signal from an inverter on the previous stage is input as a digital signal. To the drain output wire 830, an inverted signal of the signal input to the gate input wire 810 is output by an inverter configured of the TFET 10E and the TFET 10C. Note that the gate input wire 810 can be said as a terminal to which a digital signal is supplied if the inverter is at an initial stage.

Eighth Embodiment

In an eighth embodiment, an electronic device 1A including an inverter with the Pch TFET 10B in the third embodiment and the Nch TFET 10E in the sixth embodiment combined together is described. In this example, an example is described in which the TFET 10B and the TFET 10E are arranged so as to mutual realize a partial structure in the same layer. Note that, as with the seventh embodiment, the TFET 10C in the fourth embodiment may be applied as a Pch TFET.

Figure 28:
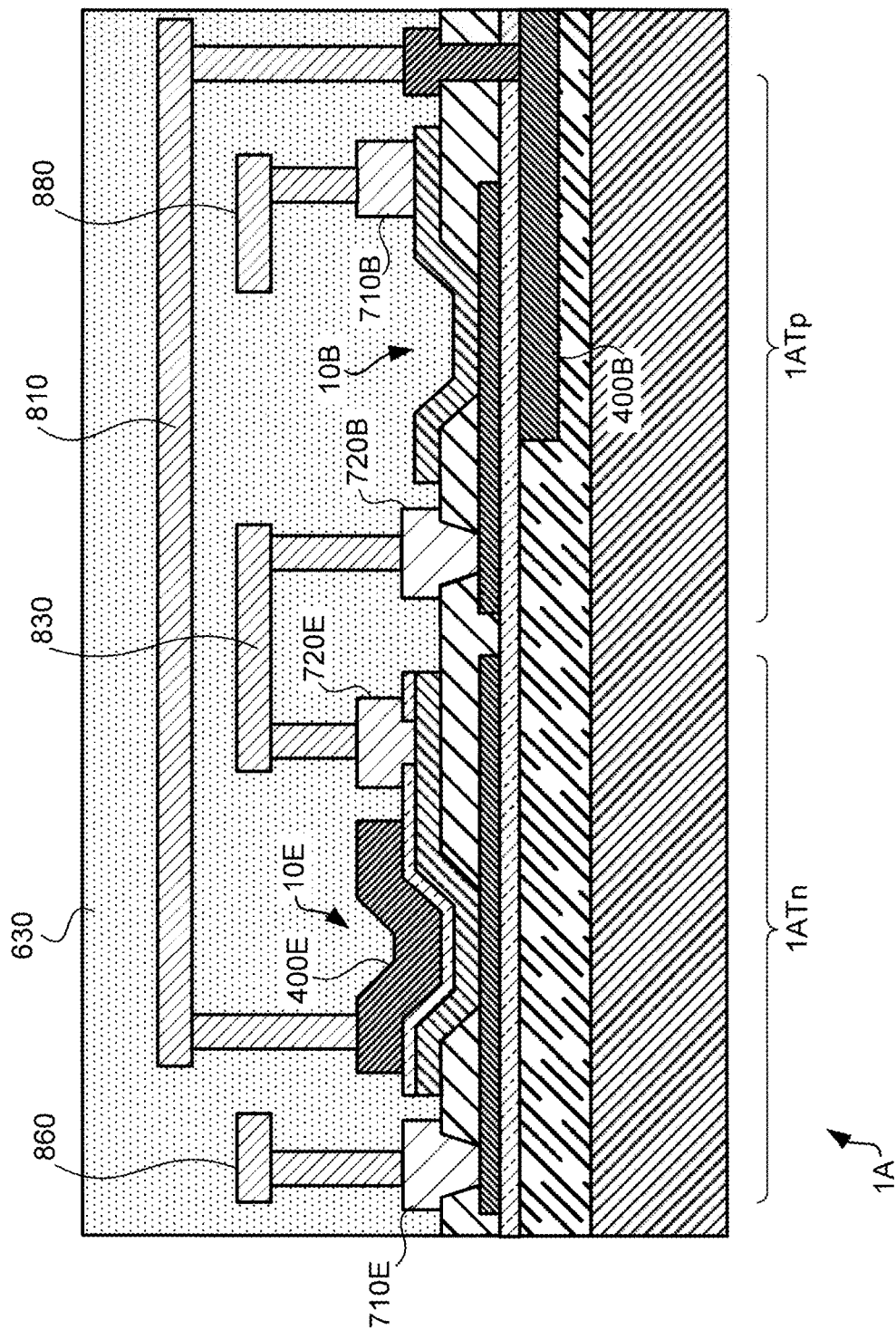
FIG. 28 is a sectional view depicting the structure of an electronic device in an eighth embodiment of the present invention.

FIG. 28 is a sectional view depicting the structure of the electronic device in the eighth embodiment of the present invention. In the example depicted in FIG. 28, in the electronic device 1A, a structure in which one inverter is assumed is extracted, and an Nch transistor part 1ATn and a Pch transistor part 1ATp are depicted.

The Nch TFET 10E is arranged in the Nch transistor part 1ATn and the Pch TFET 10B is arranged in the Pch transistor part 1ATp, and each is covered by an interlayer insulating layer 630.

The gate electrode layer 400E of the TFET 10E and the gate electrode layer 400B of the TFET 10B are connected via the gate input wire 810. The drain electrode layer 720E of the TFET 10E and a drain electrode layer 720B of the TFET 10B are connected via the drain output wire 830. The source electrode layer 710E of the TFET 10E is connected to the low power supply line 860. A source electrode layer 710B of the TFET 10B is connected to the high power supply line 880. In this manner, the TFET 10E and the TFET 10B are connected together by conductors.

A low potential side of a power supply is connected to the low power supply line 860, and a high potential side of the power supply is connected to the high power supply line 880. Also, to the gate input wire 810, for example, an output signal from an inverter on the previous stage is input as a digital signal. To the drain output wire 830, an inverted signal of the signal input to the gate input wire 810 is output by an inverter configured of the TFET 10E and the TFET 10B. Note that the gate input wire 810 can be said as a terminal to which a digital signal is supplied if the inverter is at an initial stage.

Ninth Embodiment

A TFET 10F in a ninth embodiment is described.

Figure 29:
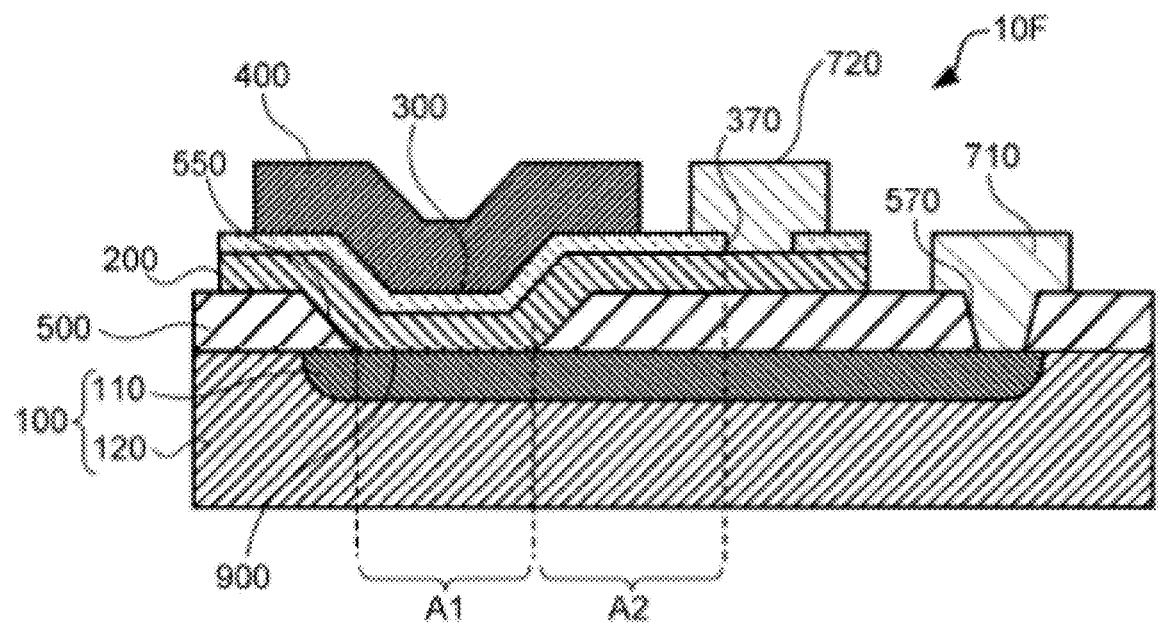
FIG. 29 is a sectional view depicting the structure of a TFET in a ninth embodiment of the present invention.

FIG. 29 is a sectional view depicting the structure of the TFET in the ninth embodiment of the present invention. In the TFET 10 in the first embodiment, the drain electrode layer 720 is arranged oppositely to the source electrode layer 710 with respect to the heterojunction part 900. In the TFET 10F in the ninth embodiment, as depicted in FIG. 29, the drain electrode layer 720 is arranged on the same side as the source electrode layer 710 with respect to the heterojunction part 900. In this case, a route from the heterojunction part 900 to the source electrode layer 710 and a route from the heterojunction part 900 to the drain electrode layer 720 both pass the common region A2.

Tenth Embodiment

In the heterojunction part 900, as described above, an exceptionally thin insulating layer may be arranged between the p-type group IV semiconductor layer 110 and the n-type oxide semiconductor layer 200. In a tenth embodiment, described is a TFET 10G in which such an insulating layer as above is present.

Figure 30:
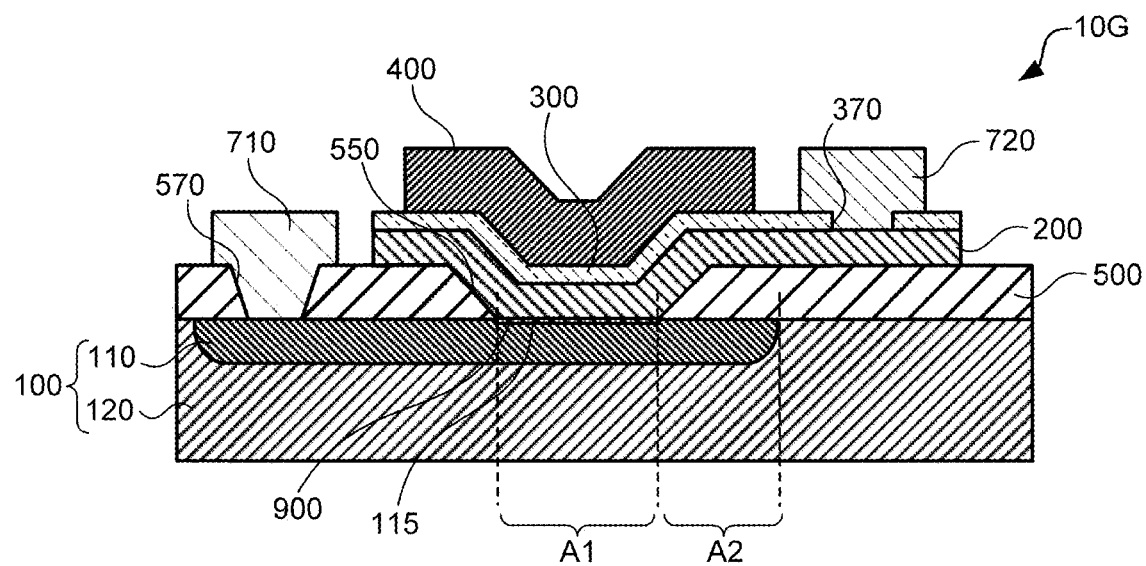
FIG. 30 is a sectional view depicting the structure of a TFET in a tenth embodiment of the present invention.

FIG. 30 is a sectional view depicting the structure of the TFET in the tenth embodiment of the present invention. In the TFET 10G, a junction insulating layer 115 on the order of 1 nm is arranged on the heterojunction part 900. In this example, the junction insulating layer 115 is an insulating material containing the p-type group IV semiconductor layer 110 as a component and, for example, is an oxide film or nitride film of this component. By the influence of oxygen components included in the n-type oxide semiconductor layer 200, an oxide film of the p-type group IV semiconductor layer 110 may be formed as the junction insulating layer 115.

Eleventh Embodiment

While the side surfaces of the junction opening 550 have tilts in the first embodiment, they may not have tilts. In an eleventh embodiment, described is a TFET 10H formed with a junction opening 550H having side surfaces perpendicular to the heterojunction part 900.

Figure 31:
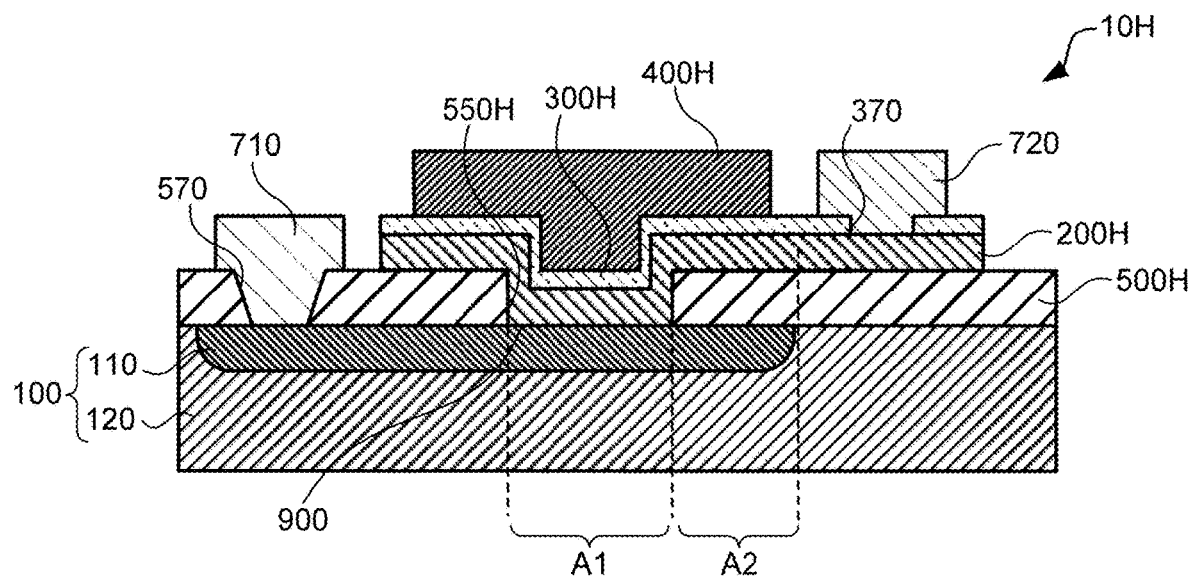
FIG. 31 is a sectional view depicting the structure of a TFET in an eleventh embodiment of the present invention.

FIG. 31 is a sectional view depicting the structure of the TFET in the eleventh embodiment of the present invention. As depicted in FIG. 31, the junction opening 550H with side surface perpendicular to the heterojunction part 900 is formed in an isolation insulating layer 500H. In this case, an n-type oxide semiconductor layer 200H, a gate insulating layer 300H, and a gate electrode layer 400H are formed so that the side surfaces of the junction opening 550H are covered without any step disconnections.

Twelfth Embodiment

In the first embodiment, as depicted in FIG. 2, the gate electrode layer 400 covers the entire heterojunction part 900, thereby placing the heterojunction part 900 and the tunnel junction part in the same region. In a twelfth embodiment, an example is described in which a tunnel junction is realized in a part of the heterojunction part 900.

Figure 32:
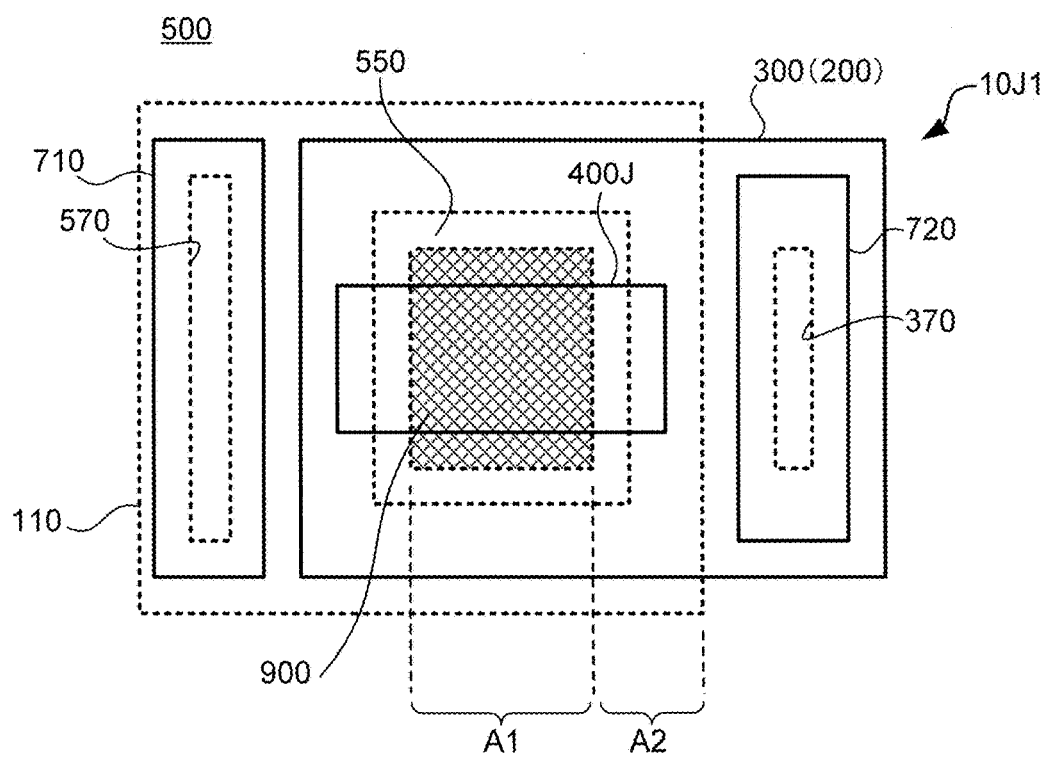
FIG. 32 is a top view depicting a first example of the structure of a TFET in a twelfth embodiment of the present invention.

FIG. 32 is a top view depicting a first example of the structure of a TFET in the twelfth embodiment of the present invention. A TFET 10J1 depicted in FIG. 32 is different from the TFET 10 in the first embodiment in that the TFET has a gate electrode layer 400J which covers only a part of the heterojunction part 900. In this example, while a gate electrode layer 400J in a structure similar to that in the first embodiment is formed on a source electrode layer 710 side and a drain electrode layer 720 side of the heterojunction part 900, the outer edge of the gate electrode layer 400J in a direction perpendicular to a direction connecting the source electrode layer 710 and the drain electrode layer 720 is at a position overlapping the heterojunction part 900.

Figure 33:
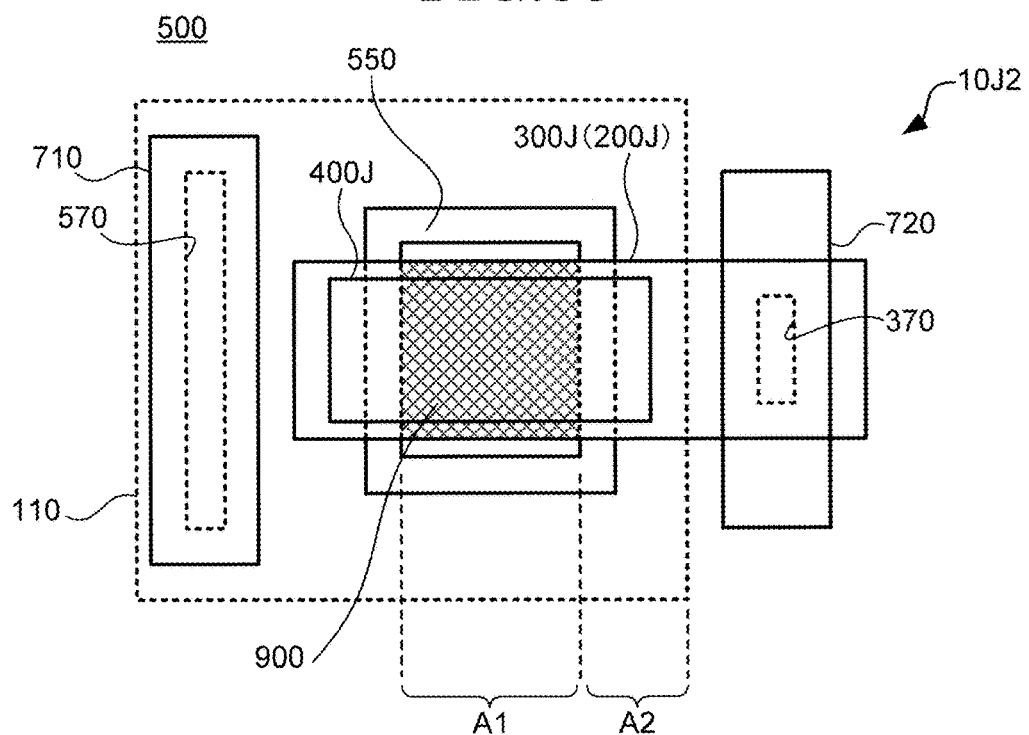
FIG. 33 is a top view depicting a second example of the structure of the TFET in the twelfth embodiment of the present invention.

FIG. 33 is a top view depicting a second example of the structure of the TFET in the twelfth embodiment of the present invention. A TFET 10J2 depicted in FIG. 33 is different from the TFET 10J1 depicted in FIG. 32 in that the heterojunction part 900 is in a range further smaller than that of the junction opening 550. In this example, while an n-type oxide semiconductor layer 200J and a gate insulating layer 300J are formed in a structure similar to that of the first embodiment on the source electrode layer 710 side and the drain electrode layer 720 side of the heterojunction part 900, the outer edge of the n-type oxide semiconductor layer 200J in a direction perpendicular to a direction connecting the source electrode layer 710 and the drain electrode layer 720 is at a position overlapping the heterojunction part 900. That is, in this direction, the outer edge of the n-type oxide semiconductor layer 200J is present between an open end of the junction opening 550 and the outer edge of the gate electrode layer 400J. Note that while the outer edge of the n-type oxide semiconductor layer 200J and that of the gate insulating layer 300J match in the drawing, the outer edge of the gate insulating layer 300J may be present further outside.

In both of the TFET 10J1 and the TFET 10J2, the tunneling phenomenon occurs not in the entire heterojunction part 900 but in a region where the heterojunction part 900 and the gate electrode layer 400J overlap each other. Also, in this structure, the occurrence of the tunneling phenomenon at the outer edge of the p-type group IV semiconductor layer 110 or the outer edge of the n-type oxide semiconductor layer 200 can be suppressed. Even if the tunneling phenomenon occurs on an outer edge portion, the influences on the characteristics are negligible if the length of the heterojunction part 900 in a direction perpendicular to the length in a direction connecting the source electrode layer 710 and the drain electrode layer 720 is sufficiently long.

Thirteenth Embodiment

While the heterojunction part 900 has a rectangular shape in the first embodiment, it may have a shape other than a rectangular shape. In a thirteenth embodiment, described is a TFET 10K including a circular heterojunction part 900K. Note that the outer edge of the heterojunction part 900 may be formed by only a straight line as in a rectangle, by a curve, or may be formed as including a straight line and a curve.

Figure 34:
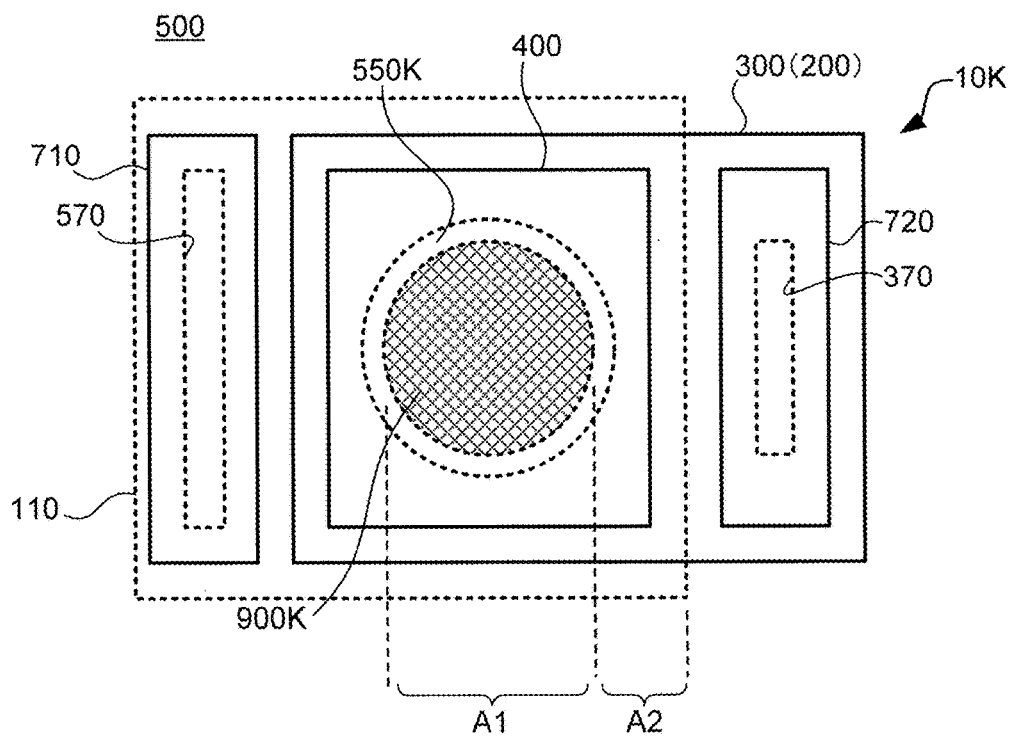
FIG. 34 is a top view depicting the structure of a TFET in a thirteenth embodiment of the present invention.

FIG. 34 is a top view depicting the structure of the TFET in the thirteenth embodiment of the present invention. In the TFET 10K depicted in FIG. 34, a circular junction opening 550K is formed in the isolation insulating layer 500. As a result, a circular heterojunction part 900K is formed. In this manner, with the heterojunction part 900K having a curved outer edge as a circle, an angular portion can be removed from a region where the tunneling phenomenon occurs.

Fourteenth Embodiment

While one heterojunction part 900 is arranged in one TFET 10 in the first embodiment, a plurality of heterojunction parts 900 may be arranged. In a fourteenth embodiment, a TFET 10L including two heterojunction parts 900L1 and 900L2 is described.

Figure 35:
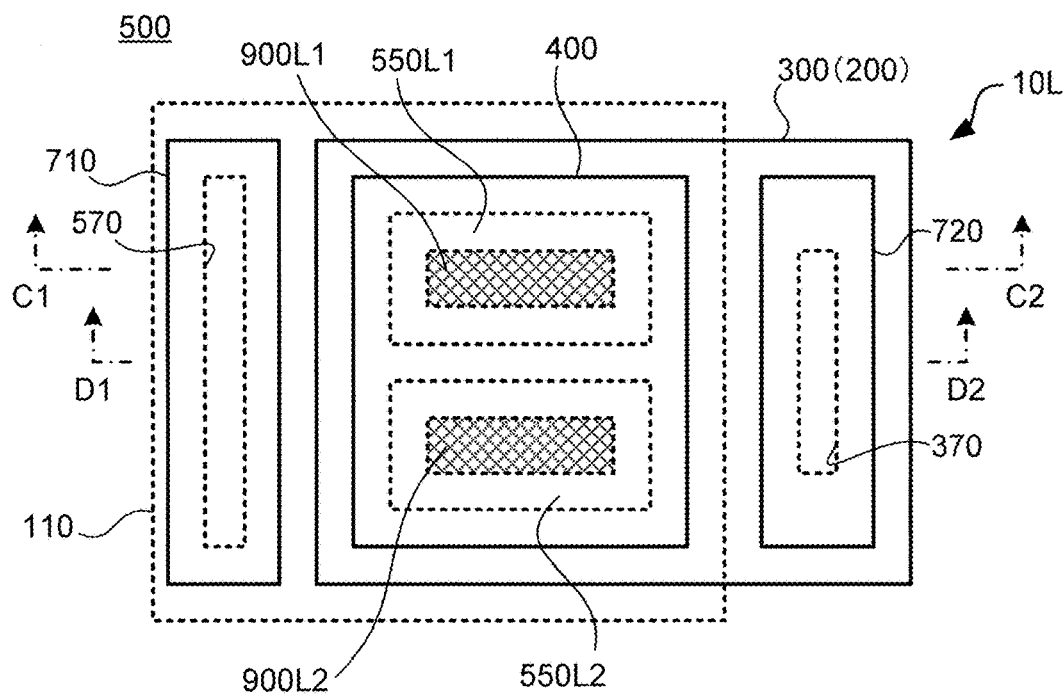
FIG. 35 is a top view depicting the structure of a TFET in a fourteenth embodiment of the present invention.
Figure 36:
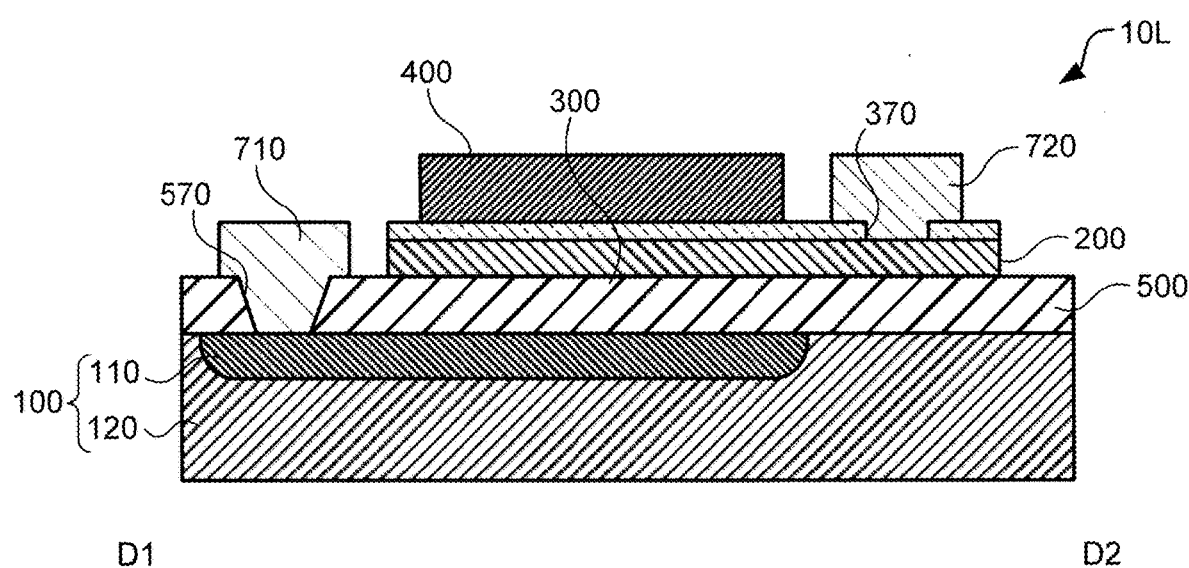
FIG. 36 is a sectional view depicting the structure of the TFET in the fourteenth embodiment of the present invention.

FIG. 35 is a top view depicting the structure of the TFET in the fourteenth embodiment of the present invention. FIG. 36 is a sectional view depicting the structure of the TFET in the fourteenth embodiment of the present invention. FIG. 36 corresponds to a sectional view along a cutting line D1-D2 in FIG. 35. Note that a sectional view along a cutting line C1-C2 is similar to that in FIG. 1. As depicted in FIG. 35, two junction openings 550L1 and 550L2 are formed in the TFET 10L for the isolation insulating layer 500. In these portions, the heterojunction parts 900L1 and 900L2 are arranged.

In this example, the two heterojunction parts 900L1 and 900L2 are arranged as being aligned in a direction perpendicular to a direction connecting the source electrode layer 710 and the drain electrode layer 720. In principle, the ON current is the same if the area with the two heterojunction parts 900L1 and 900L2 converged is equal to the area of one heterojunction part 900 as in the first embodiment. However, depending on the film condition of the p-type group IV semiconductor layer 110 and the n-type oxide semiconductor layer 200, the shorter a shortest distance from the center of gravity of the heterojunction part to the edge of the heterojunction part is, the higher the ON current becomes even with the same area.

Note that the two heterojunction parts 900L1 and 900L2 may be arranged as being aligned in a direction connecting the source electrode layer 710 and the drain electrode layer 720 or may be arranged obliquely to this direction. Also, the two heterojunction parts 900L1 and 900L2 may have the same area or different areas, and may have the same shape or different shapes.

Fifteenth Embodiment

In the fourteenth embodiment, the two heterojunction parts 900L1 and 900L2 are arranged between the source electrode layer 710 and the drain electrode layer 720. In a fifteenth embodiment, described is a TFET 10M having the drain electrode layer 720 arranged between two heterojunction parts 900M1 and 900M2.

Figure 37:
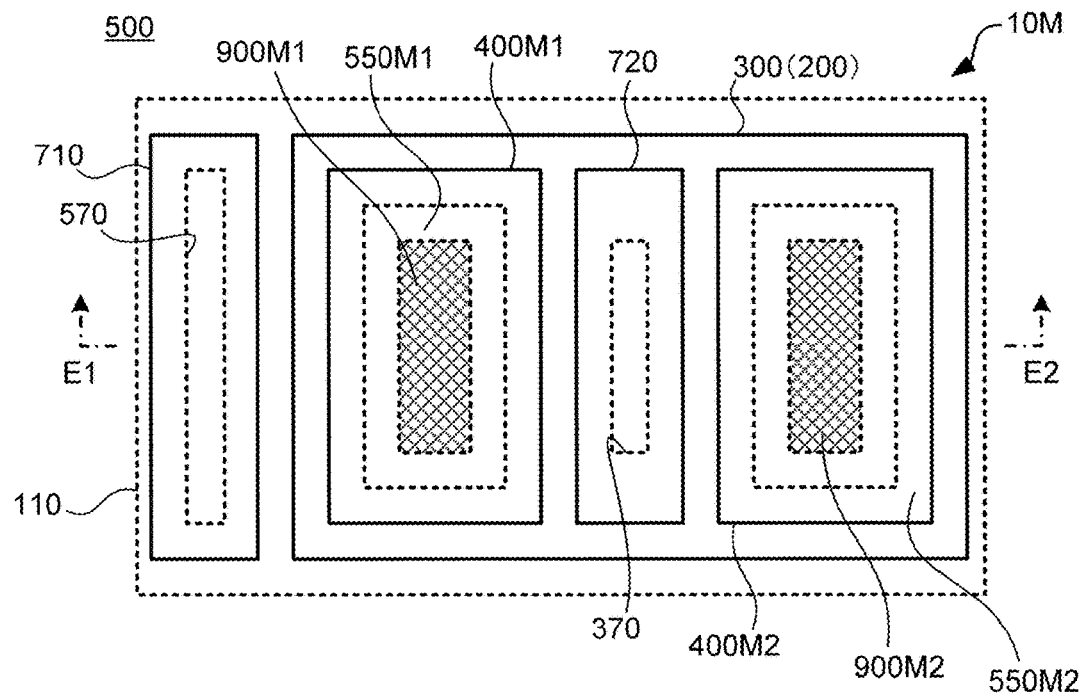
FIG. 37 is a top view depicting the structure of a TFET in a fifteenth embodiment of the present invention.
Figure 38:
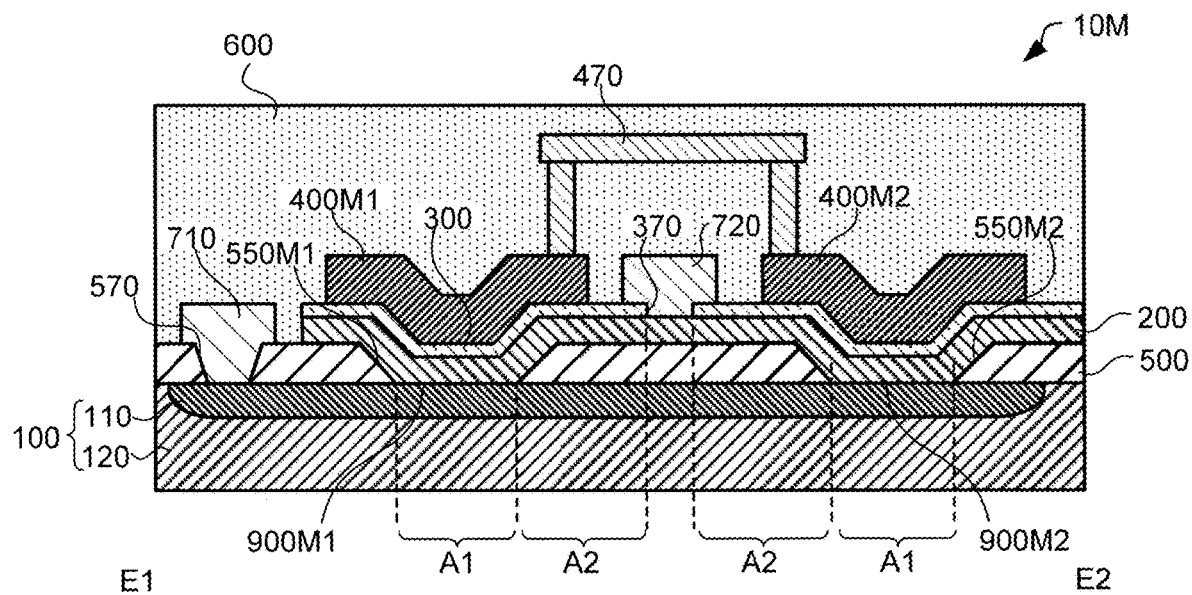
FIG. 38 is a sectional view depicting the structure of the TFET in the fifteenth embodiment of the present invention.

FIG. 37 is a top view depicting the structure of the TFET in the fifteenth embodiment of the present invention. FIG. 38 is a sectional view depicting the structure of the TFET in the fifteenth embodiment of the present invention. FIG. 38 corresponds to a sectional view along a cutting line E1-E2 in FIG. 37. As depicted in FIG. 37 and FIG. 38, in the TFET 10M, two junction openings 550M1 and 550M2 are formed for the isolation insulating layer 500. In this portion, the heterojunction parts 900M1 and 900M2 are arranged.

The drain electrode layer 720 is arranged between the heterojunction part 900M1 and the heterojunction part 900M2. Gate electrode layers 400M1 and 400M2 are arranged so as to correspond to the heterojunction parts 900M1 and 900M2, respectively, and are electrically connected via a wire 470 arranged above the drain electrode layer 720. Note that the gate electrode layer 400M1 and the gate electrode layer 400M2 may be directly connected by bypassing the drain electrode layer 720 on a plane.

While the source electrode layer 710 is arranged only on a gate electrode layer 400M1 side with respect to the drain electrode layer 720, it may be arranged also on a gate electrode layer 400M2 side with respect to the drain electrode layer 720. This structure is preferable when the resistance of the p-type group IV semiconductor layer 110 is high and close to that of the n-type oxide semiconductor layer 200. With this, two source electrode layers and two heterojunction parts may be arranged so as to have linear symmetry by centering on the drain electrode layer 720, thereby being equivalent as much as possible in both heterojunction parts.

Sixteenth Embodiment

In a sixteenth embodiment, a TFET 10N having a heterojunction part 900N arranged so as to surround a drain electrode layer 720N is described.

Figure 39:
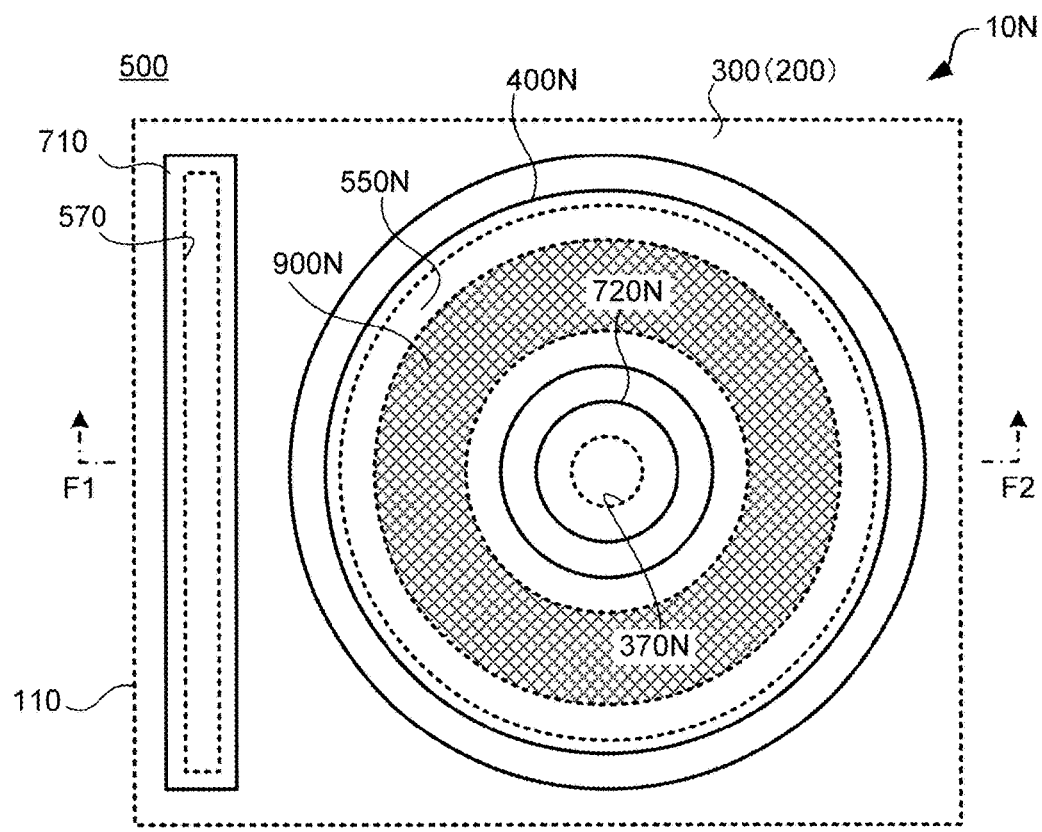
FIG. 39 is a top view depicting the structure of a TFET in a sixteenth embodiment of the present invention.
Figure 40:
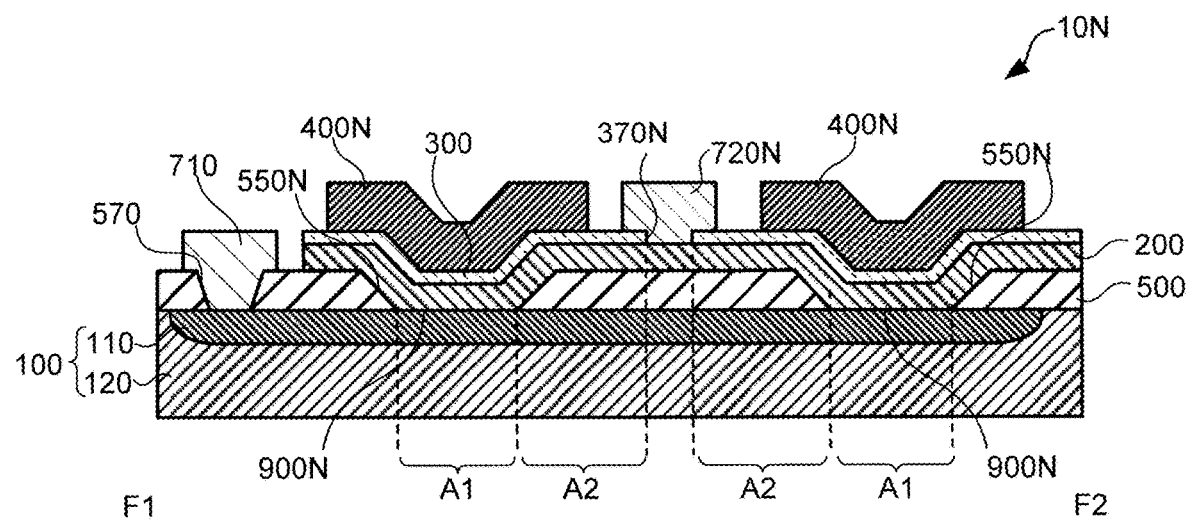
FIG. 40 is a sectional view depicting the structure of the TFET in the sixteenth embodiment of the present invention.

FIG. 39 is a top view depicting the structure of the TFET in the sixteenth embodiment of the present invention. FIG. 40 is a sectional view depicting the structure of the TFET in the sixteenth embodiment of the present invention. FIG. 40 corresponds to a sectional view along a cutting line F1-F2 in FIG. 39. As depicted in FIG. 39, in the TFET 10N, an annular junction opening 550N is formed for the isolation insulating layer 500. In this portion, an annular heterojunction part 900N is arranged. A gate electrode layer 400N is also annularly formed.

At a center portion surrounded by the annularly-arranged heterojunction part 900N and gate electrode layer 400N, a drain electrode layer 720N is arranged via an opening 370N formed in the gate insulating layer 300. Note that the relation between the drain electrode layer 720N and the source electrode layer 710 may be switched to cause the source electrode layer 710 to be surrounded by the heterojunction part 900N.

A region where the source electrode layer 710 and the p-type group IV semiconductor layer 110 are connected (corresponding to the opening 570) may be annularly arranged so as to surround the outside of the heterojunction part 900N. This structure is suitable when the resistance of the p-type group IV semiconductor layer 110 is high and close to that of the n-type oxide semiconductor layer 200. With this, two source electrode layers and two heterojunction parts may be arranged so as to have point symmetry (rotational symmetry) by centering on the drain electrode layer 720, thereby being equivalent with respect to any direction from the drain electrode layer 720N.

Seventeenth Embodiment

In a seventeenth embodiment, an Nch TFET 10P to which the shape of a fin-shaped transistor is applied is described.

Figure 41:
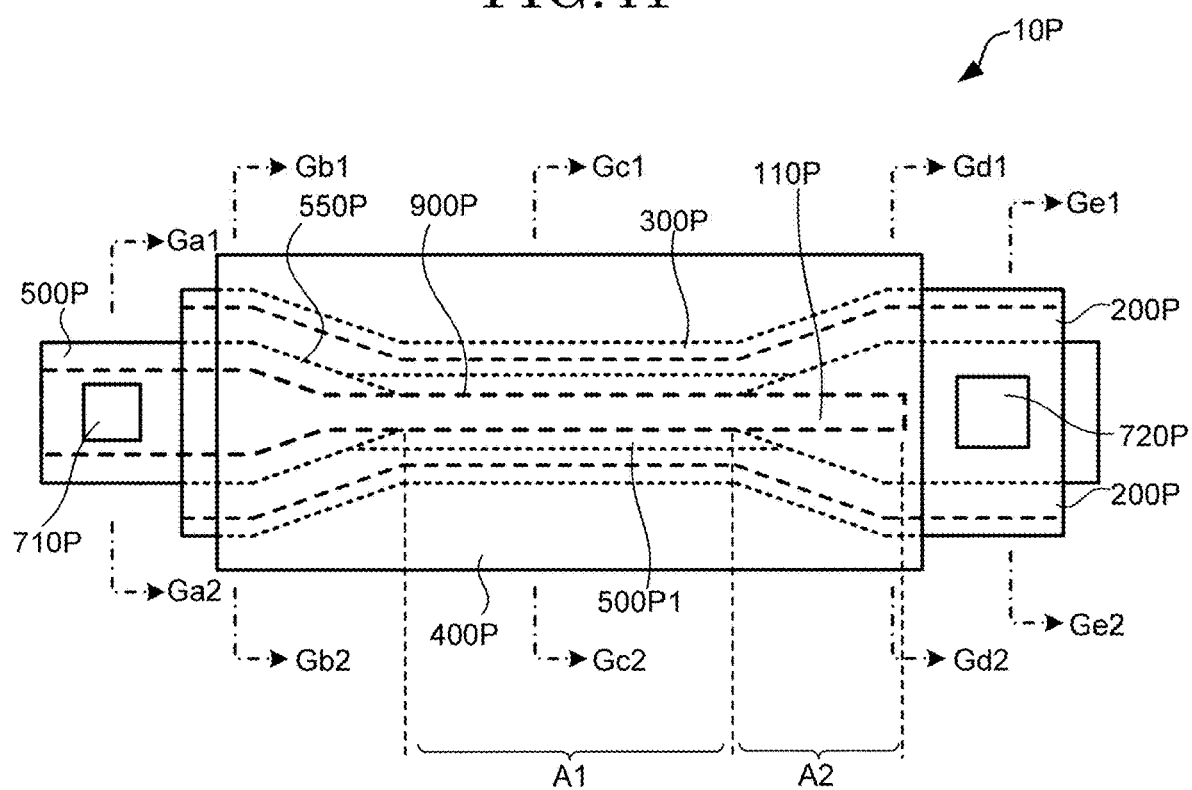
FIG. 41 is a top view depicting the structure of a TFET in a seventeenth embodiment of the present invention.
Figure 42:
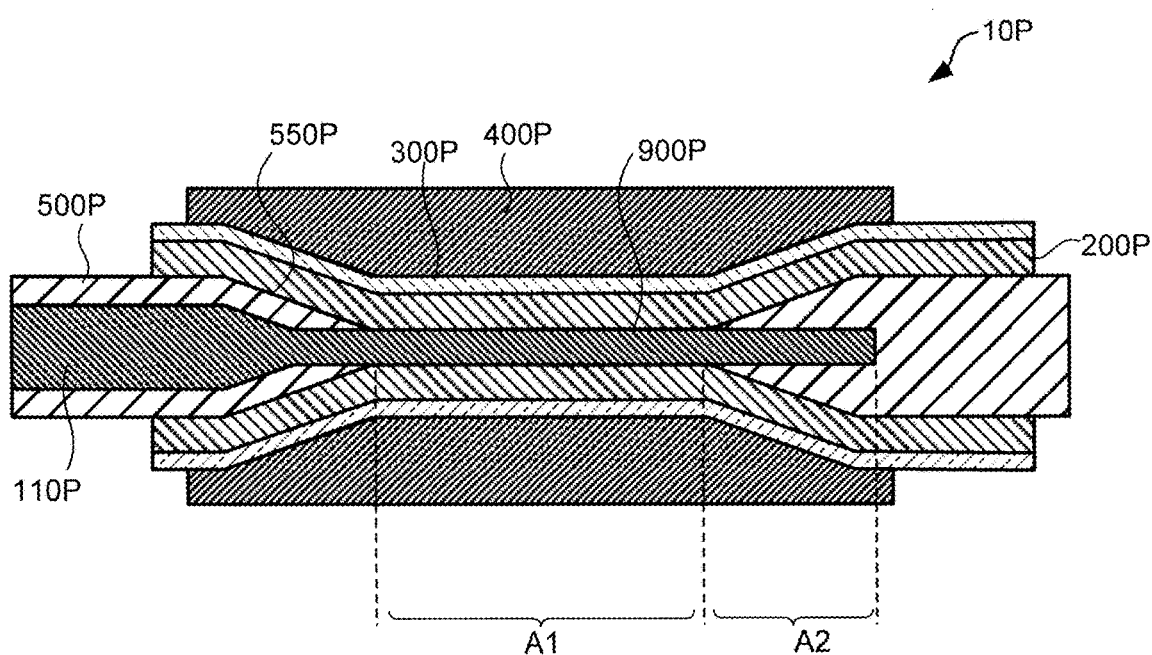
FIG. 42 is a horizonal sectional view depicting the structure of the TFET in the seventeenth embodiment of the present invention.
Figure 43A:
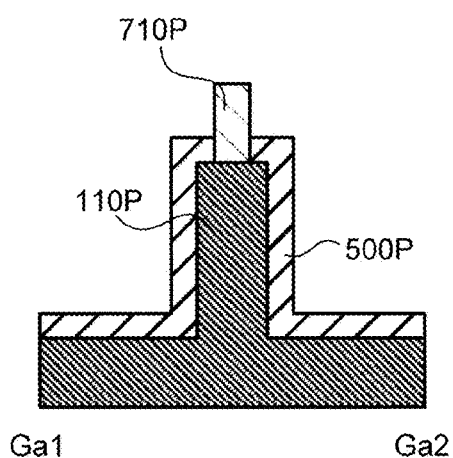
FIGS. 43A, 43B, 43C, 43D, and 43E depict vertical sectional views depicting the structure of the TFET in the seventeenth embodiment of the present invention.
Figure 43B:
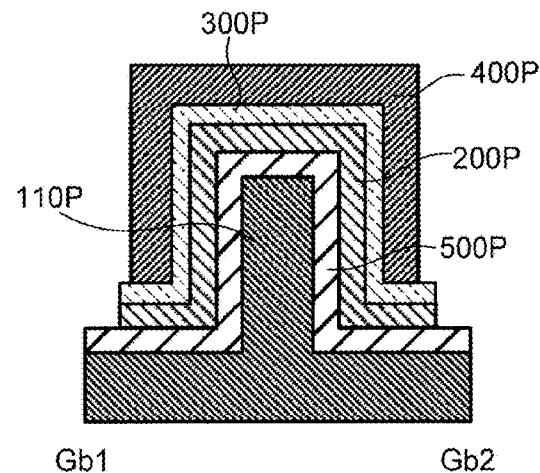
Figure 43C:
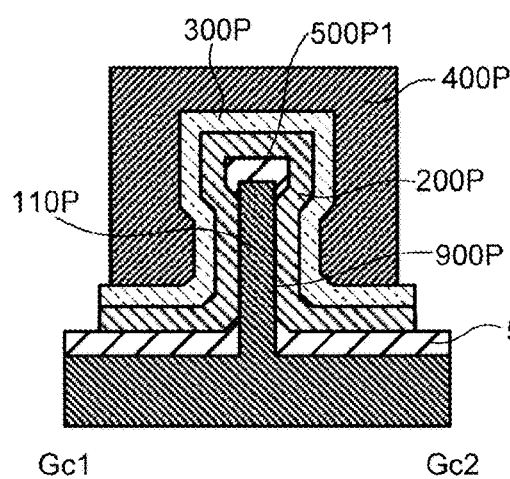
Figure 43D:
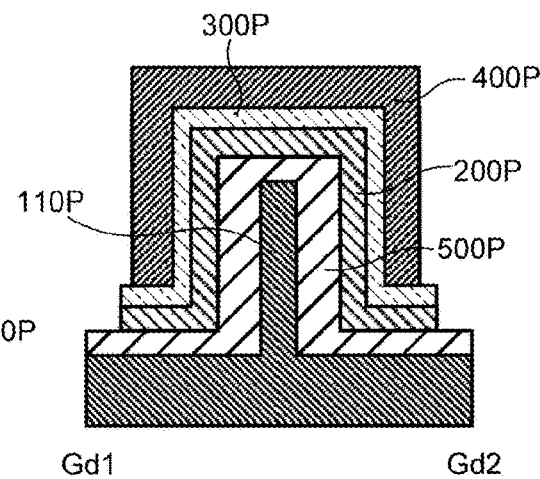
Figure 43E:
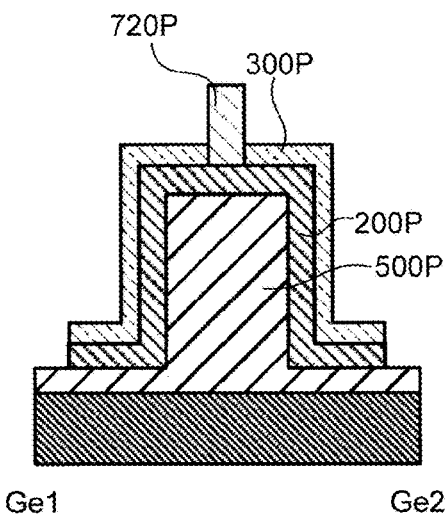

FIG. 41 is a top view depicting the structure of the TFET in the seventeenth embodiment of the present invention. FIG. 42 is a horizonal sectional view depicting the structure of the TFET in the seventeenth embodiment of the present invention. FIGS. 43A, 43B, 43C, 43D, and 43E depict vertical sectional views depicting the structure of the TFET in the seventeenth embodiment of the present invention. FIGS. 43A, 43B, 43C, 43D, and 43E correspond to sectional views along a cutting line Ga1-Ga2, a cutting line Gb1-Gb2, a cutting line Gc1-Gc2, a cutting line Gd1-Gd2, and a cutting line Ge1-Ge2 in FIG. 41. FIG. 42 depicts a horizontal section of the TFET 10P at a half of the height of a p-type group IV semiconductor layer 110P formed in a fin shape.

The p-type group IV semiconductor layer 110P is formed to extend vertically on the substrate surface. A portion to which a source electrode layer 710P is connected is formed in a shape with a width wider than the other portions, but may not necessarily have this shape. An isolation insulating layer 500P is arranged so as to cover the p-type group IV semiconductor layer 110P. In a part (region A1) of the isolation insulating layer 500P, a junction opening 550P is formed, and part of both surfaces of the p-type group IV semiconductor layer 110P is exposed. Further outside, an n-type oxide semiconductor layer 200P is arranged. Thus, a heterojunction with the n-type oxide semiconductor layer 200P is realized on both surfaces of the p-type group IV semiconductor layer 110P so as to correspond to the position of the junction opening 550P. Therefore, a heterojunction part 900P is arranged on both surfaces of the p-type group IV semiconductor layer 110P.

Further outside of the n-type oxide semiconductor layer 200P, a gate insulating layer 300P is arranged. Further outside, a gate electrode layer 400P is arranged. In a sectional structure of the region A1 depicted in FIG. 42 (sectional structure along the cutting line Gc1-Gc2), an isolation insulating layer 500P1 is arranged at an apex part of the p-type group IV semiconductor layer 110P.

Figure 45:
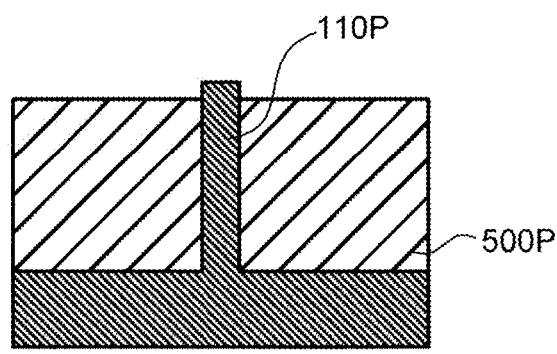
FIG. 45 is a diagram describing the method of manufacturing the TFET in the seventeenth embodiment of the present invention.
Figure 46:
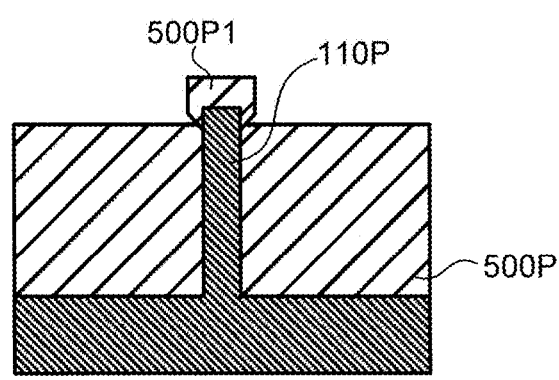
FIG. 46 is a diagram describing the method of manufacturing the TFET in the seventeenth embodiment of the present invention.

Therefore, when viewed perpendicularly with respect to the plane of the heterojunction part 900P, the heterojunction part 900P is a region surrounded by the isolation insulating layers 500P and 500P1. Note that the isolation insulating layer 500P1 may not be present. If the isolation insulating layer 500P1 is not present, in a manufacturing method described further below, the processes in FIGS. 45 and 46 are not required.

The source electrode layer 710P is electrically connected at the apex part of the p-type group IV semiconductor layer 110P. Note that the source electrode layer 710P may be electrically connected in a region other than the fin-shaped portion in the p-type group IV semiconductor layer 110P.

A drain electrode layer 720P is electrically connected to the n-type oxide semiconductor layer 200P of a portion covering an apex part of the isolation insulating layer 500P. Note that the drain electrode layer 720P and the n-type oxide semiconductor layer 200P may be electrically connected in a portion other than the portion covering the apex part of the isolation insulating layer 500P.

Next, a method of manufacturing the TFET 10P is described.

Figure 44:
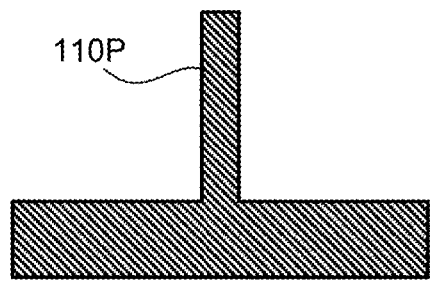
FIG. 44 is a diagram describing a method of manufacturing the TFET in the seventeenth embodiment of the present invention.

FIG. 44 to FIG. 48 are drawings describing a method of manufacturing the TFET in the seventeenth embodiment of the present invention. These drawings correspond to a sectional structure of the region A1 depicted in FIG. 42 (sectional structure along the cutting line Gc1-Gc2). First, the p-type group IV semiconductor layer 110P is processed into a fin shape (FIG. 44). Next, the isolation insulating layer 500P is deposited, and the isolation insulating layer 500P is removed so that the apex part of the p-type group IV semiconductor layer 110P is exposed in the region A1 except a source-drain side and its surroundings (FIG. 45).

Figure 47:
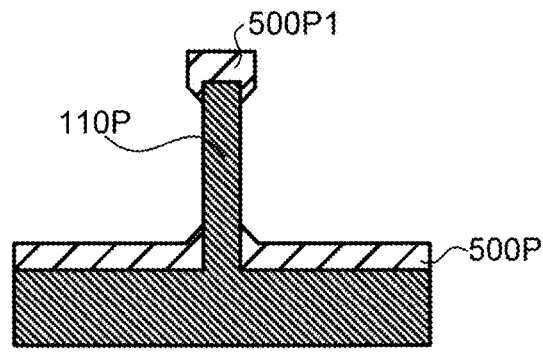
FIG. 47 is a diagram describing the method of manufacturing the TFET in the seventeenth embodiment of the present invention.

Next, the isolation insulating layer 500P1 is formed of a thermal oxide film at the exposed apex part of the p-type group IV semiconductor layer 110P (FIG. 46). Next, the isolation insulating layer 500P is removed so that part of both surfaces in the fin-shaped portion of the p-type group IV semiconductor layer 110P (region which will serve as the heterojunction part 900P) is exposed (FIG. 47). Here, the surfaces of the p-type group IV semiconductor layer 110P other than the fin-shaped portion are processed so that the isolation insulating layer 500P remains. In this example, the isolation insulating layer 500P is once removed even in the portions other than the fins-shaped portion and the isolation insulating layer 500P is again deposited on only required portions.

Figure 48:
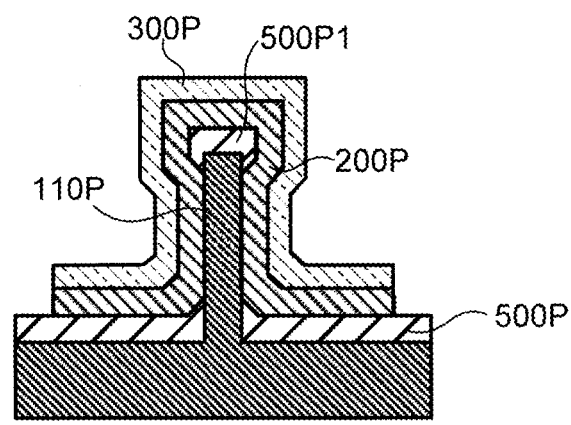
FIG. 48 is a diagram describing the method of manufacturing the TFET in the seventeenth embodiment of the present invention.

Next, the n-type oxide semiconductor layer 200P and the gate insulating layer 300P are sequentially formed (FIG. 48). Then, the gate electrode layer 400P is formed (FIGS. 43A, 43B, 43C, 43D, and 43E). Then, the source electrode layer 710P is formed so as to be electrically connected to the p-type group IV semiconductor layer 110P, and the drain electrode layer 720P is formed so as to be electrically connected to the n-type oxide semiconductor layer 200P.

Eighteenth Embodiment

In an eighteenth embodiment, a Pch TFET 10Q to which the shape of a fin-shaped transistor is applied is described.

Figure 49:
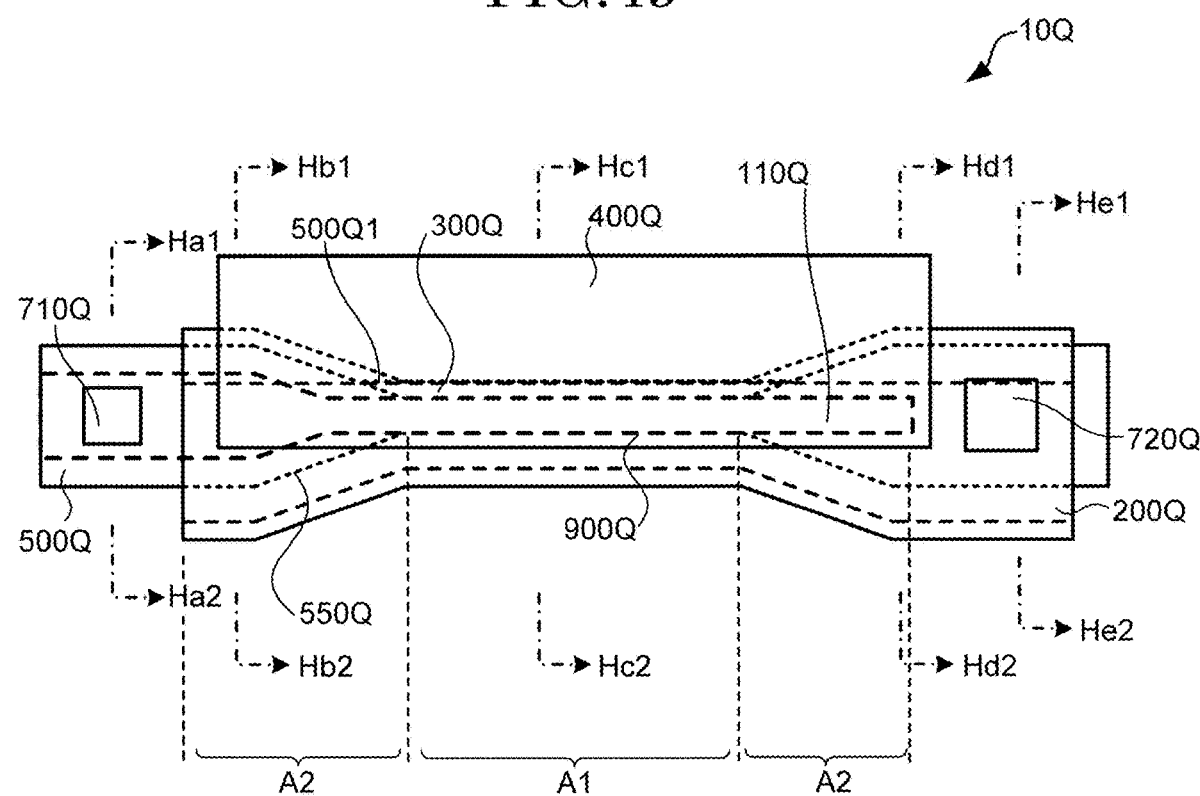
FIG. 49 is a top view depicting the structure of a TFET in an eighteenth embodiment of the present invention.
Figure 50:
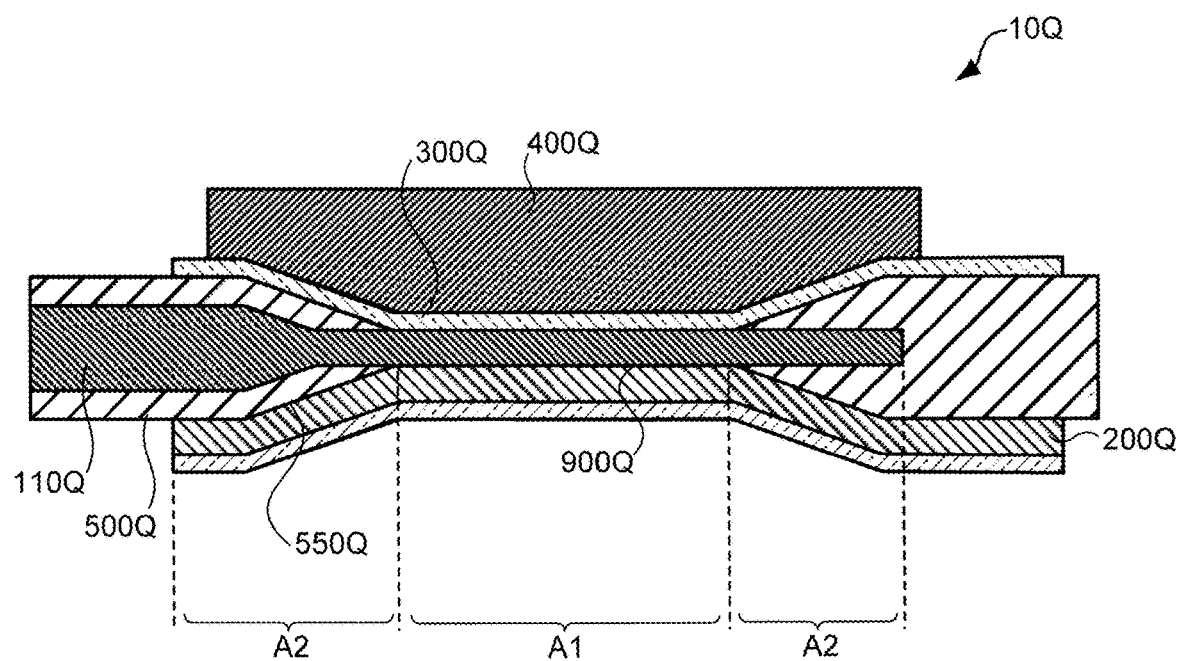
FIG. 50 is a horizontal sectional view depicting the structure of the TFET in the eighteenth embodiment of the present invention.

FIG. 49 is a top view depicting the structure of the TFET in the eighteenth embodiment of the present invention. FIG. 50 is a horizontal sectional view depicting the structure of the TFET in the eighteenth embodiment of the present invention. FIGS. 51A, 51B, 51C, 51D, and 51E depict vertical sectional views depicting the structure of the TFET in the eighteenth embodiment of the present invention. FIGS. 51A, 51B, 51C, 51D, and 51E correspond to sectional views along a cutting line Ha1-Ha2, a cutting line Hb1-Hb2, a cutting line Hc1-Hc2, a cutting line Hd1-Hd2, and a cutting line He1-He2 in FIG. 49. FIG. 50 depicts a horizontal section of the TFET 10Q at a half of the height of a p-type group IV semiconductor layer 110Q formed in a fin shape.

The p-type group IV semiconductor layer 110Q is formed to extend vertically on the substrate surface. A portion to which a source electrode layer 710Q is connected is formed in a shape with a width wider than the other portions. That is, because the TFET 10Q is of Pch, the portion corresponding to the region A1 is required to be thinner than the case of the Nch TFET 10P. An isolation insulating layer 500Q is arranged so as to cover the p-type group IV semiconductor layer 110Q. In a part (region A1) of the isolation insulating layer 500Q, a junction opening 550Q is formed, and part of both surfaces of the p-type group IV semiconductor layer 110Q is exposed. The structure described so far is similar to that of the TFET 10P in the seventeenth embodiment.

Further outside, an n-type oxide semiconductor layer 200Q is arranged on only one side of the p-type group IV semiconductor layer 110Q. Thus, a heterojunction with the n-type oxide semiconductor layer 200Q is realized only on one side of the p-type group IV semiconductor layer 110Q so as to correspond to the position of the junction opening 550Q. Therefore, a heterojunction part 900Q is arranged on one surface of the p-type group IV semiconductor layer 110Q.

Further outside of the n-type oxide semiconductor layer 200Q, a gate insulating layer 300Q is arranged. Further outside a gate electrode layer 400Q is arranged. The gate insulating layer 300Q is arranged with respect to at least the p-type group IV semiconductor layer 110Q so as to close a junction opening 550Q on a side opposite to the side where the n-type oxide semiconductor layer 200Q is arranged, and makes contact with the p-type group IV semiconductor layer 110Q. The gate electrode layer 400Q is arranged with respect to the p-type group IV semiconductor layer 110Q on a side opposite to the side where the n-type oxide semiconductor layer 200Q is arranged. That is, in the region A1, the gate insulating layer 300Q is interposed between the gate electrode layer 400Q and the p-type group IV semiconductor layer 110Q.

Figure 51A:
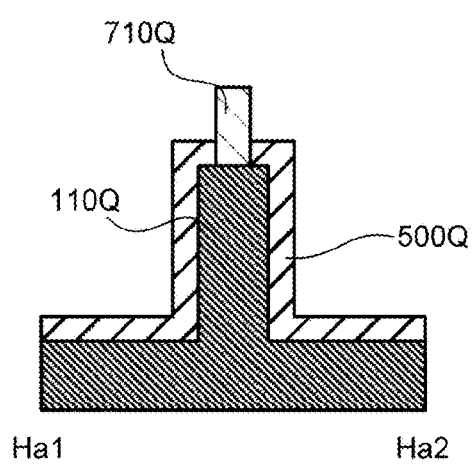
FIGS. 51A, 51B, 51C, 51D, and 51E depict vertical sectional views depicting the structure of the TFET in the eighteenth embodiment of the present invention.
Figure 51B:
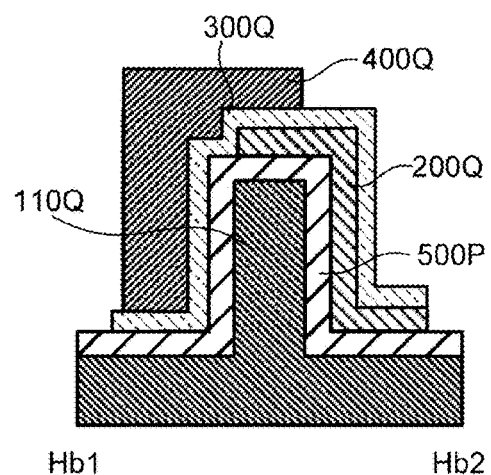
Figure 51C:
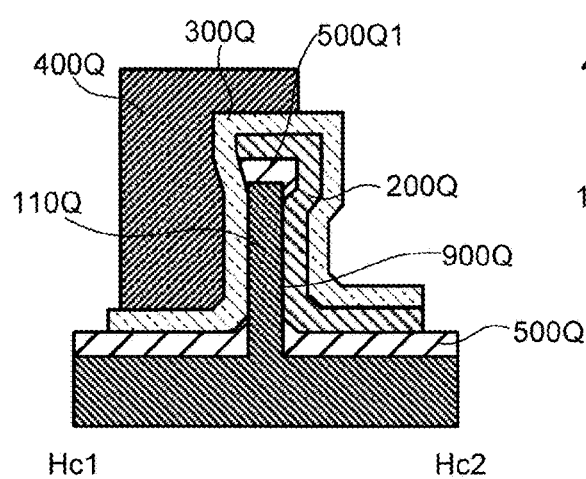
Figure 51D:
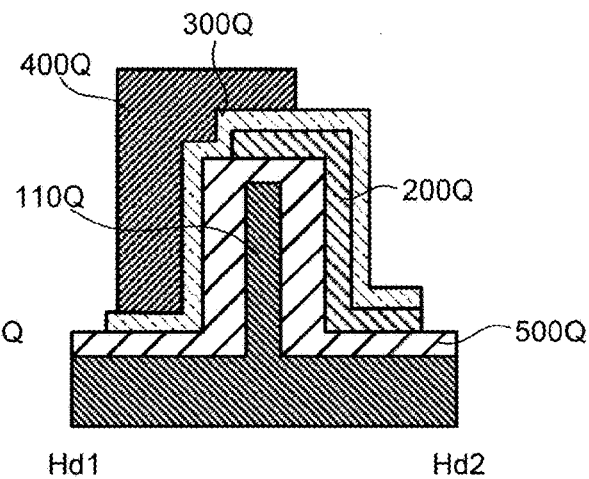
Figure 51E:
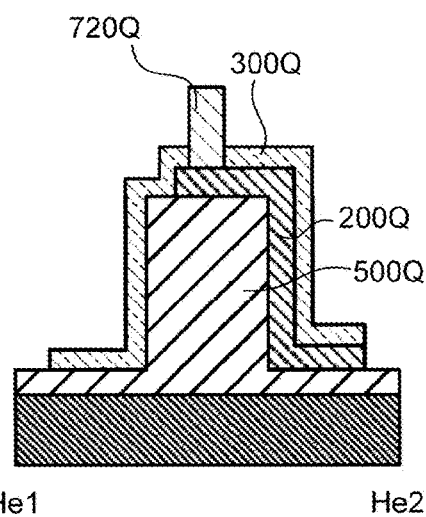

In a sectional structure (sectional structure along the cutting line Hc1-Hc2) of the region A1 depicted in FIG. 51C, an isolation insulating layer 500Q1 is arranged at an apex part of the p-type group IV semiconductor layer 110Q. Therefore, when viewed perpendicularly with respect to the plane of the heterojunction part 900Q, the heterojunction part 900Q is a region surrounded by the isolation insulating layers 500Q and 500Q1.

The source electrode layer 710Q is electrically connected at the apex part of the p-type group IV semiconductor layer 110Q. Note that the source electrode layer 710Q may be electrically connected in a region other than the fin-shaped portion in the p-type group IV semiconductor layer 110Q.

A drain electrode layer 720Q is electrically connected to the n-type oxide semiconductor layer 200Q of a portion covering an apex part of the isolation insulating layer 500Q. Note that the drain electrode layer 720Q and the n-type oxide semiconductor layer 200Q may be electrically connected in a portion other than the portion covering the apex part of the isolation insulating layer 500Q.

In the above, various embodiments of the tunneling field effect transistor have been described.

Simulation Results and Demonstration Experiments

As a combination of new material systems realizing a Type-II energy band structure, a novel stacked tunneling field effect transistor (TFET) with an oxide semiconductor and a group IV semiconductor combined together is proposed. By using a TCAD simulation, a potential as a steep switching (Steep-slope) transistor was examined. Furthermore, operation demonstrations of TFETs having an n-ZnO/p-Si tunnel junction or an n-ZnO/p-Ge tunnel junction, and a ZnO channel structure without a material junction from a tunnel junction to the drain electrode were performed for the first time. By appropriate control of impurity concentration and gate stack structure control, an ON/OFF current ratio exceeding $10^8$ at maximum in the TFETs and a minimum SS value up to 71 mV/dec. were achieved.

[1. Introduction]

A stacked tunneling field effect transistor (TFET) having a tunnel in a direction perpendicular to the gate has an ideal structure which can achieve a sub-threshold swing (SS value) that is ultimately small and is as close to zero as can be. This is because the density of state (DOS) in the source and the channel can be efficiently and uniformly controlled with the gate voltage over the entire tunnel junction.

In addition, in the stacked TFET, a large ON current can also be expected to be realized, due to the large tunnel junction area and the short tunneling distance. The tunneling distance can be controlled by the thickness of the upper channel.

However, examples realizing this concept are extremely limited. For example, when a single material is used, a large band gap inhibits an increase in ON current. In the case of a heterojunction using a III-V material, the material may have a small band gap, and the ON/OFF current ratio is decreased.

To overcome these intrinsic difficulties, this study newly proposes a novel tunnel junction with an oxide semiconductor and a group IV semiconductor such as Si, Ge, or SiGe jointed together (FIGS. 52A, 52B, and 52C).

FIG. 52A depicts a device structure conceptional diagram, and FIG. 52B an energy band diagrams in an OFF state and FIG. 52C that in an ON state in an oxide semiconductor group IV semiconductor stacked tunneling field effect transistor. In this combination of materials, a Type-II energy band structure with a small effective energy barrier height ($E_{b\text{-}eff} = E_{c\text{-}OS} - E_{v\text{-}IV}$, which is defined by an energy difference between the conduction band edge of the oxide semiconductor and the valence band edge of the group IV semiconductor) is realized. This is effective in increasing the ON current. Also, since the material band gap itself is large, a decrease in OFF current can also be simultaneously achieved.

In addition, $E_{b\text{-}eff}$ can be continuously controlled by controlling the combination and composition of materials (FIG. 53).

FIG. 53 depicts a summary of material candidates. A band-to-band tunnel occurs from the valence band of the p-type group IV semiconductor to the conduction band of the n-type oxide semiconductor. In parentheses, a relative permittivity of each material is indicated. Actually, the conduction band edge of an oxide semiconductor such as ZnO, $In_2O_3$, and $SnO_2$ is low and the valence band edge of Si and Ge is high. In addition, oxide semiconductors have a strong tendency to exhibit n-type conduction. Thus, a portion from the tunnel junction to the drain can be formed without a material junction, and current leakage, which tends to be induced by electric field concentration of the drain edge, can be suppressed.

Thus, in this study, advantages of the proposed stacked TFET using the oxide semiconductor group IV semiconductor are first clarified by using a TCAD simulation, indicating guidelines for device designing.

[2. Oxide Semiconductor/SiGe Stacked TFET]

First, influences of $E_{b\text{-}eff}$ of the type-II energy band structure on tunnel characteristics were investigated. By using the oxide semiconductor group IV semiconductor, $E_{b\text{-}eff}$ can be continuously adjusted. Here, the $E_{v\text{-}IV}$ position in the case of a SiGe source and the effective mass of light holes were found by linear interpolation with the values of Si and Ge (FIGS. 54A and 54B).

Figure 54A:
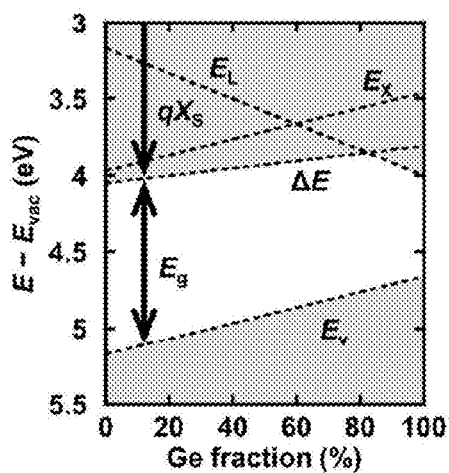
FIG. 54A depicts an energy band structure of SiGe and FIG. 54B depicts reduced effective masses of a band-to-band tunnel.
Figure 54B:
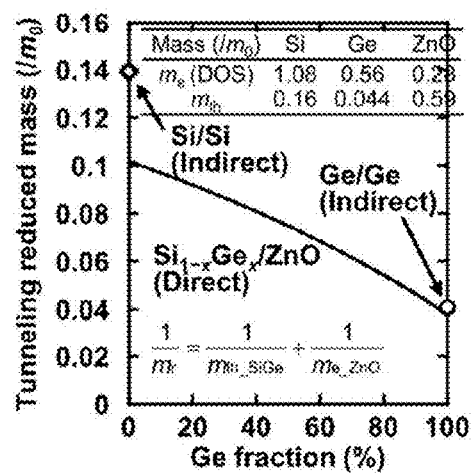
Figure 55:
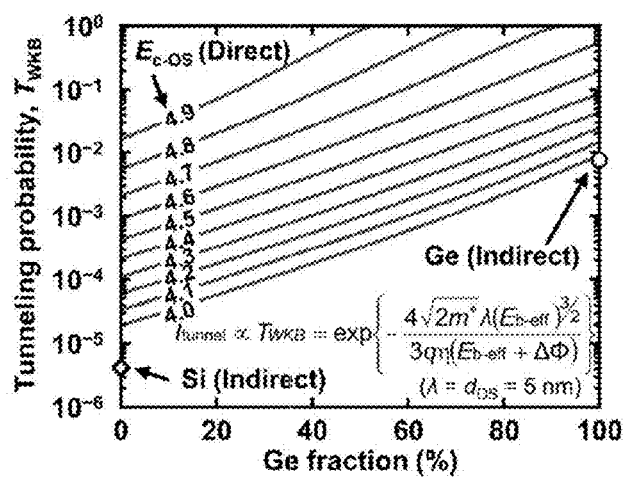
FIG. 55 depicts Ge concentration dependency of WKB tunneling probability in an n-ZnO/p-SiGe tunnel junction.

FIG. 54A depicts an energy band structure of SiGe and FIG. 54B depicts reduced effective masses of a band-to-band tunnel. FIG. 55 depicts Ge concentration dependency of WKB tunneling probability in an n-ZnO/p-SiGe tunnel junction. FIG. 55 is a drawing in which tunneling probability ($T_{WKB}$) using the WKB approximation is depicted by changing $E_{c\text{-}OS}$ and setting the horizontal axis as the Ge composition in the SiGe source. Here, for simplification, it is assumed that only the energy band of the oxide semiconductor is modulated by a gate voltage $V_g$.

A schematic view of an energy band structure is depicted in FIG. 52C. The $E_{c\text{-}OS}$ position is lowered by the oxide semiconductor or the $E_{v\text{-}IV}$ position in the group IV semiconductor is raised, thereby decreasing $E_{b\text{-}eff}$. From this, it can be found that $T_{WKB}$ is exponentially increasing. Here, since ZnO is a direct-transition semiconductor, tunneling from p-Si or Ge to n-ZnO corresponds to a direct transition process at the Γ point, and therefore changes of momentum are not taken into consideration.

From the above, after an oxide semiconductor suitable for the electronic device is selected, the Ge composition is changed by using SiGe technology, thereby allowing the energy band structure to be optimally adjusted. As a result, the TFET performance can be expected to be enhanced.

[3. Structure Optimization Using TCAD Simulation]

Figure 56:
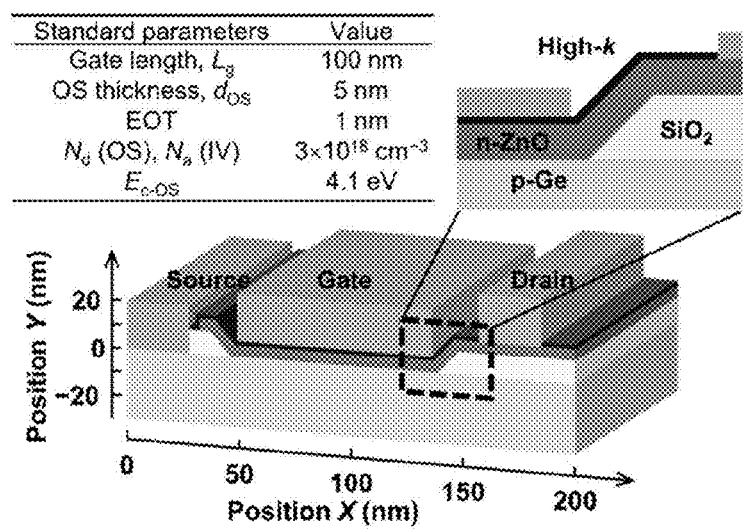
FIG. 56 depicts a schematic diagram of a three-dimensional device structure used in a TCAD simulation and main parameters.

FIG. 56 depicts a schematic diagram of a three-dimensional device structure used in a TCAD simulation and main parameters. By using a device structure depicted in FIG. 56, a Sentaurus TCAD simulation was performed on the stacked TFET using the oxide semiconductor group IV semiconductor. Sentaurus is a name of software. As for physical properties of the oxide semiconductor, values of ZnO were used, except the $E_{c\text{-}OS}$ position.

Figure 57A:
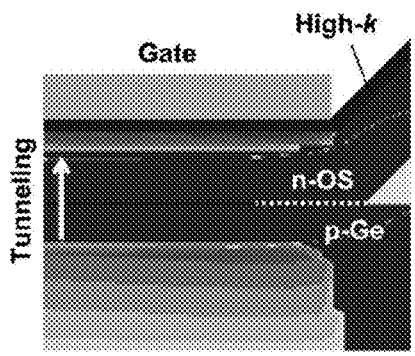
FIG. 57A depicts a two-dimensional image view of a band-to-band tunnel from the p-Ge source to the n-ZnO channel surface.
Figure 57B:
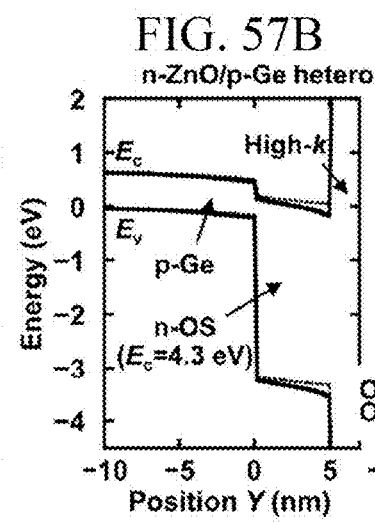
FIG. 57B depicts an energy band diagram in an n-ZnO/p-Ge tunnel junction and FIG. 57C depicts an energy band diagram in an n-Ge/p-Ge tunnel junction.
Figure 57C:
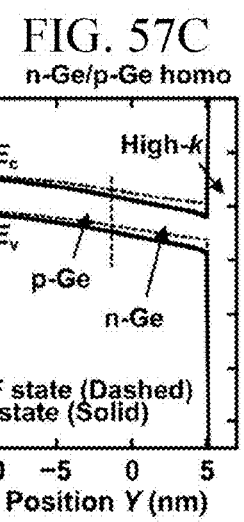

FIG. 57A depicts a two-dimensional image view of a band-to-band tunnel from the p-Ge source to the n-ZnO channel surface, and FIG. 57B depicts an energy band diagram in an n-ZnO/p-Ge tunnel junction and FIG. 57C depicts an energy band diagram in an n-Ge/p-Ge tunnel junction. As depicted in a two-dimensional image of the tunneling phenomenon of FIG. 57A, it can be found that, by applying $V_g$, a uniform tunnel is generated from a portion near the p-Ge surface toward the uppermost surface of the oxide semiconductor, that is, an interface between the High-k insulating film and the oxide semiconductor. This realizes ON/OFF switching having an SS value that is as close to zero as can be (FIG. 58).

In addition, in the case of an n-OS/p-Ge hetero tunnel junction, compared with the case of an n-Ge/p-Ge homo junction, the ON current is increased over two orders of magnitude. Here, it should be noted that an increase in ON current has been already realized in a state in which the $E_{c\text{-}OS}$ position of the oxide semiconductor is not much low. One factor for this is that the permittivity (c) of the oxide semiconductor is small compared with that of Ge (FIG. 57B). In this relative relation, the energy band of the oxide semiconductor is modulated with higher priority than Ge. Thus, an almost ideal energy band structure as depicted in FIG. 52C, with the tunneling distance suppressed to be short, is realized. Actually, most of oxide semiconductors have a smaller value than Si and Ge (FIG. 53).

Figure 58:
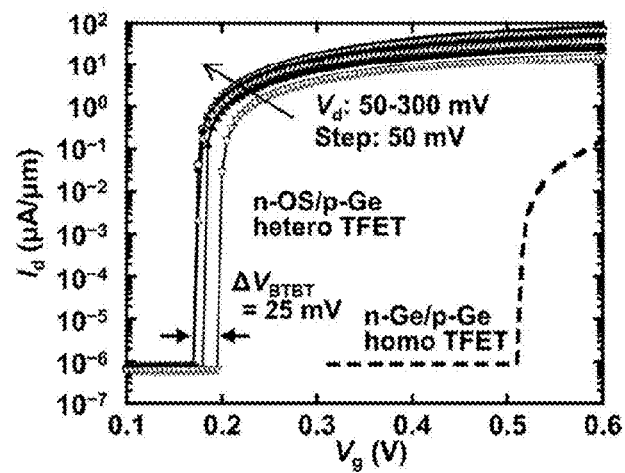
FIG. 58 depicts $I_d$-$V_g$ characteristics of an n-ZnO/p-Ge TFET acquired by a simulation.

FIG. 58 depicts $I_d$-$V_g$ characteristics of an n-ZnO/p-Ge TFET acquired by a simulation. With this effect, as depicted in the $I_d$-$V_g$ characteristics of FIG. 58, FET operation can be expected at a power supply voltage ($V_{dd}$) equal to or lower than 0.3 V. On the other hand, since the electrical conductivity of the oxide semiconductor is high, it is required to note that $V_{BTBT}$ (minimum $V_g$ at which a band-to-band tunnel occurs) is shifted due to the influences of the drain voltage.

Figure 59A:
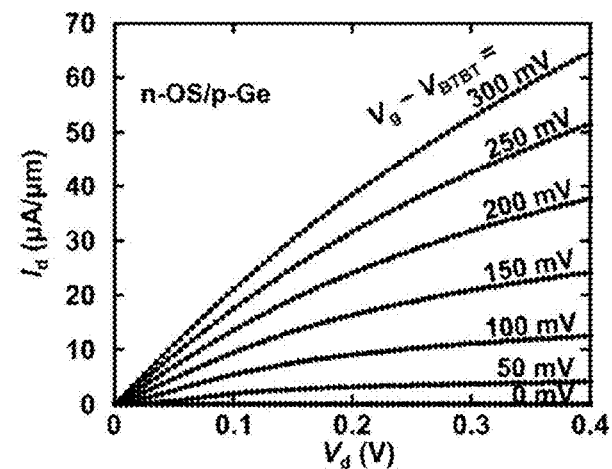
Figure 59B:
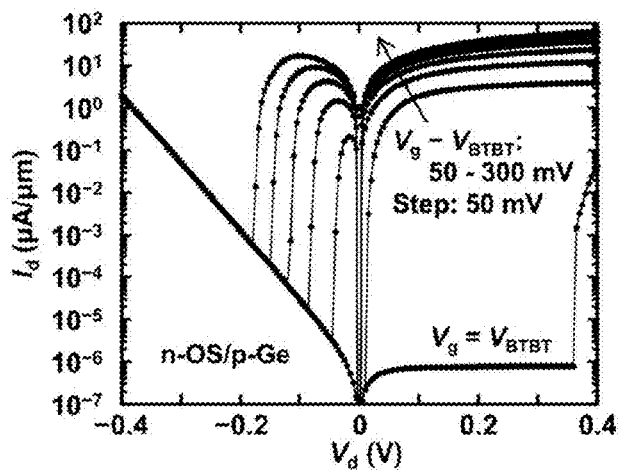

FIGS. 59A and 59B depict $I_d$-$V_d$ characteristics of the n-ZnO/p-Ge TFET acquired by a simulation, in which FIG. 59A is in linear notation and FIG. 59B is in logarithmic notation. Here, when $V_{dd}$ of 0.3 V operation is assumed, the ON current is expected to be approximately 70 µA/µm and the OFF current is expected to be up to 1 pA/µm. This holds great promise as a low-power-operation device or a low-standby-power device of the 3 nm-node generation (FIG. 59A). Also, in an $I_d$-$V_d$ graph with the logarithmic axis (FIG. 59B), negative differential resistance (NDR) is observed in a negative $V_d$ region. This is a feature of the electronic device operating by the quantum tunneling effect.

Figures 60A, 60B:
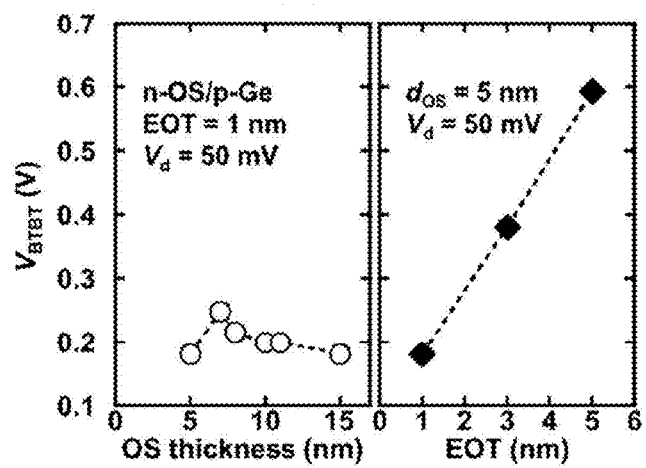
FIG. 60A depicts influences by the film thickness of an oxide semiconductor and FIG. 60B depicts influences by its EOT (equivalent oxide thickness) on $V_{BTBT}$ of an n-OS (oxide semiconductor)p-Ge TFET.
Figures 61A, 61B:
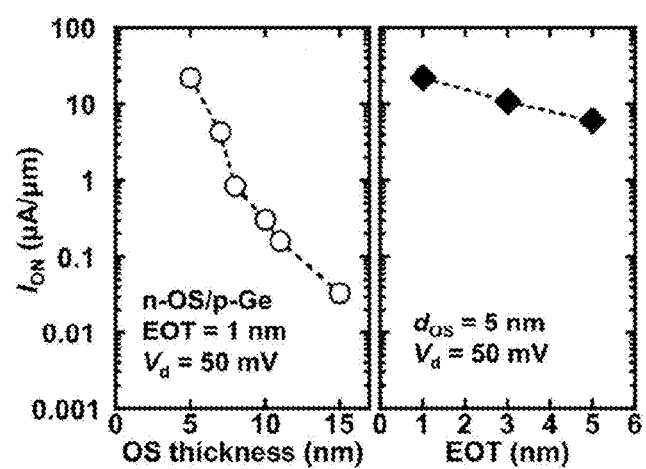
FIG. 61A depicts influences by the film thickness of the oxide semiconductor and FIG. 61B its EOT on an ON current of the n-OS/p-Ge TFET.

FIG. 60A depicts influences by the film thickness of the oxide semiconductor and FIG. 60B depicts influences by its EOT on $V_{BTBT}$ of an n-OS/p-Ge TFET. FIG. 61A depicts influences by the film thickness of the oxide semiconductor and FIG. 61B its EOT on an ON current of the n-OS/p-Ge TFET. As one structure parameter of the stacked TFET, influences of the thickness ($d_{OS}$) of the oxide semiconductor and its EOT were investigated. $V_{BTBT}$, that is, a voltage at which a band-to-band tunnel is started to occur, is determined by the $E_{c\text{-}OS}$ position on the uppermost surface of the oxide semiconductor. Since the $E_{c\text{-}OS}$ position on the surface of the oxide is directly controlled by $V_g$, a change in $V_{BTBT}$ by $d_{OS}$ is small. By contrast, the influences of EOT is large (FIGS. 60A and 60B). On the other hand, $d_{OS}$ strongly influences the tunneling probability. As $d_{OS}$ increases, the ON current (current value when $V_g$ is $V_{BT\text{-}BT}$+0.3 V) exponentially decreases (FIGS. 61A and 61B).

As described first, the most advantageous point of the oxide semiconductor group IV semiconductor heterojunction proposed in the present study is that $E_{b\text{-}eff}$ can be freely adjusted by the energy position relation between $E_{c\text{-}OS}$ of the oxide semiconductor and $E_{v\text{-}IV}$ of the group IV semiconductor. Thus, changes in ON current when the source materials (Si, SiGe, and Ge) are combined with various oxide semiconductors with different $E_{c\text{-}OS}$ positions were systematically investigated (FIG. 62).

Figure 62:
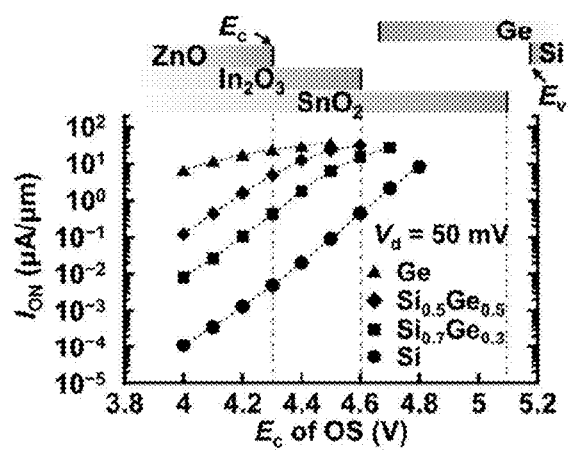
FIG. 62 depicts a relation between an ON current and an $E_{c\text{-}OS}$ position of the oxide semiconductor in TFETs having Si, SiGe, and Ge sources.

FIG. 62 depicts a relation between an ON current and an $E_{c\text{-}OS}$ position of the oxide semiconductor in TFETs having Si, SiGe, and Ge sources. For example, the ON current dramatically increases only by slightly changing the $E_{v\text{-}iv}$ position by using $Si_{0.7}Ge_{0.3}$ that have been already used in Si technology. On the other hand, as described above, large permittivity of Ge or SiGe with high Ge composition is effective in keeping the tunneling distance short, and is also effective in decreasing the SS value.

For example, an average SS value over the entire operation range when the minimum SS value near $V_{BTBT}$ is as close to zero as can be and 0.3 V operation is assumed can be expected to have a value below 60 mV/dec. (FIGS. 63A and 63B).

Figure 63A:
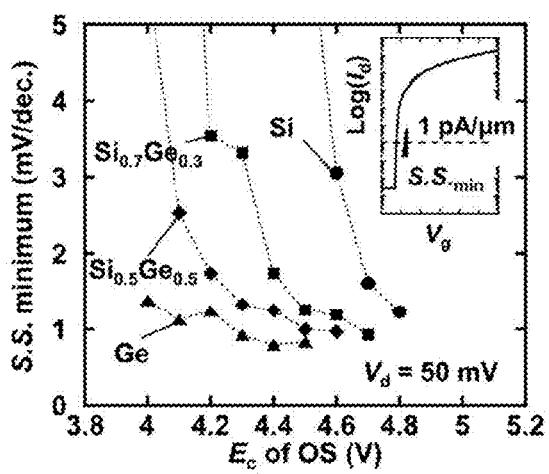
FIG. 63A depicts a relation between a minimum SS (sub-threshold swing) value and the $E_{c\text{-}OS}$ position of the oxide semiconductor in the TFETs having Si, SiGe, and Ge sources
Figure 63B:
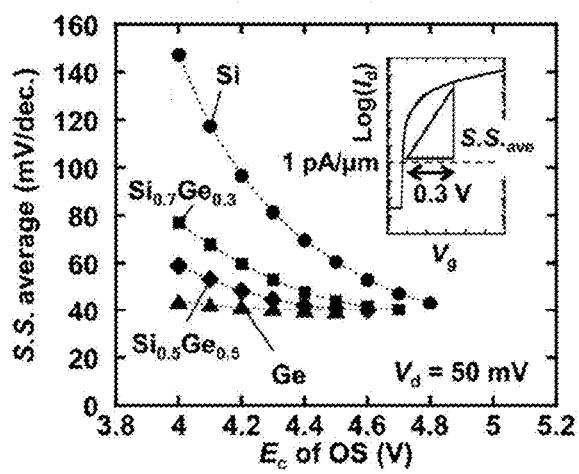
FIG. 63B depicts a relation between an average SS value and the above-described position. As the minimum SS value, a value acquired near a current value of 1 pA/μm is used. As the average SS value, a value when a $V_g$ sweep width of 0.3 V from the current value of 1 pA/μm is assumed is used.

FIG. 63A depicts a relation between a minimum SS value and the $E_{c\text{-}OS}$ position of the oxide semiconductor in the TFETs having Si, SiGe, and Ge sources and FIG. 63B depicts a relation between an average SS value and the above-described position. As the minimum SS value, a value acquired near a current value of 1 pA/µm is indicated in the drawing. As the average SS value, a value when a $V_g$ sweep width of 0.3 V from the current value of 1 pA/µm is assumed is used.

Next, influences of impurity concentration in the source or channel are discussed.

Figure 64:
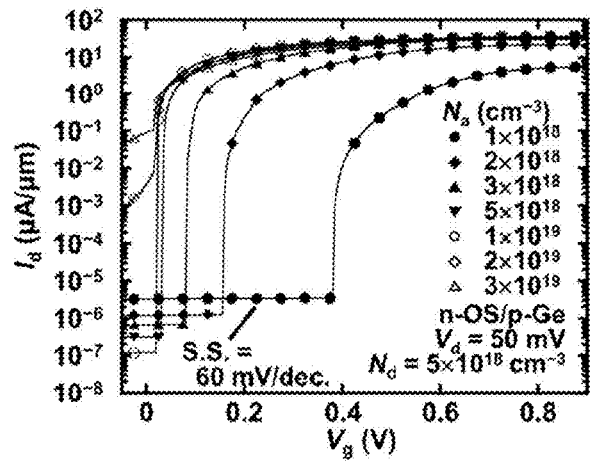
FIG. 64 depicts $I_d$-$V_g$ characteristics when various impurity concentrations ($N_a$) in Ge are assumed. The impurity concentration ($N_d$) in the oxide semiconductor is set as $5 \times 10^{18}$ cm$^{-3}$.
Figure 65A:
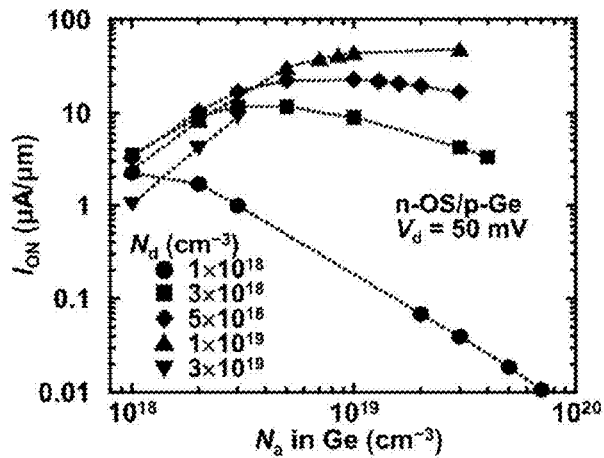
FIG. 65A depicts a relation between an ON current and the impurity concentration ($N_a$) in Ge and FIG. 65B depicts a relation between an ON/OFF current ratio and impurity concentration ($N_a$) in Ge when various impurity concentrations ($N_d$) in the oxide semiconductor are assumed.
Figure 65B:
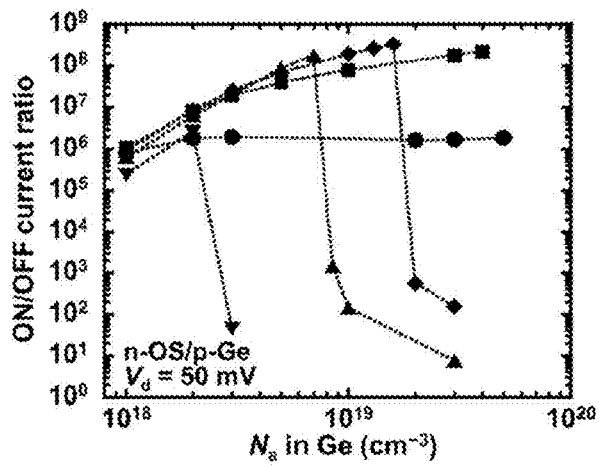

FIG. 64 depicts $I_d$-$V_g$ characteristics when various impurity concentrations ($N_a$) in Ge are assumed. The impurity concentration ($N_d$) in the oxide semiconductor is set as $5\times10^{18}$ $cm^{-3}$. FIG. 65A depicts a relation between an ON current and the impurity concentration ($N_a$) in Ge and FIG. 65B depicts a relation between an ON/OFF current ratio and impurity concentration ($N_a$) in Ge when various impurity concentrations ($N_d$) in the oxide semiconductor are assumed. The impurity concentration in each region influences a curve of a band near the tunnel junction (FIG. 64). It can be found that, for a combination of the impurity concentration ($N_d$) in the channel and the impurity concentration ($N_a$) in the source, an optimum value is present for realizing high ON current and a large ON/OFF current ratio (FIGS. 65A and 65B).

When the impurity concentration is low, the depletion layer extends further. Thus, the tunneling distance increases, and the ON current decreases. By contrast, when $N_d$ or $N_a$ is very high, channel-source overlapping of density of states cannot be solved by the gate bias, a sufficiently small OFF current cannot be realized.

Also, influences of an interface trap density (Dit) of the interface of a high-k/oxide semiconductor were investigated, and it can be found that the present device has an exceptionally high tolerance for Dit.

Figure 66:
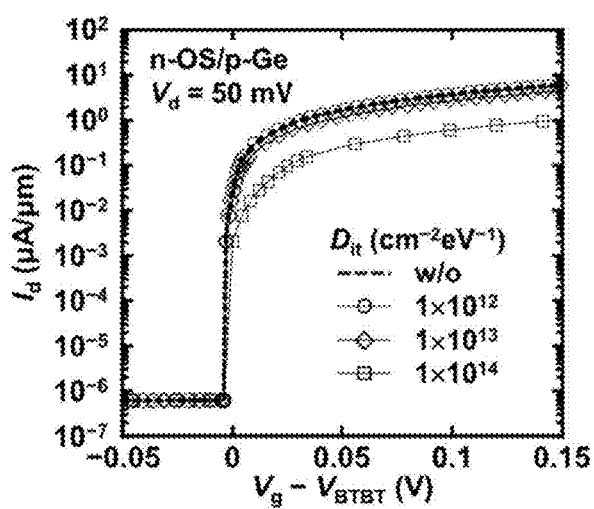
FIG. 66 depicts influences given by an interface state to deterioration in $I_d$-$V_g$ characteristics. An interface trap density (Dit) uniformly distributed is assumed.

FIG. 66 depicts influences given by the interface state to deterioration in $I_d$-$V_g$ characteristics. An interface trap density (Dit) equally distributed is assumed. The reason for this can be thought that energy band modulation in a $V_g$ operation range required for changes in ON/OFF current is extremely low and the charge trap amount to the interface state is extremely small (FIG. 66).

From the above-described TCAD simulation results, it has become evident that by the stacked TFET having the type-II energy band structure using the oxide semiconductor-group IV semiconductor proposed in this study, ideal characteristics can be acquired, such as high ON current (up to 70 µ/Aµm), small OFF current (<1 pA/µm), a small average SS value (up to 40 mV/dec.), and so forth in a small operating voltage $V_{dd}$ of 0.3 V.

[4. Demonstration of ZnO(Si, Ge) TFET]

Figure 67:
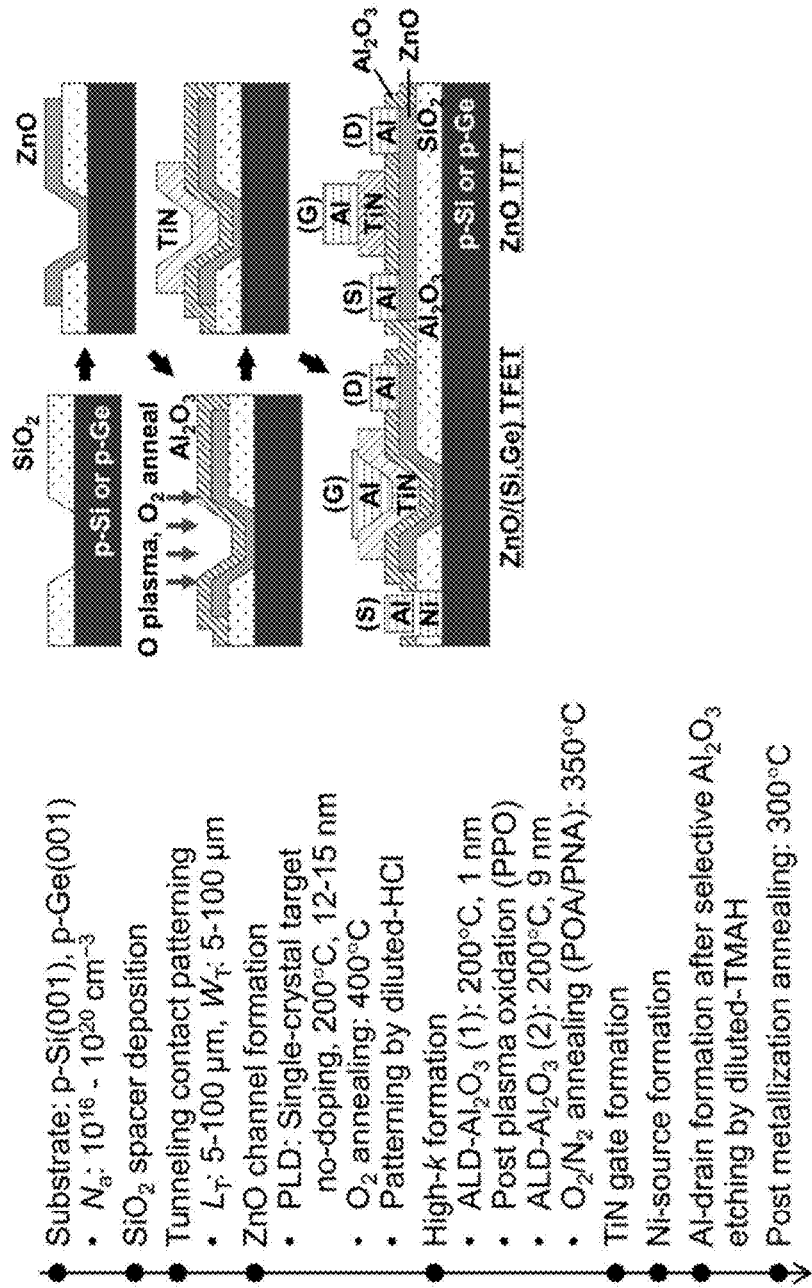
FIG. 67 is a process flow of fabricating n-ZnO/p-(Si or Ge) TFET devices. A ZnO film without addition of impurities is formed by pulse laser deposition (PLD), and EOT of the gate insulating film is 5.8 nm. To experimentally verify TFET operation, a top-gate thin-film transistor (TFT) is also fabricated on the same chip.

FIG. 67 is a process flow of fabricating n-ZnO/p-(Si or Ge) TFET devices. A ZnO film without addition of impurities is formed by pulse laser deposition (PLD), and EOT of the gate insulating film is 5.8 nm. To experimentally verify TFET operation, a top-gate thin-film transistor (TFT) is also fabricated on the same chip. By following the procedure depicted in FIG. 67 and using pulse laser deposition (PLD), a non-doped ZnO layer was deposited to fabricate an n-ZnO/p-(Si or Ge) TFET. Here, it is known that interstitial Zn in ZnO and a point defect such as an oxygen hole act as a donor of an n-type semiconductor. The carrier density of a film actually deposited was assumed on the order of $10^{18}$ cm$^{-3}$.

After ZnO is subjected to patterning, an $Al_2O_3$ gate insulating film was formed by atomic layer deposition (ALD). In midstream, to improve $Al_2O_3$/ZnO interface characteristics, Post Plasma Oxidation (PPO) or Post $O_2/N_2$ Annealing (POA/PNA) were performed. Lastly, a TiN gate, a Ni source contact, and an Al drain contact were formed, and PMA at 300° C. was performed.

Figure 68:
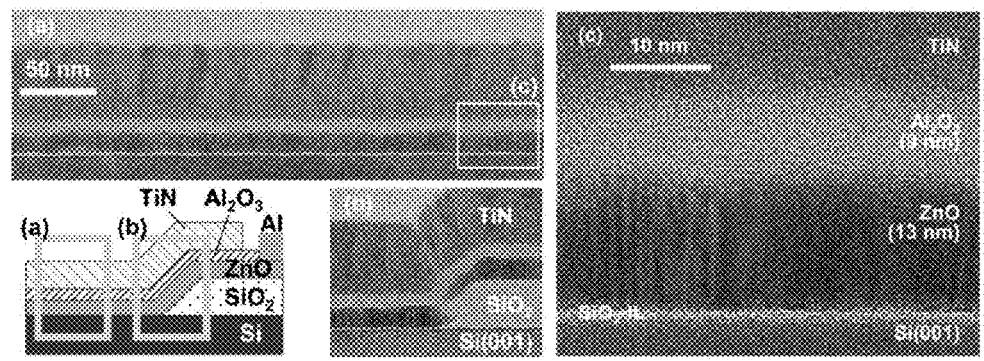
FIG. 68 depicts an image of cross-sectional transmission electron microscopy (XTEM) of an n-ZnO/p-Si TFET. Formation of a columnar polycrystal ZnO and a SiO$_2$ interface layer having a film thickness of approximately 1.5 nm in ZnO/Si are also observed.
Figure 69:
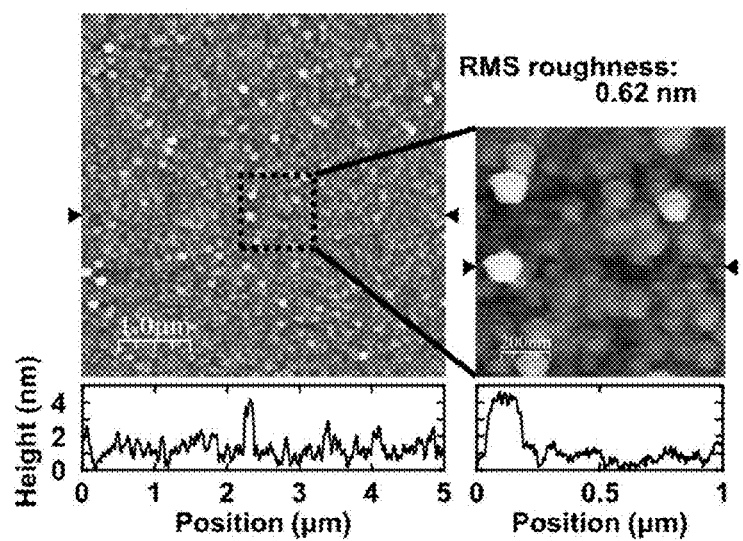
FIG. 69 depicts an image of atomic force microscopy (AFM) of a ZnO/Si surface, depicting results after O$_2$ annealing at 400° C.
Figure 70:
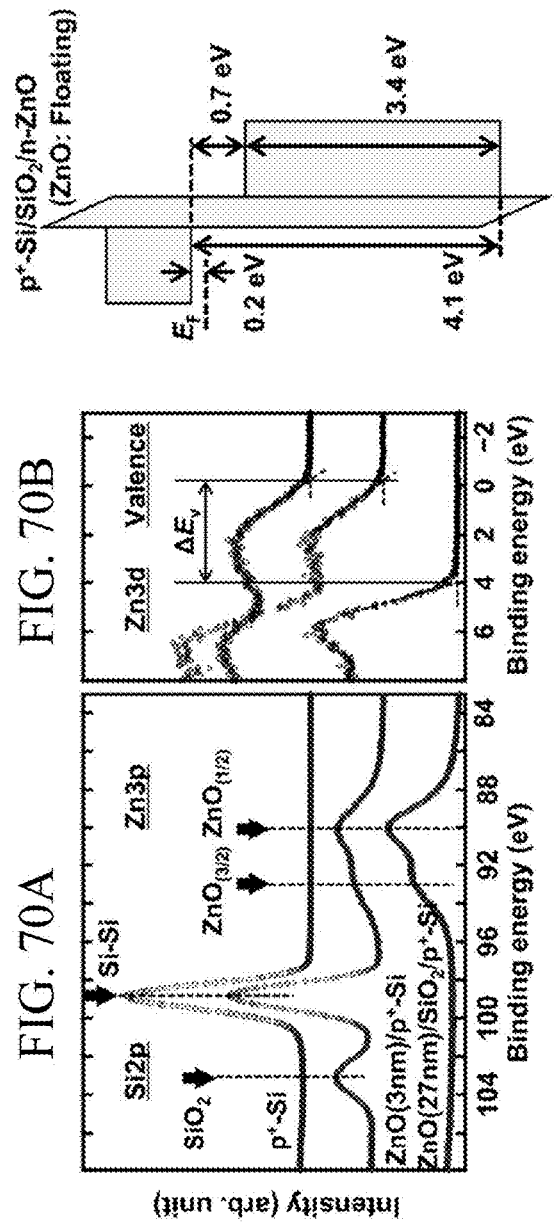
FIG. 70A depicts X-ray photoelectron spectra of Si2p and Zn3p.
FIG. 70B depicts X-ray photoelectron spectra at a valence band edge, and, furthermore.
FIG. 70C depicts energy band structure of an acquired n-ZnO/SiO$_2$ interface layer/p-Si stacked structure.

FIG. 68 depicts an image of cross-sectional transmission electron microscopy (XTEM) of an n-ZnO/p-Si TFET. Formation of a columnar polycrystal ZnO and a $SiO_2$ interface layer having a film thickness of approximately 1.5 nm in ZnO/Si are also observed. FIG. 69 depicts an image of atomic force microscopy (AFM) of a ZnO/Si surface, depicting results after $O_2$ annealing at 400° C. FIG. 70A depicts X-ray photoelectron spectra of Si2p and Zn3p, FIG. 70B depicts X-ray photoelectron spectra at a valence band edge, and, furthermore, FIG. 70C depicts energy band structure of an acquired n-ZnO/SiO$_2$ interface layer/p-Si stacked structure.

From the high-resolution cross-sectional TEM image of FIG. 68, it can be found that a relatively flat stacked structure of ZnO and $Al_2O_3$ films is formed. On the other hand, an unintended $SiO_2$ interface layer having a film thickness of approximately 1.5 nm is formed on an ZnO/Si interface. Furthermore, the ZnO film forms a columnar polycrystal structure. The crystal particle diameter is approximately 20 nm, which is farther smaller compared with the tunnel junction area. Surface roughness due to formation of the polycrystal structure is observed also on an AFM surface of ZnO/Si (FIG. 69). Also, the $SiO_2$ interface layer on the ZnO/Si interface can be confirmed also from XPS analysis (FIGS. 70A, 70B, and 70C).

When the energy band structure with ZnO being in an electrically non-contact state is evaluated, large band bending which crosses $SiO_2$ has possibly occurred, the $E_{c\text{-}OS}$ position of ZnO is positioned at lower energy than the $E_{v\text{-}IV}$ position of Si. This can be thought due to fixed charge or the interface dipole in the film, and can become a factor for a threshold shift of the TFET to a negative direction, which will be described further below.

Figure 71:
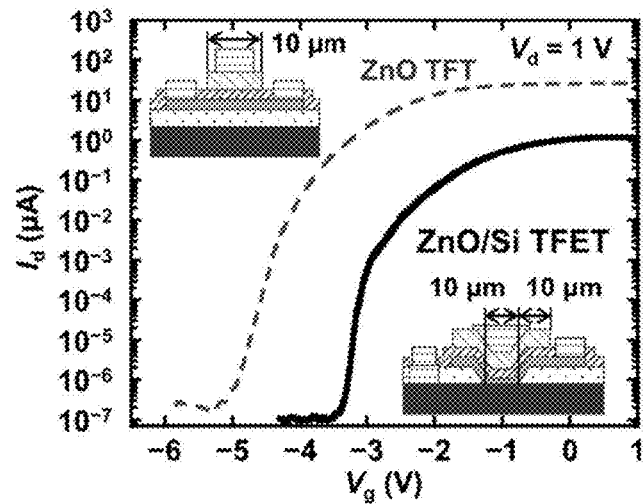
FIG. 71 depicts $I_d$-$V_d$ characteristics of devices illustrating first ZnO/Si TFET operation demonstration. Sectional views of device structures are depicted in the drawing.
Figure 72:
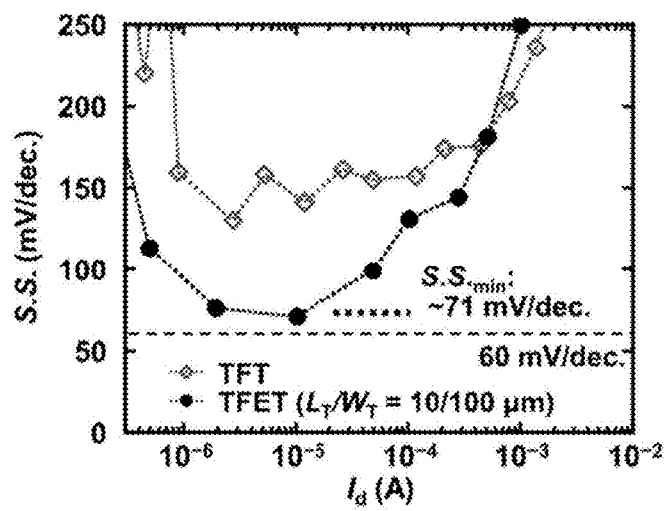
FIG. 72 depicts SS-$I_d$ characteristics of the TFET. A minimum SS value realized 71 mV/dec. By way of comparison, the results of a ZnO TFT are also depicted.
Figure 73:
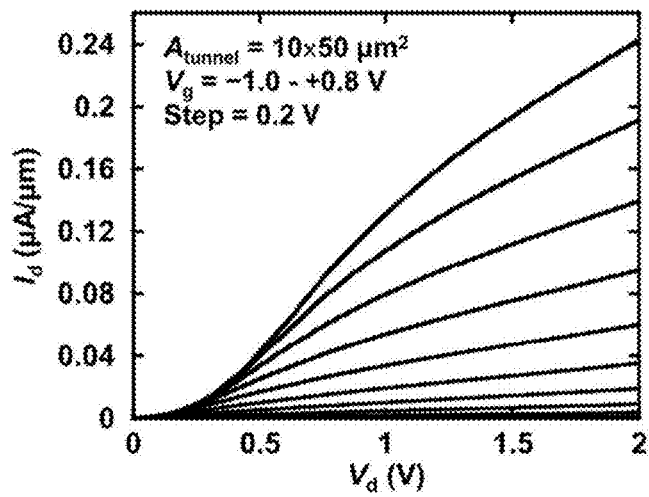
FIG. 73 depicts $I_d$-$V_d$ characteristics of the ZnO/Si TFET. The vertical axis is in linear notation.

FIG. 71 depicts $I_d$-$V_d$ characteristics of devices illustrating first ZnO/Si TFET operation demonstration. Sectional views of device structures are depicted in the drawing. FIG. 72 depicts SS-$I_d$ characteristics of the TFET. A minimum SS value achieved 71 mV/dec. By way of comparison, the results of a ZnO TFT are also depicted. FIG. 73 depicts $I_d$-$V_d$ characteristics of the ZnO/Si TFET. The vertical axis is in linear notation.

As depicted in FIG. 71, ZnO/Si TFET operation demonstrations have succeeded for the first time. Compared with the characteristics of a ZnO thin-film transistor (TFT) simultaneously fabricated in the same substrate, the threshold of the TFET is shifted to a positive $V_g$ direction, and the $I_d$ value is also low. These results both suggest that the current of the TFET is restricted also in the ZnO/Si tunnel. While the $I_d$ value itself is low, the OFF current is also extremely low, thereby achieving an exceptionally large ON/OFF current ratio. When the SS value is evaluated as depicted in FIG. 72, the SS value of the TFET is small compared with that of the TFT, achieving a minimum value of 71 mV/dec. at room temperature. In $I_d$-$V_d$ depicted in FIG. 73, favorable current cutoff is observed.

On the other hand, the ON current at this point in time is small compared with a value predicted in a TCAD simulation, and it can be thought that tunneling probability is restricted by the $SiO_2$ interface layer of the ZnO/Si interface.

Figure 74:
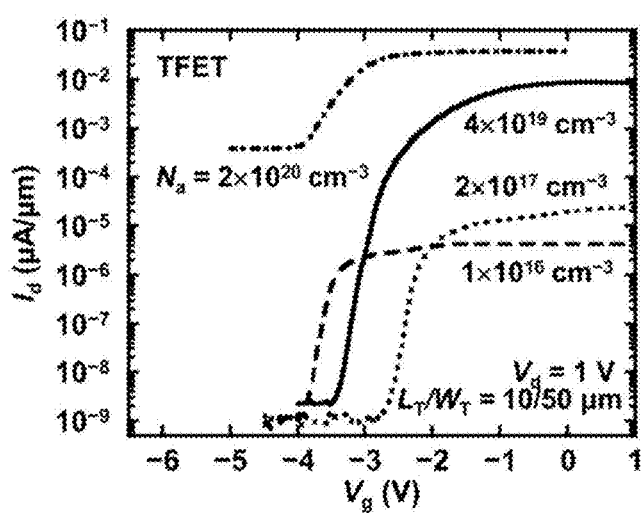
FIG. 74 depicts changes in $I_d$-$V_g$ characteristics depending on the impurity concentration in the Si source. It can be found that an impurity concentration of approximately $10^{19}$ cm$^{-3}$ is optimum for both of high ON current and ON/OFF current ratio.
Figure 75:
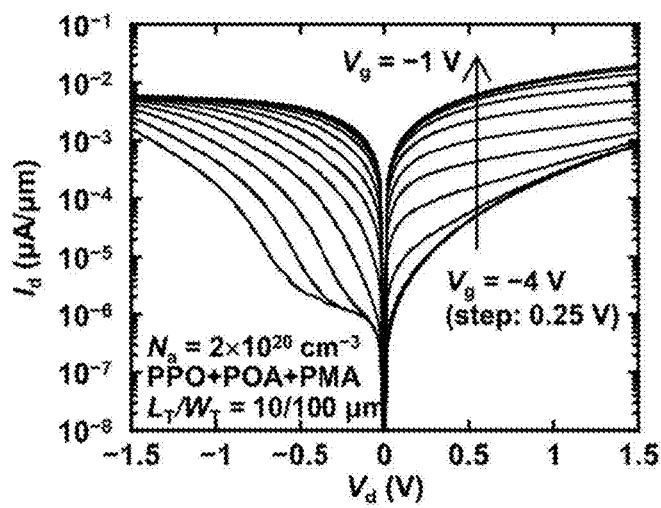
FIG. 75 depicts $I_d$-$V_d$ characteristics of the ZnO/Si TFET. The impurity concentration in Si is $2\times10^{20}$ cm$^{-3}$, and the vertical axis is in logarithmic notation. Characteristics suggesting negative differential resistance (NDR) can be observed.

FIG. 74 depicts changes in $I_d$-$V_g$ characteristics depending on the impurity concentration in the Si source. It can be found that an impurity concentration of approximately $10^{19}$ cm$^{-3}$ is optimum for both of high ON current and ON/OFF current ratio. FIG. 75 depicts $I_d$-$V_d$ characteristics of the ZnO/Si TFET. The impurity concentration in Si is $2\times10^{20}$ cm$^{-3}$, and the vertical axis is in logarithmic notation. Characteristics suggesting negative differential resistance (NDR) can be observed.

It can be found that influences of the impurity concentration ($N_a$) in the Si source given to the ON current is exceptionally large (FIG. 74). The ON current increases as the impurity concentration ($N_a$) in the Si source increases. This is because the tunneling distance of the ZnO/Si interface decreases as the impurity concentration ($N_a$) increases. However, in a situation in which the impurity concentration ($N_a$) exceeds $10^{20}$ cm$^{-3}$, overlapping of densities of states is exceptionally strong, and sufficient OFF state cannot be realized. However, in the $I_d$-$V_d$ characteristics of a device with an impurity concentration (Na) of $10^{20}$ cm$^{-3}$, current characteristics indicating NDR in a low $V_g$ (off-like) region was observed (FIG. 75). Any of these results supports that the fabricated device performs TFET operation as intended.

Figure 76:
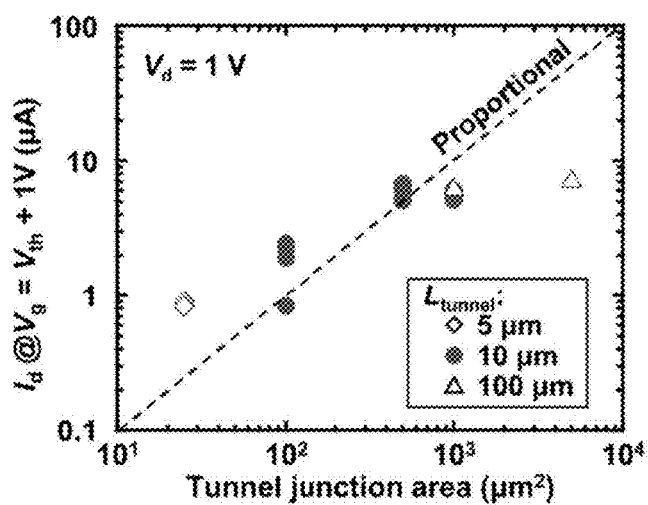
FIG. 76 depicts dependency of the ON current and a tunnel junction area in the ZnO/Si TFET.

FIG. 76 depicts dependency of the ON current and a tunnel junction area in the ZnO/Si TFET. A relation between the ON current and the tunnel junction area is studied, and it can be found that the ON current increases substantially in proportion to the area. Here, a threshold (Vth) was found from an intercept of the $I_d$-$V_g$ characteristics on the linear axis, and the ON current was set as $I_d$ when $V_g$=Vth+1 V (FIG. 76). Here, the results of devices with various ZnO/Si tunnel junction lengths and widths are depicted in the drawing. Also, as depicted in FIG. 71, a ZnO TFT on $SiO_2$ of device isolation is regarded as parasitic resistance. Therefore, the results of FIG. 76 also suggest that the ON current of the present device is surely controlled by a tunnel junction.

Figure 77:
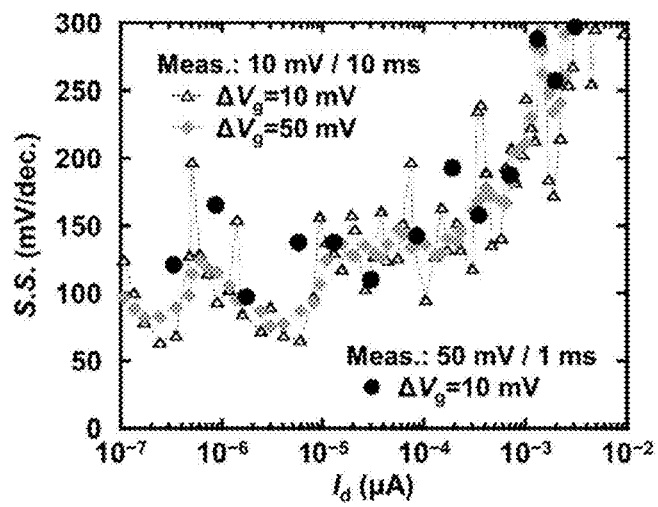
FIG. 77 depicts SS-$I_d$ characteristics of the ZnO/Si TFET acquired from various measurement conditions.

FIG. 77 depicts SS-$I_d$ characteristics of the ZnO/Si TFET acquired from various measurement conditions. Depicted in FIG. 77 are the results of measuring at various measurement speeds and $V_g$ voltage steps. Since no conspicuous difference is found in each condition, it can be found that the SS value is accurately evaluated. On the other hand, the SS value-$I_d$ characteristics greatly fluctuate, and the reason is estimated that since ZnO forms a polycrystal, the $E_{c\text{-}OS}$ position fluctuates in the plane. Thus, by improving crystallinity of the ZnO film, a further improvement of the SS value can be expected.

Figure 78:
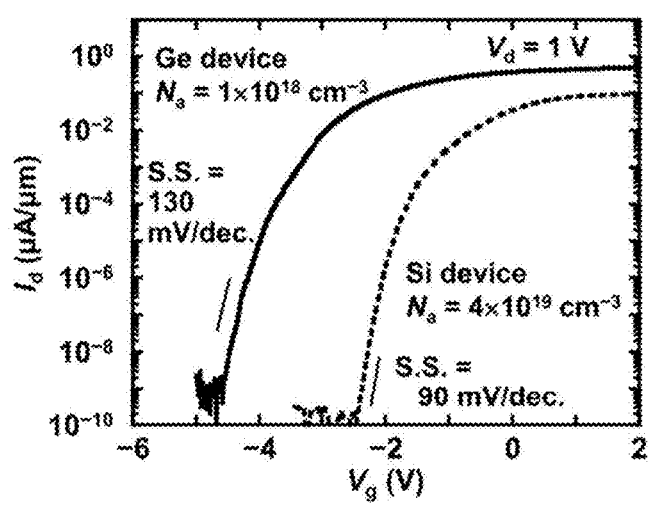
FIG. 78 depicts a comparison in $I_d$-$V_g$ characteristics between ZnO/Si and ZnO/Ge TFETs.

Furthermore, in this study, operation demonstration of a device using the Ge source has also succeeded (FIG. 78).

FIG. 78 depicts a comparison in $I_d$-$V_g$ characteristics between ZnO/Si and ZnO/Ge TFETs. When the ZnO/Ge TFET and the ZnO/Si TFET were compared, higher ON current was acquired in the ZnO/Ge TFET, although the Ge source has lower impurity concentration ($N_a$) compared with Si. This can be thought as an effect by a decrease in $E_{b\text{-}eff}$ and a decrease in tunnel effective mass due to the use of Ge.

In particular, a large ON/OFF current ratio has been measured also in the ZnO/Ge TFET, and a value exceeding the maximum value of $10^8$ among those reported so far has been realized. These results indicate how promising the proposed oxide semiconductor group IV semiconductor stacked TFET is.

Lastly, importance of $Al_2O_3$/ZnO gate stack engineering is discussed based on the characteristics of the ZnO thin-film transistor (TFT) and TFET.

Figures 79A, 79B, 79C, 79D:
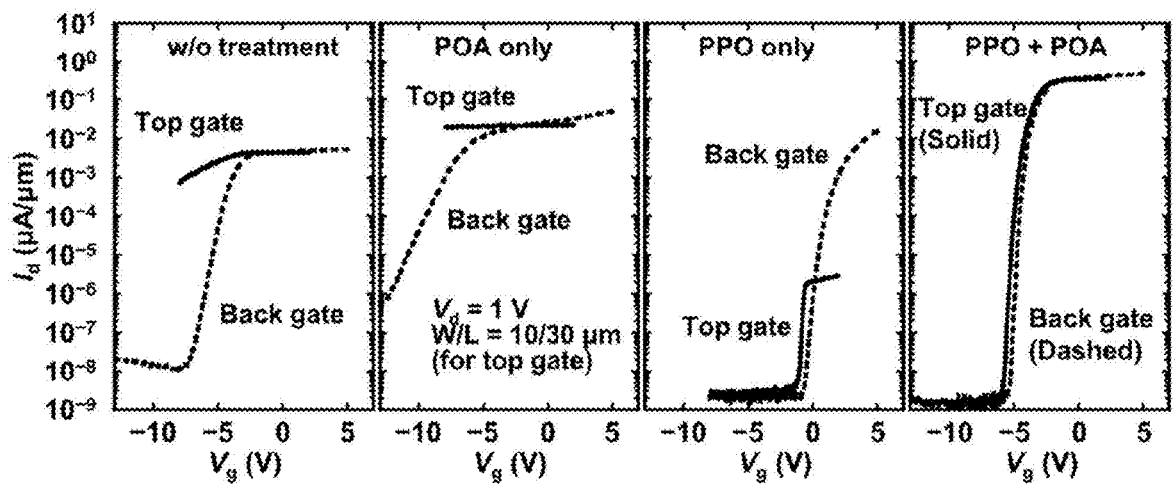
FIGS. 79A, 79B, 79C, and 79D depict $I_d$-$V_g$ characteristics of ZnO thin-film transistors (TFTs) fabricated by processing various postprocesses. Note that they are not TFETs.

FIGS. 79A, 79B, 79C, and 79D depict $I_d$-$V_g$ characteristics of ZnO thin-film transistors (TFTs) fabricated by processing various postprocesses. Note that they are not TFETs. FIG. 79A depicts a sample that has not processed any postprocess, FIG. 79B depicts a sample that has processed only post $O_2$ annealing (POA), FIG. 79C depicts a sample that has processed only post plasma oxidation (PPO), and FIG. 79D depicts a sample that has processed both PPO and POA. The $I_d$-$V_g$ characteristics in top-gate operation is poor, and importance of $Al_2O_3$/ZnO interface control is suggested.

As depicted in FIGS. 79A, 79B, 79C, and 79D, when the TFT is operated by back gate, ON/OFF switching can be made even when special process is not performed. However, in the case of top gate, ON/OFF switching cannot be made. From this, it can be suggested that $Al_2O_3$/ZnO interface characteristics are not favorable. In a TFT sample subjected to appropriate process, ON/OFF switching is realized even in top gate operation, and it is estimated that the SS value is up to 130 mV/dec. and the interface state density (Dit) is up to $1\times10^{13}$ cm$^{-2}$ eV$^{-1}$.

Next, the case of a TFET is discussed in detail.

Figure 80:
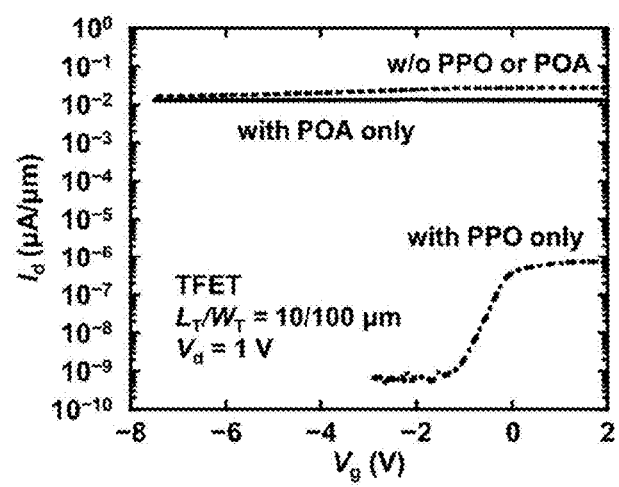
FIG. 80 depicts gate stack control (I): Influences of PPO on the $I_d$-$V_g$ characteristics of the TFET. PPO is processed when $Al_2O_3$ of 1 nm is deposited.
Figure 81:
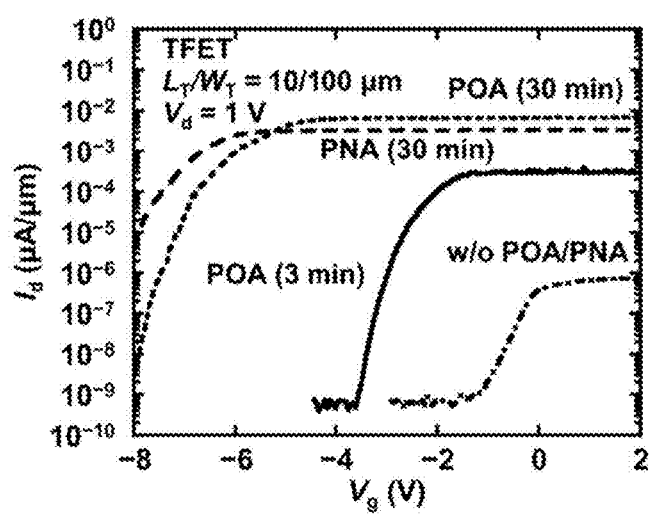
FIG. 81 depicts gate stack control (II): Influences of POA and PNA on the $I_d$-$V_g$ characteristics of the TFET at 350° C. The results of a sample that has also processed PPO in advance are depicted.

FIG. 80 depicts gate stack control (I): Influences of PPO on the $I_d$-$V_g$ characteristics of the TFET. FIG. 81 depicts gate stack control (II): Influences of POA and PNA on the $I_d$-$V_g$ characteristics of the TFET at 350° C. The results of a sample that has also processed PPO in advance are depicted.

PPO is processed when $Al_2O_3$ of 1 nm is deposited. Post plasma oxidation (PPO) is a process necessary for current cutoff, which can be thought to decrease the interface trap density (Dit) near $E_{c\text{-}OS}$ (FIG. 80). However, the value of the ON current is exceptionally low, and it can be thought that the Fermi level is subjected to pinning at a deep energy position away from the conduction band.

On the other hand, the ON current increases by post $O_2/N_2$ annealing (POA/PNA). Since there is no big difference between POA and PNA, by the effect of heat treatment in the process, a decrease in energy-deep interface trap density (Dit) and an increase in mobility due to an improvement in ZnO crystallinity are suggested (FIG. 81). And, by optimization of POA time, both of an effective increase in ON current and adjustment of the threshold ($V_{th}$) were achieved.

Based on the above-described results, by further establishment of gate stack technology, removal of the interface layer formed on the interface of the ZnO group IV semiconductor, and an improvement in uniformity of the ZnO film, a dramatic improvement in TFET performance as predicted by device simulations is expected.

[5. Conclusion]

As for the stacked TFET having the type-II energy band structure with the oxide semiconductor and the group IV semiconductor jointed together, a device structure based on a new concept has been proposed.

By the TCAD simulation, high potential of the proposed device has been indicated, such as high ON current (>70 μA/μm), the minimum SS value that is as close to zero as can be, the average SS value of up to 40 mV/dec. when 0.3 V operation is assumed. Also, this new proposal has been experimentally demonstrated also in the TFET fabricated by using an n-ZnO/p-(Si or Ge) tunnel junction.

In room-temperature operation, steep ON/OFF switching and exceptionally low OFF current have been realized, and the highest ON/OFF current ratio exceeding $10^8$ and the minimum SS value of 71 mV/dec. at any time in the past have been achieved.

Also, influences of source concentration, an increase in ON current by the ZnO/Ge tunnel junction, importance of gate stack structure control, and so forth have been experimentally indicated.

Comparison Between Nch-TFET and Pch-TFET

Next, the Nch TFET and the Pch TFET are compared for description.

Figure 82:
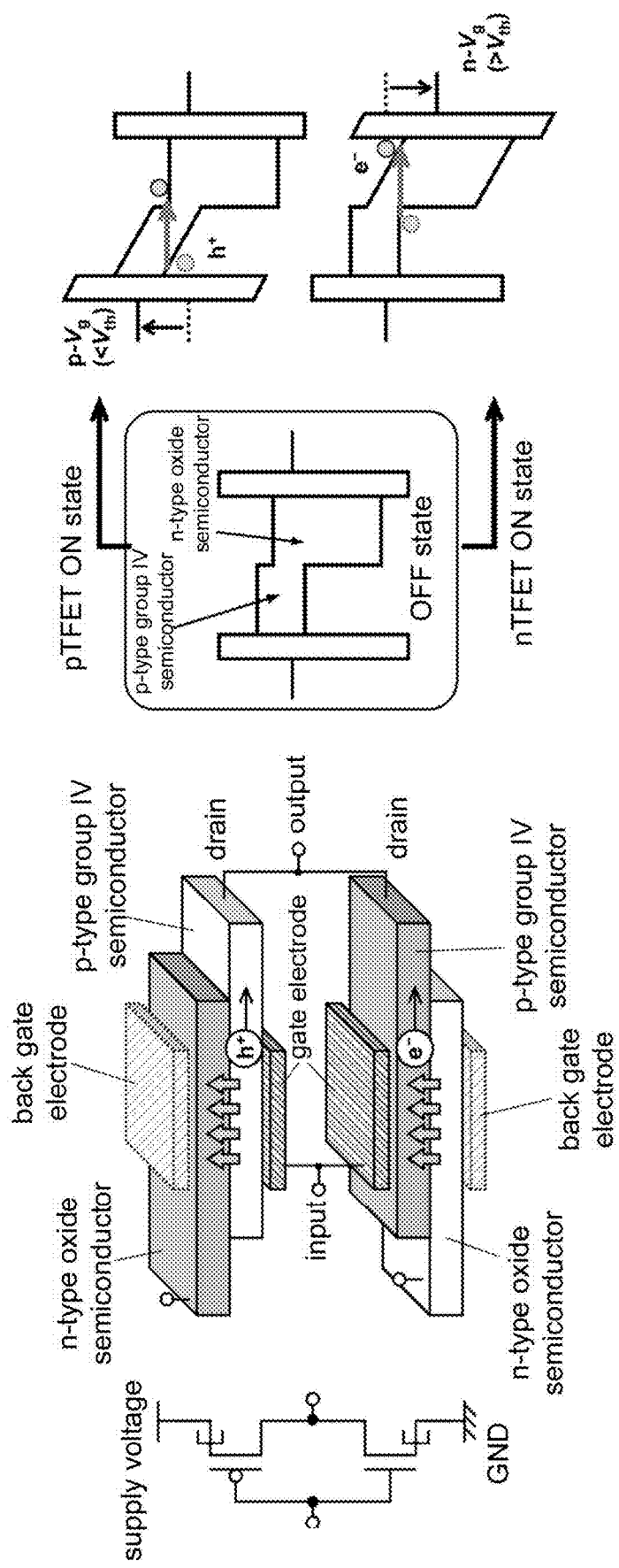
FIG. 82 is a schematic diagram of operation in unitary construction of Nch/Pch TFETs.

FIG. 82 is a schematic diagram of operation in unitary construction of Nch/Pch TFETs. Depicted in FIG. 82 is a schematic diagram of operation at each channel of a TFET operable as Nch and Pch, as the TFET 10D in the fifth embodiment depicted in FIG. 25. When an ON state is set to control the gate voltage, the band of the n-type oxide semiconductor layer is mainly bent at Nch. By contrast, at Pch, the band of the p-type group IV semiconductor layer is mainly bent.

FIG. 83 is a schematic diagram of operation in an Nch TFET and a Pch TFET. In FIG. 83, bending of the Nch TFET and the Pch TFET is depicted. Bending of the band at each channel is basically identical to that in the example depicted in FIG. 82.

Figure 85A:
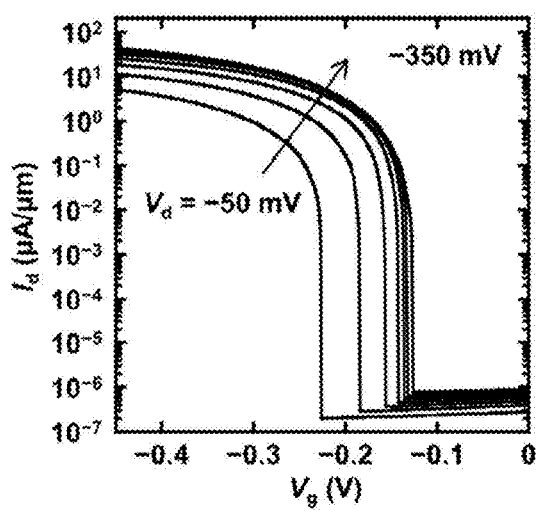
FIGS. 85A and 85B are diagrams depicting $I_d$-$V_g$ characteristics and $I_d$-$V_d$ characteristics of the Pch TFET.
Figure 85B:
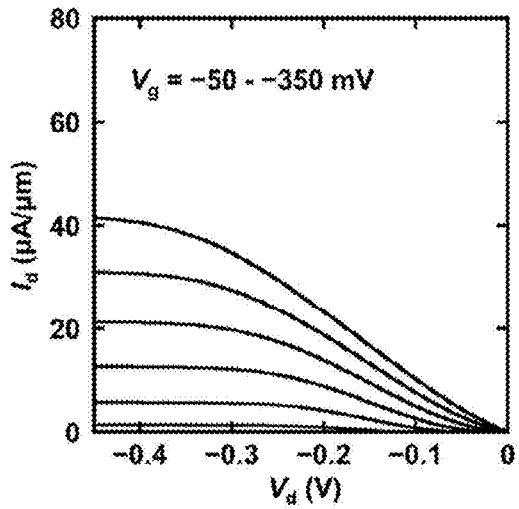

FIGS. 84A and 84B are diagrams depicting $I_d$-$V_g$ characteristics and $I_d$-$V_d$ characteristics of the Nch TFET. FIGS. 85A and 85B are diagrams depicting $I_d$-$V_g$ characteristics and $I_d$-$V_d$ characteristics of the Pch TFET. These characteristics are simulation results based on the following conditions. Ge was used as a p-type group IV semiconductor layer, and ZnO was used as an n-type oxide semiconductor layer (electron affinity is 4.2 eV). The impurity concentration in each layer was set at $3\times10^{18}$ cm$^{-3}$. EOT is set at 1 nm. The p-type group IV semiconductor layer was set at 10 nm for Nch and 5 nm for Pch, and the n-type oxide semiconductor layer was set at 5 nm for Nch and 10 nm for Pch. According to these results, both Nch and Pch TFETs can acquire characteristics withstanding practical use.

Temperature Dependency of Characteristics of Nch TFET

Next, described is temperature dependency of characteristics of the Nch TFET using Si as a p-type group IV semiconductor layer and using ZnO as an n-type oxide semiconductor layer.

Figure 86:
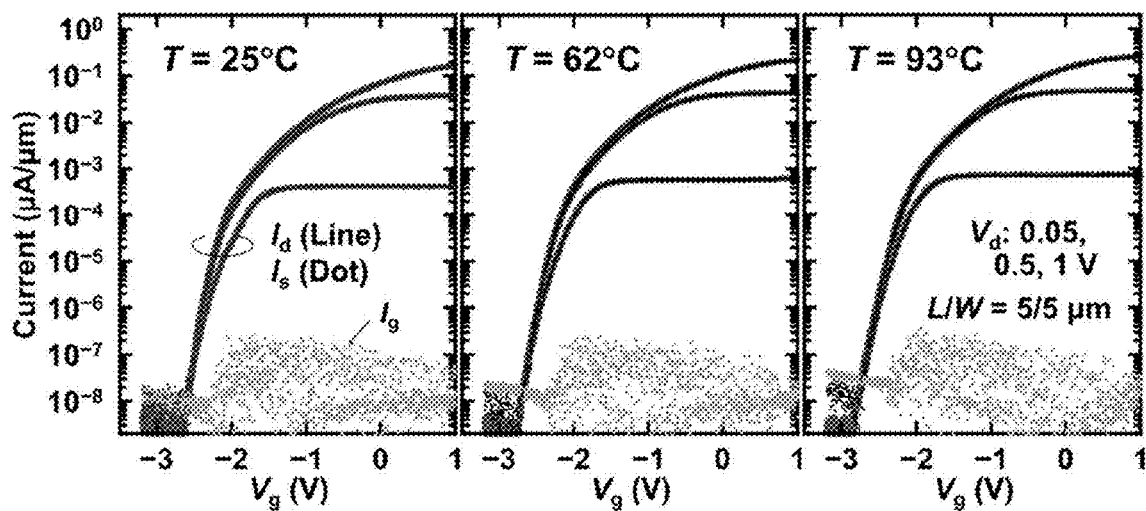
FIG. 86 is a diagram depicting temperature dependency of the $I_d$-$V_g$ characteristics of the Nch TFET.
Figure 87A:
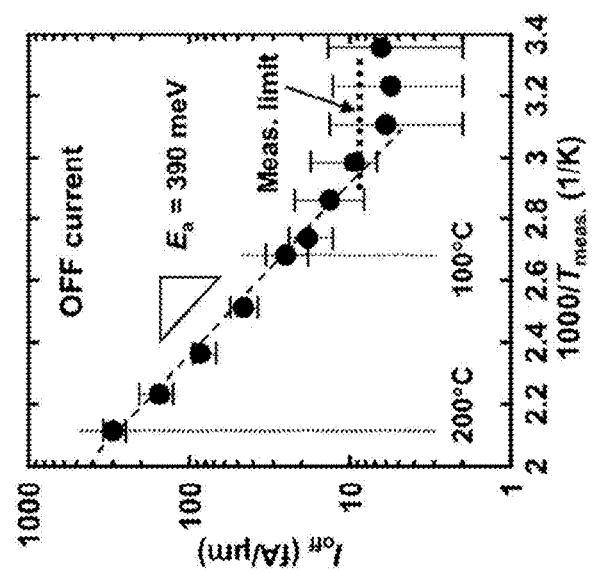
FIGS. 87A, 87B, and 87C are diagrams depicting temperature dependencies of various characteristic values of the Nch TFET.
Figure 87B:
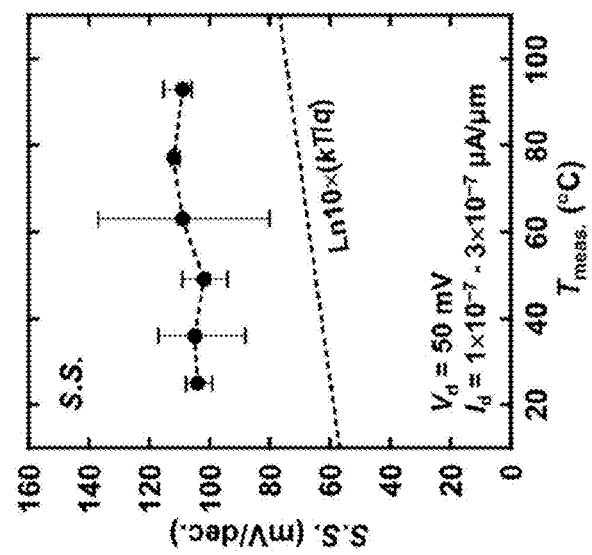
Figure 87C:
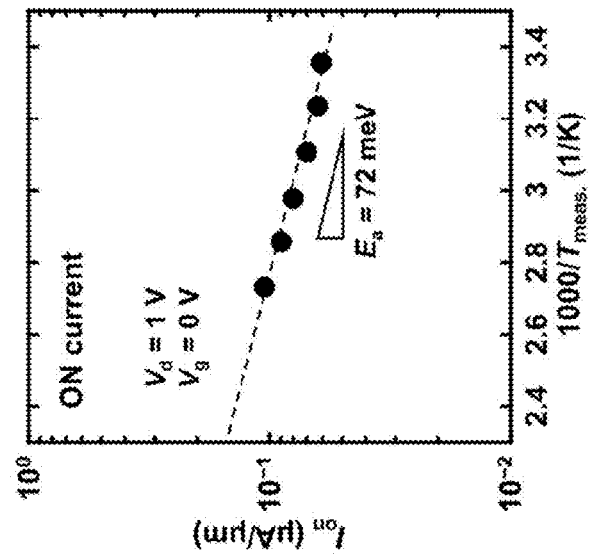

FIG. 86 is a diagram depicting temperature dependency of the $I_d$-$V_g$ characteristics of the Nch TFET. FIGS. 87A, 87B, and 87C are diagrams depicting temperature dependencies of various characteristic values of the Nch TFET. According to these characteristics, temperature dependency is exceptionally small. This is a performance unique to tunneling field effect transistors. Also, by the influences of a large energy gap in the n-type oxide semiconductor layer, an exceptionally small OFF current (<1 pA/μm) was acquired even at a high temperature such as 200° C.

Material Comparison (ZnO, ZnSnO) of n-Type Oxide Semiconductor Layer

In the Nch TFET, a comparison was made between the case when ZnO is used for the n-type oxide semiconductor layer and the case when ZnSnO (here, Zn/Sn=1.5) is used therefor. Note that the p-type group IV semiconductor layer is Si.

Figure 88:
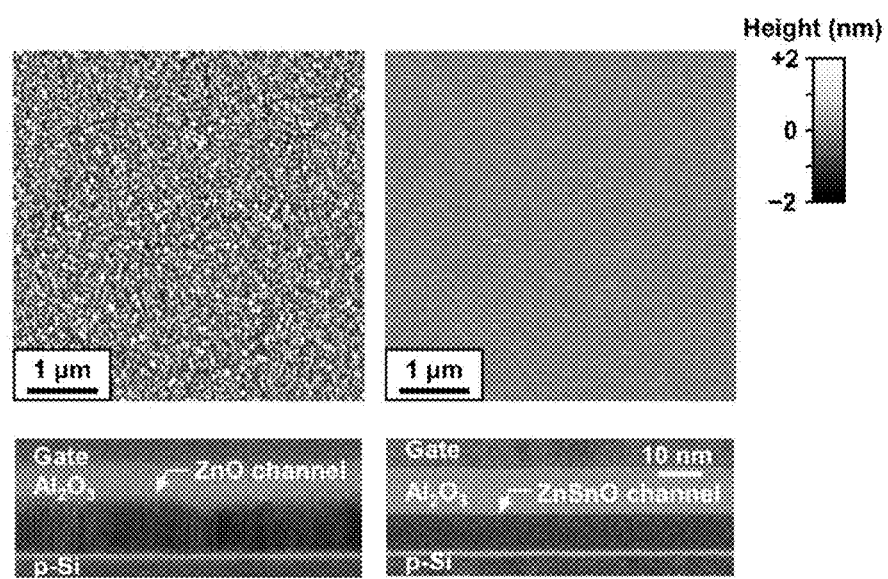
FIG. 88 depicts diagrams in which a surface state and a sectional state of ZnO and those of ZnSnO are compared.

FIG. 88 depicts diagrams in which a surface state and a sectional state of ZnO and those of ZnSnO are compared. Upper diagrams of FIG. 88 each depict an AFM image of the surface of each n-type oxide semiconductor layer, and lower diagrams each depict a sectional TEM image thereof. As depicted in FIG. 88, surface roughness is exceptionally small in the case of ZnSnO, compared with ZnO.

Figure 89A:
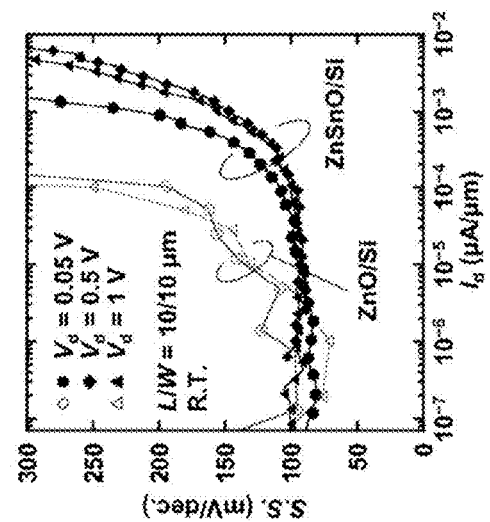
FIGS. 89A, 89B, and 89C depict diagrams in which various characteristics of ZnO and ZnSnO are compared.
Figure 89B:
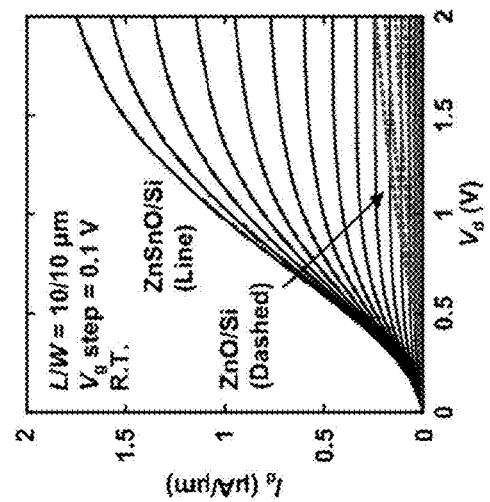
Figure 89C:
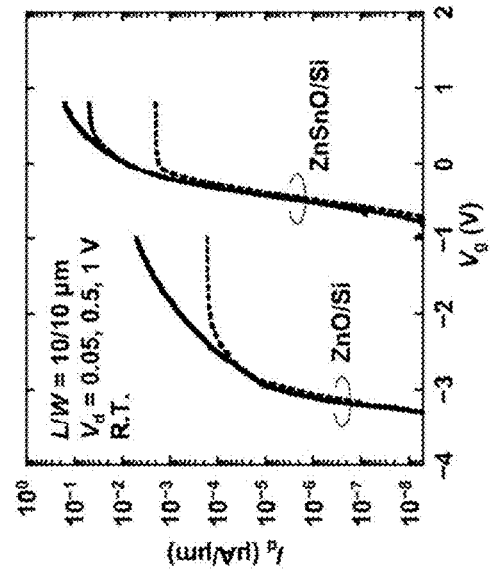

FIGS. 89A, 89B, and 89C depict diagrams in which various characteristics of ZnO and ZnSnO are compared. In the case of ZnSnO, high ON current was realized, compared with ZnO, and an improvement in average SS value was also observed. Also, it was found that, in the case of ZnSnO, the threshold moves to a value near 0 V, compared with ZnO, and characteristics effective for EOT scaling can be acquired.

Application Example of TFET

According to the above-described simulation results, they have performance comparable to the performance index prediction of low-power-consumption devices indicated by the International Technology Roadmap for Semiconductors (ITRS). While operation at approximately 0.7 V is assumed in the ITRS, the results of this time indicate a great improvement, and realization at low voltage is expected, compared with the existing quantum tunneling MOSFETs. From this, the present invention is thought to have an exceptionally high value of use directly linked to low-power-consumption semiconductor device industries. In addition, in spite of materials of various types, no high-temperature, high-cost process such as epitaxial growth has to be used. Thus, this can be directly linked to application and development to displays, flexible devices, wearable devices, and so forth rapidly developing in recent years.

As application examples, integration with energy harvesting, integration with battery-less mobile terminals and memory can be thought, for example.

In recent studies, terminals have been thought which use electric power generated by environment (light, heat (including human temperature)) as it is and do not require a battery. In particular, health-care and health monitors and so forth are required to be always operated, although the amount of information is not so large. Thus, the advantage of a device not using a battery is enormous. In most energy harvesting, it is difficult to ensure voltage, and many cells are connected in series to generate voltage required for operation of transistors and so forth. Since the general MOSFET operation voltage>0.7 V becomes operation voltage<0.3 V by this application, its advantage is enormous.

In a memory circuit, many devices for storing information (memory devices) and many switches (transistors) for circuit switching are both incorporated. Development of memory devices in recent years have also been remarkable, and many memory devices capable of writing and reading information at low voltage have been reported. For these, an example of driving at voltage on the order of 0.3 V has been reported recently. However, even when a single memory device can operate at 0.3 V, if a MOSFET incorporated in the circuit requires 0.7 V, the voltage for driving the entire circuit is equal to or larger than 0.7 V. By contrast, in the TFET here, operation at 0.3 V can be made. Thus, circuit designing by utilizing the advantage of the memory device can be conducted.

Modification Examples

While the embodiments of the present invention have been described, each of the embodiments described above can be applied as being mutually combined or replaced. Also, in each of the embodiments described above, modifications can be made as follows for implementation. In the following modification examples, examples applied to the first embodiment are described, but are applied to the other embodiments.

(1) The p-type group IV semiconductor layer 110 may not be a group IV semiconductor but may be a p-type semiconductor having an energy band structure capable of realizing the above-described tunnel junction.

(2) The n-type oxide semiconductor layer 200 may be an n-type semiconductor, other than an oxide semiconductor, having an energy band structure capable of realizing the above-described tunnel junction, and may be, for example, a group II-VI semiconductor in which the band gap tends to increase.

(3) The region A2 where the isolation insulating layer 500 is arranged is only required to be at least toward a drain electrode layer 720 with respect to the heterojunction part 900. For example, the isolation insulating layer 500 may not necessarily be arranged toward a source electrode layer 710 with respect to the heterojunction part 900.

(4) When the opening 370 is formed in the gate insulating layer 300, if etching selectivity is not ensured between the gate insulating layer 300 and the n-type oxide semiconductor layer 200, a metal may be buried in advance in a lower part of the n-type oxide semiconductor layer 200.

REFERENCE SIGNS LIST

10 . . . TFET, 100 . . . semiconductor substrate, 110 . . . p-type group IV semiconductor layer, 115 . . . junction insulating layer, 120 . . . n-type group IV semiconductor layer, 200 . . . n-type oxide semiconductor layer, 300 . . . gate insulating layer, 370 . . . opening, 400 . . . gate electrode layer, 500 . . . isolation insulating layer, 550 . . . junction opening, 570 . . . opening, 600 . . . planarization insulating layer, 610 . . . lower interlayer insulating layer, 620 . . . upper interlayer insulating layer, 630 . . . interlayer insulating layer, 710 . . . source electrode layer, 712 . . . p-side electrode layer, 720 . . . drain electrode layer, 721 . . . n-side electrode layer, 740 . . . gate extraction electrode layer, 810 . . . gate input wire, 830 . . . drain output wire, 860 . . . low power supply line, 880 . . . high power supply line, 900 . . . heterojunction part

The invention claimed is:

1. A tunneling field effect transistor comprising:
a first semiconductor layer having a first conductive type;

a second semiconductor layer having a second conductive type and realizing a heterojunction with respect to the first semiconductor layer in a first region;
a gate insulating layer over the second semiconductor layer in the first region;
a gate electrode layer over the gate insulating layer;
a first electrode layer electrically connected to the first semiconductor layer;
a second electrode layer electrically connected to the second semiconductor layer; and
a first insulating layer interposed between the first semiconductor layer and the second semiconductor layer in a second region adjacent to the first region toward the second electrode layer.

2. The tunneling field effect transistor according to claim 1, wherein the first semiconductor layer and the second semiconductor layer are each a material having an energy band structure forming a type-II band structure by the heterojunction.

3. The tunneling field effect transistor according to claim 2, wherein the second semiconductor layer is a material in which an energy of Conduction Band Minimum is present in a band gap of the first semiconductor layer.

4. The tunneling field effect transistor according to claim 3, wherein a band gap of the second semiconductor layer is larger than that of the first semiconductor layer.

5. The tunneling field effect transistor according to claim 1, wherein
the first semiconductor layer is a p-type semiconductor, and
the second semiconductor layer is an n-type semiconductor.

6. The tunneling field effect transistor according to claim 5, wherein
the first semiconductor layer is a group IV semiconductor, and
the second semiconductor layer is a group II-VI semiconductor.

7. The tunneling field effect transistor according to claim 5,
wherein the first semiconductor layer is a group IV semiconductor, and
the second semiconductor layer includes a metal oxide.

8. The tunneling field effect transistor according to claim 7,
wherein the first semiconductor layer includes Si.

9. The tunneling field effect transistor according to claim 7, wherein
the first semiconductor layer includes Si and Ge.

10. The tunneling field effect transistor according to claim 1,
wherein the first semiconductor layer is an n-type semiconductor, and
the second semiconductor layer is a p-type semiconductor.

11. The tunneling field effect transistor according to claim 1,
wherein the second semiconductor layer has permittivity smaller than permittivity of the first semiconductor layer.

12. The tunneling field effect transistor according to claim 1, wherein
the gate insulating layer and the gate electrode layer are arranged so as to be expanded from the first region to the second region.

13. The tunneling field effect transistor according to claim 1, wherein
the second region is adjacent to the first region also toward the first electrode layer.

14. The tunneling field effect transistor according to claim 1, wherein
the second region surrounds the first region.

15. The tunneling field effect transistor according to claim 1, wherein
a junction insulating layer including the first semiconductor layer as a component is arranged between the first semiconductor layer and the second semiconductor layer in a portion where the heterojunction is realized.

16. The tunneling field effect transistor according to claim 15, wherein
the first semiconductor layer is a p-type semiconductor,
the second semiconductor layer is an n-type semiconductor, and
the junction insulating layer includes an oxide of the first semiconductor layer.

17. The tunneling field effect transistor according to claim 15, wherein
the first semiconductor layer is an n-type semiconductor,
the second semiconductor layer is a p-type semiconductor, and
the junction insulating layer includes an oxide of the second semiconductor layer.

18. An electronic device comprising:
a plurality of the tunneling field effect transistors according to claim 1, and
a conductor for supplying a signal to the tunneling field effect transistors.

19. The electronic device according to claim 18, wherein
the plurality of the tunneling field effect transistors include at least an N-channel tunneling field effect transistor and a P-channel tunneling field effect transistor, and
the electronic device further includes a conductor which connects the N-channel tunneling field effect transistor and the P-channel tunneling field effect transistor.

20. A tunneling field effect transistor comprising:
a first semiconductor layer having a first conductive type;
a second semiconductor layer having a second conductive type and realizing a heterojunction with respect to the first semiconductor layer in a first region;
a gate insulating layer over the second semiconductor layer in the first region;
a gate electrode layer over the gate insulating layer;
a first electrode layer electrically connected to the first semiconductor layer; and
a second electrode layer electrically connected to the second semiconductor layer, wherein
the first region is a region where the first semiconductor layer and the second semiconductor layer form the heterojunction and
when viewed perpendicularly to a plane of the heterojunction, a second region where the first semiconductor layer and the second semiconductor layer overlap is wider than the first region.

* * * * *